United States Patent
Van De Ven et al.

(10) Patent No.: US 9,441,793 B2
(45) Date of Patent: *Sep. 13, 2016

(54) HIGH EFFICIENCY LIGHTING DEVICE INCLUDING ONE OR MORE SOLID STATE LIGHT EMITTERS, AND METHOD OF LIGHTING

(75) Inventors: Antony Paul Van De Ven, Hong Kong (CN); Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 283 days.

This patent is subject to a terminal disclaimer.

(21) Appl. No.: 12/475,850

(22) Filed: Jun. 1, 2009

(65) Prior Publication Data

US 2009/0296384 A1 Dec. 3, 2009

Related U.S. Application Data

(63) Continuation-in-part of application No. PCT/US2007/086027, filed on Nov. 30, 2007, and a continuation-in-part of application No. 11/948,021, filed on Nov. 30, 2007, now Pat. No. 9,084,328.

(60) Provisional application No. 60/868,134, filed on Dec. 1, 2006.

(51) Int. Cl.
*F21K 99/00* (2016.01)
*H05B 33/08* (2006.01)
*F21Y 101/02* (2006.01)

(52) U.S. Cl.
CPC ........... *F21K 9/135* (2013.01); *H05B 33/0803* (2013.01); *H05B 33/0815* (2013.01);

(Continued)

(58) Field of Classification Search
CPC .............. F21K 9/135; F21Y 2101/02; H05B 33/0803; H05B 33/0815; H05B 33/0869; H01L 2224/48091; H01L 2224/48247; H01L 2224/45147
USPC .................................................. 362/231, 84
See application file for complete search history.

(56) References Cited

U.S. PATENT DOCUMENTS

| 3,805,937 A | 4/1974 | Hatanaka et al. |
| 3,875,456 A | 4/1975 | Kano et al. |

(Continued)

FOREIGN PATENT DOCUMENTS

| DE | 3 916 875 | 12/1990 |
| DE | 3916875 | 12/1990 |

(Continued)

OTHER PUBLICATIONS

U.S. Appl. No. 61/075,513, filed Jun. 25, 2008, Roberts.

(Continued)

*Primary Examiner* — Sharon Payne
(74) *Attorney, Agent, or Firm* — Burr & Brown, PLLC

(57) ABSTRACT

There is provided a lighting device that comprises at least one 600-630 nm solid state light emitter and at least one light source emitting light within an area on a 1931 CIE Chromaticity Diagram defined by a first set of points having x, y coordinates of (0.32, 0.40), (0.36, 0.48), (0.43, 0.45), (0.42, 0.42), (0.36, 0.38), or a second set of points having x, y coordinates of (0.29, 0.36), (0.32, 0.35), (0.41, 0.43), (0.44, 0.49), (0.38, 0.53). Some embodiments further comprise at least a first power line. Also provided are methods that comprise illuminating at least one light source to emit light within one of the areas defined above, and illuminating at least one 600-630 nm emitter.

52 Claims, 12 Drawing Sheets

(52) U.S. Cl.
CPC ....... *H05B33/0869* (2013.01); *F21Y 2101/02* (2013.01); *H01L 2224/45147* (2013.01); *H01L 2224/48091* (2013.01); *H01L 2224/48247* (2013.01); *H01L 2924/181* (2013.01)

(56) References Cited

U.S. PATENT DOCUMENTS

| | | | |
|---|---|---|---|
| 3,927,290 A | 12/1975 | Denley | |
| 4,120,026 A | 10/1978 | Tsuchihashi et al. | |
| 4,325,146 A | 4/1982 | Lennington | |
| 4,408,157 A | 10/1983 | Beaubien | |
| 4,420,398 A | 12/1983 | Castino | |
| 4,710,699 A | 12/1987 | Miyamoto | |
| 4,772,885 A | 9/1988 | Uehara et al. | |
| 5,087,883 A | 2/1992 | Hoffman | |
| 5,166,815 A | 11/1992 | Elderfield | |
| 5,264,997 A | 11/1993 | Hutchisson et al. | |
| 5,384,519 A | 1/1995 | Gotoh | |
| 5,407,799 A | 4/1995 | Studier | |
| 5,410,519 A | 4/1995 | Hall et al. | |
| 5,477,436 A | 12/1995 | Bertling et al. | |
| 5,563,849 A | 10/1996 | Hall et al. | |
| 5,803,579 A | 9/1998 | Turnbull et al. | |
| 5,851,063 A | 12/1998 | Doughty et al. | |
| 5,959,316 A | 9/1999 | Lowery | |
| 6,066,861 A | 5/2000 | Hohn et al. | |
| 6,076,936 A | 6/2000 | George | |
| 6,084,250 A | 7/2000 | Justel et al. | |
| 6,095,666 A | 8/2000 | Salam | |
| 6,132,072 A | 10/2000 | Turnbull et al. | |
| 6,153,971 A | 11/2000 | Shimizu et al. | |
| 6,212,213 B1 | 4/2001 | Weber et al. | |
| 6,234,648 B1 | 5/2001 | Börner et al. | |
| 6,252,254 B1 | 6/2001 | Soules et al. | |
| 6,255,670 B1 | 7/2001 | Srivastava et al. | |
| 6,278,135 B1 | 8/2001 | Srivastava et al. | |
| 6,283,612 B1 | 9/2001 | Hunter | |
| 6,292,901 B1 | 9/2001 | Lys et al. | |
| 6,294,800 B1 | 9/2001 | Duggal et al. | |
| 6,319,425 B1 | 11/2001 | Tasaki et al. | |
| 6,335,538 B1 | 1/2002 | Prutchi et al. | |
| 6,337,536 B1 | 1/2002 | Matsubara et al. | |
| 6,348,766 B1 | 2/2002 | Ohishi et al. | |
| 6,350,041 B1 | 2/2002 | Tarsa et al. | |
| 6,357,889 B1 | 3/2002 | Duggal et al. | |
| 6,394,621 B1 | 5/2002 | Hanewinkel | |
| 6,429,583 B1 | 8/2002 | Levinson et al. | |
| 6,441,558 B1 | 8/2002 | Muthu et al. | |
| 6,441,582 B1 | 8/2002 | Powers | |
| 6,480,299 B1 | 11/2002 | Drakopoulos et al. | |
| 6,501,091 B1 | 12/2002 | Bawendi et al. | |
| 6,501,100 B1 | 12/2002 | Srivastava et al. | |
| 6,504,179 B1 | 1/2003 | Ellens et al. | |
| 6,513,949 B1 | 2/2003 | Marshall et al. | |
| 6,522,065 B1 | 2/2003 | Srivastava et al. | |
| 6,538,371 B1 | 3/2003 | Duggal et al. | |
| 6,550,949 B1 | 4/2003 | Bauer et al. | |
| 6,552,495 B1 | 4/2003 | Chang | |
| 6,577,073 B2 | 6/2003 | Shimizu et al. | |
| 6,578,986 B2 | 6/2003 | Swaris et al. | |
| 6,592,810 B2 | 7/2003 | Nishida et al. | |
| 6,600,175 B1 | 7/2003 | Baretz et al. | |
| 6,600,324 B2 | 7/2003 | St-Germain | |
| 6,603,258 B1 | 8/2003 | Mueller-Mach et al. | |
| 6,608,485 B2 | 8/2003 | St-Germain | |
| 6,616,862 B2 | 9/2003 | Srivastava et al. | |
| 6,624,350 B2 | 9/2003 | Nixon et al. | |
| 6,636,003 B2 | 10/2003 | Rahm et al. | |
| 6,642,666 B1 | 11/2003 | St-Germain | |
| 6,685,852 B2 | 2/2004 | Setlur et al. | |
| 6,686,691 B1 | 2/2004 | Mueller et al. | |
| 6,692,136 B2 | 2/2004 | Marshall et al. | |
| 6,703,173 B2 | 3/2004 | Lu et al. | |
| 6,712,486 B1 | 3/2004 | Popovich et al. | |
| 6,734,465 B1 * | 5/2004 | Taskar et al. | ............. 257/80 |
| 6,737,801 B2 | 5/2004 | Ragle | |
| 6,744,194 B2 | 6/2004 | Fukasawa et al. | |
| 6,762,562 B2 * | 7/2004 | Leong | ............. 315/51 |
| 6,762,563 B2 | 7/2004 | St-Germain | |
| 6,784,463 B2 | 8/2004 | Camras et al. | |
| 6,791,257 B1 | 9/2004 | Sato et al. | |
| 6,803,719 B1 | 10/2004 | Miller et al. | |
| 6,817,735 B2 | 11/2004 | Shimizu et al. | |
| 6,841,804 B1 | 1/2005 | Chen et al. | |
| 6,851,834 B2 | 2/2005 | Leysath | |
| 6,880,954 B2 | 4/2005 | Ollett et al. | |
| 6,882,101 B2 | 4/2005 | Ragle | |
| 6,890,777 B2 | 5/2005 | Bawendi et al. | |
| 6,914,265 B2 | 7/2005 | Bawendi et al. | |
| 6,914,267 B2 | 7/2005 | Fukasawa et al. | |
| 6,936,857 B2 | 8/2005 | Doxsee et al. | |
| 6,967,116 B2 | 11/2005 | Negley | |
| 6,980,176 B2 | 12/2005 | Matsumoto et al. | |
| 7,005,679 B2 | 2/2006 | Tarsa et al. | |
| 7,008,078 B2 | 3/2006 | Shimizu et al. | |
| 7,009,343 B2 | 3/2006 | Lim et al. | |
| 7,014,336 B1 | 3/2006 | Ducharme et al. | |
| 7,023,019 B2 | 4/2006 | Maeda et al. | |
| 7,061,454 B2 | 6/2006 | Sasuga et al. | |
| 7,066,623 B2 | 6/2006 | Lee et al. | |
| 7,083,302 B2 | 8/2006 | Chen et al. | |
| 7,093,958 B2 | 8/2006 | Coushaine | |
| 7,095,056 B2 | 8/2006 | Vitta | |
| 7,102,172 B2 | 9/2006 | Lynch et al. | |
| 7,116,308 B1 | 10/2006 | Heeks et al. | |
| 7,118,262 B2 | 10/2006 | Negley et al. | |
| 7,125,143 B2 | 10/2006 | Hacker | |
| 7,135,664 B2 | 11/2006 | Vornsand et al. | |
| 7,144,121 B2 | 12/2006 | Minano et al. | |
| 7,164,231 B2 | 1/2007 | Choi et al. | |
| 7,207,691 B2 | 4/2007 | Lee et al. | |
| 7,213,940 B1 * | 5/2007 | Van De Ven et al. | .... F21K 9/00 257/89 |
| 7,215,074 B2 | 5/2007 | Shimizu et al. | |
| 7,232,212 B2 | 6/2007 | Iwase | |
| 7,239,085 B2 | 7/2007 | Kawamura | |
| 7,250,715 B2 | 7/2007 | Mueller et al. | |
| 7,255,457 B2 | 8/2007 | Ducharme et al. | |
| 7,256,557 B2 | 8/2007 | Lim | |
| 7,264,527 B2 | 9/2007 | Bawendi et al. | |
| 7,322,732 B2 | 1/2008 | Negley et al. | |
| 7,329,024 B2 | 2/2008 | Lynch et al. | |
| 7,354,172 B2 * | 4/2008 | Chemel et al. | ............. 362/231 |
| 7,358,954 B2 | 4/2008 | Negley et al. | |
| 7,365,485 B2 | 4/2008 | Fukasawa et al. | |
| 7,387,405 B2 | 6/2008 | Ducharme et al. | |
| 7,422,504 B2 | 9/2008 | Maeda et al. | |
| 7,453,195 B2 | 11/2008 | Radkov | |
| 7,474,044 B2 | 1/2009 | Ge | |
| 7,614,759 B2 | 11/2009 | Negley | |
| 7,642,708 B2 * | 1/2010 | Juestel et al. | ............. 313/503 |
| 7,692,373 B2 | 4/2010 | Bawendi et al. | |
| 7,718,991 B2 | 5/2010 | Negley | |
| 7,722,220 B2 | 5/2010 | Van de Ven | |
| 7,744,243 B2 | 6/2010 | Van de Ven | |
| 7,768,192 B2 | 8/2010 | Van De Ven et al. | |
| 7,828,460 B2 * | 11/2010 | Van De Ven et al. | .... F21K 9/00 257/89 |
| 8,029,155 B2 | 10/2011 | Van De Ven et al. | |
| 8,053,972 B2 | 11/2011 | Bawendi et al. | |
| 8,148,897 B2 | 4/2012 | Cho et al. | |
| 8,174,181 B2 | 5/2012 | Bawendi et al. | |
| 8,247,263 B2 | 8/2012 | Braune et al. | |
| 8,362,684 B2 | 1/2013 | Bawendi et al. | |
| 8,513,875 B2 * | 8/2013 | Van De Ven et al. | .... F21K 9/00 313/502 |
| 2001/0002049 A1 | 5/2001 | Reeh et al. | |
| 2002/0006044 A1 | 1/2002 | Harbers et al. | |
| 2002/0070681 A1 | 6/2002 | Shimizu et al. | |
| 2002/0087532 A1 | 7/2002 | Barritz et al. | |
| 2002/0140880 A1 | 10/2002 | Weindorf et al. | |
| 2002/0149576 A1 | 10/2002 | Tanaka et al. | |
| 2003/0026096 A1 | 2/2003 | Ellens et al. | |
| 2003/0030063 A1 | 2/2003 | Sosniak et al. | |

(56) References Cited

U.S. PATENT DOCUMENTS

| | | |
|---|---|---|
| 2003/0067773 A1 | 4/2003 | Marshall et al. |
| 2003/0127659 A1 | 7/2003 | Bawendi et al. |
| 2003/0127660 A1 | 7/2003 | Bawendi et al. |
| 2003/0146411 A1 | 8/2003 | Srivastava et al. |
| 2003/0218180 A1 | 11/2003 | Fujiwara |
| 2003/0222268 A1 | 12/2003 | Yocom et al. |
| 2004/0021299 A1 | 2/2004 | Tsai |
| 2004/0046178 A1 | 3/2004 | Sano |
| 2004/0104391 A1 | 6/2004 | Maeda et al. |
| 2004/0105261 A1 | 6/2004 | Ducharme et al. |
| 2004/0105264 A1 | 6/2004 | Spero |
| 2004/0113875 A1 | 6/2004 | Miller et al. |
| 2004/0179366 A1 | 9/2004 | Takeda et al. |
| 2004/0212998 A1 | 10/2004 | Mohacsi |
| 2004/0217364 A1 | 11/2004 | Tarsa et al. |
| 2004/0218387 A1 | 11/2004 | Gerlach |
| 2004/0218388 A1 | 11/2004 | Suzuki |
| 2004/0239839 A1 | 12/2004 | Hong |
| 2004/0259363 A1 | 12/2004 | Bawendi et al. |
| 2004/0264193 A1 | 12/2004 | Okumura |
| 2004/0264212 A1 | 12/2004 | Chung et al. |
| 2005/0007306 A1 | 1/2005 | Iisaka et al. |
| 2005/0030744 A1 | 2/2005 | Ducharme et al. |
| 2005/0052378 A1 | 3/2005 | Hacker |
| 2005/0082974 A1 | 4/2005 | Fukasawa et al. |
| 2005/0093442 A1 | 5/2005 | Setlur et al. |
| 2005/0110034 A1 | 5/2005 | Fujiwara |
| 2005/0117334 A1 | 6/2005 | Lee et al. |
| 2005/0127381 A1 | 6/2005 | Vitta et al. |
| 2005/0190141 A1 | 9/2005 | Roth et al. |
| 2005/0231976 A1 | 10/2005 | Keuper et al. |
| 2005/0243556 A1 | 11/2005 | Lynch |
| 2005/0251698 A1 | 11/2005 | Lynch et al. |
| 2005/0259423 A1 | 11/2005 | Heuser et al. |
| 2005/0274972 A1 | 12/2005 | Roth et al. |
| 2006/0012989 A1 | 1/2006 | Lee |
| 2006/0022582 A1 | 2/2006 | Radkov |
| 2006/0060872 A1 | 3/2006 | Edmond et al. |
| 2006/0067073 A1 | 3/2006 | Ting |
| 2006/0091778 A1 | 5/2006 | Setlur et al. |
| 2006/0105482 A1 | 5/2006 | Alferink et al. |
| 2006/0113548 A1 | 6/2006 | Chen et al. |
| 2006/0138435 A1 | 6/2006 | Tarsa et al. |
| 2006/0138937 A1 | 6/2006 | Ibbetson |
| 2006/0152140 A1 | 7/2006 | Brandes |
| 2006/0152172 A9 | 7/2006 | Mueller et al. |
| 2006/0180818 A1 | 8/2006 | Nagai et al. |
| 2006/0181192 A1 | 8/2006 | Radkov |
| 2006/0221635 A1 | 10/2006 | Sohn et al. |
| 2006/0245184 A1 | 11/2006 | Galli |
| 2007/0001188 A1 | 1/2007 | Lee |
| 2007/0001994 A1 | 1/2007 | Roth |
| 2007/0041220 A1 | 2/2007 | Lynch |
| 2007/0051966 A1 | 3/2007 | Higashi et al. |
| 2007/0090381 A1 | 4/2007 | Otsuka et al. |
| 2007/0137074 A1 | 6/2007 | Van De Ven et al. |
| 2007/0139920 A1 | 6/2007 | Van De Ven et al. |
| 2007/0139923 A1 | 6/2007 | Negley |
| 2007/0159091 A1 | 7/2007 | Hirosaki et al. |
| 2007/0170447 A1 | 7/2007 | Negley |
| 2007/0171145 A1 | 7/2007 | Coleman |
| 2007/0202623 A1 | 8/2007 | Gao |
| 2007/0223219 A1 | 9/2007 | Medendorp, Jr. |
| 2007/0236911 A1 | 10/2007 | Negley |
| 2007/0247414 A1 | 10/2007 | Roberts |
| 2007/0247847 A1 | 10/2007 | Villard |
| 2007/0262337 A1 | 11/2007 | Villard |
| 2007/0263393 A1 | 11/2007 | Van De Ven et al. |
| 2007/0267983 A1 | 11/2007 | Van de Ven |
| 2007/0274063 A1 | 11/2007 | Negley |
| 2007/0274080 A1 | 11/2007 | Negley |
| 2007/0276606 A1 | 11/2007 | Radkov |
| 2007/0278503 A1 | 12/2007 | Van De Ven et al. |
| 2007/0278934 A1 | 12/2007 | Van de Ven |
| 2007/0278974 A1 | 12/2007 | Van De Ven |
| 2007/0279440 A1 | 12/2007 | Negley |
| 2007/0279903 A1 | 12/2007 | Negley |
| 2007/0280624 A1 | 12/2007 | Negley |
| 2008/0084685 A1 | 4/2008 | Van de Ven et al. |
| 2008/0084700 A1 | 4/2008 | Van de Ven |
| 2008/0084701 A1 | 4/2008 | Van de Ven |
| 2008/0088248 A1 | 4/2008 | Myers |
| 2008/0089053 A1 | 4/2008 | Negley |
| 2008/0106895 A1 | 5/2008 | Van de Ven et al. |
| 2008/0106907 A1 | 5/2008 | Trott |
| 2008/0112168 A1 | 5/2008 | Pickard |
| 2008/0112170 A1 | 5/2008 | Trott |
| 2008/0112183 A1 | 5/2008 | Negley |
| 2008/0130265 A1 | 6/2008 | Negley |
| 2008/0130285 A1 | 6/2008 | Negley et al. |
| 2008/0136313 A1 | 6/2008 | Van de Ven et al. |
| 2008/0137347 A1 | 6/2008 | Trott |
| 2008/0149957 A1 | 6/2008 | Kameshima et al. |
| 2008/0170396 A1 | 7/2008 | Yuan et al. |
| 2008/0174233 A1 | 7/2008 | Bawendi et al. |
| 2008/0179602 A1 | 7/2008 | Negley |
| 2008/0192462 A1 | 8/2008 | Steedly et al. |
| 2008/0192493 A1 | 8/2008 | Villard |
| 2008/0197376 A1 | 8/2008 | Bert et al. |
| 2008/0211416 A1 | 9/2008 | Negley et al. |
| 2008/0231201 A1 | 9/2008 | Higley et al. |
| 2008/0259589 A1 | 10/2008 | Van de Ven |
| 2008/0278928 A1 | 11/2008 | Van de Ven et al. |
| 2008/0278940 A1 | 11/2008 | Van de Ven et al. |
| 2008/0278950 A1 | 11/2008 | Pickard et al. |
| 2008/0278952 A1 | 11/2008 | Trott et al. |
| 2008/0304260 A1 | 12/2008 | Van de Ven |
| 2008/0304261 A1 | 12/2008 | Van de Ven |
| 2008/0304269 A1 | 12/2008 | Pickard et al. |
| 2008/0309255 A1 | 12/2008 | Myers |
| 2008/0310154 A1 | 12/2008 | Van De Ven et al. |
| 2009/0002986 A1 | 1/2009 | Medendorp et al. |
| 2009/0161356 A1 | 6/2009 | Negley |
| 2009/0184616 A1 | 7/2009 | Van de Ven |
| 2009/0246895 A1 | 10/2009 | You |
| 2010/0140585 A1 | 6/2010 | Bawendi et al. |
| 2010/0141118 A1 | 6/2010 | Bawendi et al. |
| 2010/0176715 A1 | 7/2010 | Bawendi et al. |
| 2011/0242453 A1 | 10/2011 | Van De Ven |
| 2011/0279015 A1 | 11/2011 | Negley et al. |
| 2012/0012877 A1 | 1/2012 | Bawendi et al. |
| 2012/0280611 A1 | 11/2012 | Bawendi et al. |
| 2013/0207073 A1 | 8/2013 | Bawendi et al. |
| 2013/0235303 A1 | 9/2013 | Van De Ven |
| 2014/0084323 A1 | 3/2014 | Shimizu et al. |

FOREIGN PATENT DOCUMENTS

| | | |
|---|---|---|
| DE | 10-335077 | 3/2005 |
| EP | 0 838 866 | 4/1998 |
| EP | 936 682 | 8/1999 |
| EP | 0 971 421 | 1/2000 |
| EP | 1 024 399 | 8/2000 |
| EP | 1 081 771 | 3/2001 |
| EP | 1 160 883 | 12/2001 |
| EP | 1 193 772 | 4/2002 |
| EP | 1 016 062 | 8/2002 |
| EP | 1 367 655 | 12/2003 |
| EP | 1 380 876 | 1/2004 |
| EP | 1 416 219 | 5/2004 |
| EP | 1 462 711 | 12/2004 |
| EP | 1 557 604 | 7/2005 |
| EP | 1 566 848 | 8/2005 |
| EP | 1 571 715 | 9/2005 |
| EP | 1 760 795 | 1/2006 |
| EP | 1 662 583 | 5/2006 |
| EP | 1 837 386 | 9/2007 |
| EP | 2 325 897 | 5/2011 |
| JP | 04-159519 | 6/1992 |
| JP | 09-146089 | 6/1997 |
| JP | 10-163531 | 6/1998 |
| JP | 10-163535 | 6/1998 |
| JP | 10-242513 | 9/1998 |
| JP | 11-199781 | 7/1999 |

(56) References Cited

FOREIGN PATENT DOCUMENTS

| | | |
|---|---|---|
| JP | 2000-022222 | 1/2000 |
| JP | 2000-183408 | 6/2000 |
| JP | 2000-261039 | 9/2000 |
| JP | 2001-111114 | 4/2001 |
| JP | 2001-156331 | 6/2001 |
| JP | 2001-307506 | 11/2001 |
| JP | 2002-057376 | 2/2002 |
| JP | 2002/510866 | 4/2002 |
| JP | 2002-150821 | 5/2002 |
| JP | 2003-515956 | 5/2003 |
| JP | 2003-179259 | 6/2003 |
| JP | 2003-529889 | 10/2003 |
| JP | 2003-317979 | 11/2003 |
| JP | 2003-347588 | 12/2003 |
| JP | 2004-080046 | 3/2004 |
| JP | 2004-103443 | 4/2004 |
| JP | 2004/152993 | 5/2004 |
| JP | 2004-152993 | 5/2004 |
| JP | 2004-253309 | 9/2004 |
| JP | 2004/311791 | 11/2004 |
| JP | 2004-356116 | 12/2004 |
| JP | 2004-363055 | 12/2004 |
| JP | 2005-005482 | 1/2005 |
| JP | 2005-101296 | 4/2005 |
| JP | 2005-513724 | 5/2005 |
| JP | 2005-142311 | 6/2005 |
| JP | 2005-228979 | 8/2005 |
| JP | 2006/028312 | 3/2006 |
| JP | 2006-164879 | 6/2006 |
| JP | 2006-282994 | 10/2006 |
| JP | 2006-310856 | 11/2006 |
| JP | 2007-109617 | 4/2007 |
| JP | 2007-122950 | 5/2007 |
| JP | 2007-141737 | 6/2007 |
| JP | 2009-534794 | 9/2009 |
| KR | 10-2004-0029313 | 4/2004 |
| KR | 10-0425749 | 4/2004 |
| TW | 200511671 | 7/1993 |
| TW | 546854 | 8/2003 |
| TW | 556365 | 10/2003 |
| TW | 572994 | 1/2004 |
| TW | 595012 | 6/2004 |
| TW | 200523660 | 7/2005 |
| TW | I244772 | 12/2005 |
| TW | 200612582 | 4/2006 |
| TW | 200641169 | 3/2010 |
| TW | 200418334 | 11/2010 |
| TW | I365550 | 6/2012 |
| WO | 98/43014 | 10/1998 |
| WO | 99/66483 | 12/1999 |
| WO | 00/19546 | 4/2000 |
| WO | 00/34709 | 6/2000 |
| WO | 01/41215 | 6/2001 |
| WO | 01/43113 | 6/2001 |
| WO | 01/69692 | 9/2001 |
| WO | 03/019072 | 3/2003 |
| WO | 03/053111 | 6/2003 |
| WO | 03/056876 | 7/2003 |
| WO | 03/091771 | 11/2003 |
| WO | 2004/068909 | 8/2004 |
| WO | 2005/004202 | 1/2005 |
| WO | 2005/013365 | 2/2005 |
| WO | 2005013365 | 2/2005 |
| WO | 2005/013365 | 10/2005 |
| WO | 2005/124877 | 12/2005 |
| WO | 2005124877 | 12/2005 |
| WO | WO 2005/124877 | 12/2005 |
| WO | 2006/013513 | 2/2006 |
| WO | 2006/028312 | 3/2006 |
| WO | 2006/033031 | 3/2006 |
| WO | 2006/062047 | 6/2006 |
| WO | 2006/077740 | 7/2006 |
| WO | 2007/061758 | 5/2007 |
| WO | 2007/123940 | 11/2007 |

OTHER PUBLICATIONS

Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.

Cree® XLampe 7090 XR-E Series LED Binning and Labeling.

Chhajed, S., *Influence of junction temperature on chromaticity and color-rendering properties of trichromatic white-light sources . . .* , Journal of Applied Physics, 2005, vol. 97pp. 1-8.

Color Kinetics Inc., Color Kinetics Support : White Papers & Presentations; available at http://www.colorkinetics.com/support/whitepapers/:, Solid State Lighting White Papers & Presentations, Feb. 22, 2006, pp. 1-4.

Color Kinetics Inc., *Color Quality of Intelligent Solid-State Light Systems*, Color Quality of Solid-State Light Sources, Mar. 2005, pp. 1-3.

Compound Semiconductors Online, "LED Lighting Fixtures, Inc. Sets World Record at 80 Lumens per Watt for Warm White", Compound Semiconductors Online, May 30, 2006, pp. 1.

Cree, Inc., "Cree® Xlamp® 7090 XR-E Series LED Binning and Labeling," Application Note: CLD-AP08.000, 7pp (2006).

CSA International, "Test Data Report," Project No. 1786317, Report No. 1786317-1 (Apr. 2006).

DOE SSL CALiPer Report, "Product Test Reference: CALiPER 07-31 Downlight Lamp".

DOE SSL CALiPer Report, "Product Test Reference: CALiPER 07-47 Downlight Lamp".

Krames et al., *Lumileds Lighting, Light from Silicon Valley*, Progress and Future Direction of LED Technology, SSL Workshop, Nov. 13, 2003, Publisher: Limileds Lighting Inc., pp. 1-21.

Narendran et al., "Solid State lighting: failure analysis of white LEDs," Journal of Cystal Growth, vol. 268, Issues 1-4, Aug. 2004, Abstract.

Narendran et al., *Color Rendering Properties of LED Light Sources*, 2002, pp. 1-8.

Nichia, White Light LED, Part Nos. NSPW300BS and NSPW312BS, High Brightness LEDs, Nov. 12, 1999, Publisher: Nichia Corporation.

Press Release from LED Lighting Fixtures dated Apr. 24, 2006 entitled "LED Lighting Fixtures, Inc. achieves unprecedented gain in light output from new luminaire".

Press Release from LED Lighting Fixtures dated Feb. 16, 2006 entitled "LED Lighting Fixtures, Inc. Announces Record Performance".

Press Release from LED Lighting Fixtures dated Feb. 7, 2007 entitled "LED Lighting Fixtures Announces its first LED-based Recessed Down Light".

Press Release from LED Lighting Fixtures dated Jan. 26, 2006 entitled "LED Lighting Fixtures Creates 750 Lumen Recessed Light and Uses Only 16 Watts of Power".

Press Release from LED Lighting Fixtures dated May 30, 2006 entitled "LED Lighting Fixtures, Inc. Sets World Record at 80 Lumens per Watt for Warm White Fixture".

Press Release from LED Lighting Fixtures dated Nov. 28, 2007 entitled "New Lamp from LED Lighting Fixtures Shatter World Record for Energy Efficiency".

Shimizu, "Development of High-Efficiency LED Downlight", First International Conference on White LEDs and Solid State Lighting, Nov. 30, 2007.

U.S. Department of Energy, "DOE Solid-State Lighting CALiPER Program, Summary of Results: Round 3 of Product Testing," Oct. 2007.

U.S. Department of Energy, "DOE Solid-State Lighting CALiPER Program, Summary of Results: Round 4 of Product Testing," Jan. 2008.

U.S. Department of Energy, "DOE Solid-State Lighting CALiPER Program, Summary of Results: Round 5 of Product Testing," May 2008.

(56) References Cited

OTHER PUBLICATIONS

Van De Ven et al., "Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007.
White Light LED, Part Nos. NSPW300BS and NSPW312BS, High Brightness LEDs, Nov. 12, 1999, Publisher: Nichia Corporation.
Optoled Lighting Inc., *OptoLED Product Information*, 2009, Publisher: OptoLED GmBH website: accessed at http://222.optoled.de/englisch/products/led.html.
Permlight Inc., *Enbryten LED Product Information*, Feb. 2005, Publisher: Permlight Inc. website; accessed at http://www.webarchive.org displaying that www.permlight.com/products/LEDfixtures.asp was publicly available Jan. 2004.
Van De Ven et al., "Walla White Illumination with High CRI and High Efficacy by Combining 455 nm Excited Yellowish Phosphor LEDs and Red AlInGaP LEDs," First International Conference on White LEDs and Solid State Lighting, Nov. 30, 2007.
U.S. Appl. No. 13/804,935, filed Mar. 14, 2013, Pickard et al.
Office Action (and translation provided by foreign counsel) from a corresponding Korean patent application bearing a mailing date of Dec. 9, 2013 (7 pages).
Korean Preliminary Rejection dated Nov. 30, 2012 (and translation provided by foreign counsel), 5 pages.
Japanese Office Action dated Sep. 24, 2013 (and English translation provided by foreign counsel), 8 pages.
Tanabe, Setsuhisa et al.: "YAG glass-ceramic phosphor for white LED (II): Luminescence characteristics", Proceeding of SPIE, SPIE-International Society for Optical Engineering, US, vol. 5941, Jan. 1, 2005, pp. 1-6, XP002459950, ISSN: 0277-786X, D01: 10.1117/12.614681, 6 pages.
Joung, Kyu Park et al: "Appliction of $Ba^{2+}$,$Mg^{2+}$ Co-doped $Sr_2SiO_4$; Eu Yellow Phosphor for white-Light-Emitting Diodes", Journal of the Electrochemical Society, vol. 152, No. 8, Jan. 1, 2005, p. H121, XP055126869, ISSN: 0013-4651, D01:10.1149/1.1939187, 3 pages.
Katayama, K et al.,: "ZnSe-based white LEDs", Journal of Crystal Growth, El Sevier, Amsterdam, NL, vol. 214-215, Jun. 1, 2000, pp. 1064-1070, XP004201171, ISSN: 0022-0248, DOI: 10.1016/S0022-0248(00)00275-X, 7 pages.
European Office Action dated Jul. 9, 2014, 5 pages.
Korean Office Action dated Jul. 31, 2014 (and translation provided by foreign counsel), 6 pages.
Korean Office Action (and translation provided by foreign counsel) from a corresponding Korean patent application hearing a mailing date of Jul. 31, 2014, 7 pages.
EP Summons from a EP patent application hearing a mailing date of Dec. 7, 2010, 5 pages.
EP Office Action from a EP patent application bearing a mailing date of Jul. 12, 2012, 6 pages.
JP Office Action (and translation provided by foreign counsel) from a JP patent application bearing a mailing date of Aug. 22, 2012, 5 pages.
KR Office Action (and translation provided by foreign counsel) from a KR patent application bearing a mailing date of Dec. 6, 2013, 7 pages.
KR Office Action (and translation provided by foreign counsel) from a KR patent application bearing a mailing date of Oct. 31, 2014, 7 pages.
TW Office Action (and translation provided by foreign counsel) from a TW patent application bearing a mailing date of Jan. 24, 2014, 25 pages.
EP Office Action from a EP patent application bearing a mailing date of Feb. 25, 2010, 3 pages.
EP Office Action from a EP patent application bearing a mailing date of Apr. 5, 2012, 11 pages.
Deurenberg et al., Achieving color point stability in RGB multi-chip LED modules using various color control loops, Sep. 7, 2005, 12 pages.
JP Office Action (and translation provided by foreign counsel) from a JP patent application bearing a mailing date of Jan. 27, 2012, 5 pages.
JP Office Action (and translation provided by foreign counsel) from a JP patent application bearing a mailing date of Sep. 27, 2012, 12 pages.
TW Office Action (and translation provided by foreign counsel) from a TW patent application bearing a mailing date of Mar. 13, 2014, 28 pages.
International Search Report and Written Opinion of the International Searching Authority from an international patent application bearing a mailing date of Jul. 21, 2008, 15 pages.
JP Office Action (and translation provided by foreign counsel) from a JP patent application bearing a mailing date of Jul. 18, 2013, 10 pages.
Gerd O Mueller et al: *Illumination-grade white LEDs*, Proceedings of SPIE, vol. 4776, Nov. 26, 2002, XP055126871, ISSN: 0277-786X, DOI: 10.1117/12.457123, 9 pages.

\* cited by examiner

HIGH EFFICIENCY LIGHTING DEVICE INCLUDING ONE OR MORE SOLID STATE LIGHT EMITTERS, AND METHOD OF LIGHTING

CROSS-REFERENCE TO RELATED APPLICATIONS

This application claims the benefit of U.S. Provisional Patent Application No. 60/868,134, filed Dec. 1, 2006, entitled "Lighting Device and Lighting Method" (inventors: Antony Paul van de Ven and Gerald H. Negley), the entirety of which is hereby incorporated by reference as if set forth in its entirety.

This application is a continuation-in-part of U.S. patent application Ser. No. 11/948,021, filed Nov. 30, 2007 (now U.S. Patent Publication No. 2008/0130285), the entirety of which is incorporated herein by reference as if set forth in its entirety.

This application is a continuation-in-part of PCT International Patent Application No. PCT/US07/86027, filed Nov. 30, 2007 (PCT Publication No. 2008/070541), the entirety of which is incorporated herein by reference as if set forth in its entirety.

FIELD OF THE INVENTIVE SUBJECT MATTER

The present inventive subject matter relates to a lighting device, in particular, a device that includes one or more solid state light emitters in addition to one or more other light sources.

The present inventive subject matter also relates to a lighting device, in particular, a device which includes one or more solid state light emitters (e.g., light emitting diodes) and one or more luminescent materials (e.g., one or more phosphors).

The present inventive subject matter is also directed to lighting methods.

BACKGROUND

There is an ongoing effort to develop systems that are more energy-efficient. A large proportion (some estimates are as high as twenty-five percent) of the electricity generated in the United States each year goes to lighting, a large portion of which is general illumination (e.g., downlights, flood lights, spotlights and other general residential or commercial illumination products).

Solid state light emitters (e.g., light emitting diodes) are receiving much attention due to their energy efficiency. It is well known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

In addition, as compared to the normal lifetimes of solid state light emitters, incandescent light bulbs have relatively short lifetimes, i.e., typically about 750-1000 hours. Fluorescent bulbs have longer lifetimes (e.g., 10,000-20,000 hours) than incandescent lights, but provide less favorable color reproduction. In comparison, light emitting diodes, for example, have typical lifetimes between 50,000 and 70,000 hours.

General illumination devices are typically rated in terms of their color reproduction, i.e., the extent to which objects illuminated by the illumination devices are perceived to be the color that they actually are. Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used to a greater extent and/or in place of incandescent lights, fluorescent lights and other light-generating devices in a wide variety of applications. In addition, where light emitting diodes (or other solid state light emitters) are already being used, efforts are ongoing to provide lighting devices which are improved, e.g., with respect to energy efficiency, color rendering index (CRI Ra), contrast, efficacy (lm/W), and/or duration of service.

The most common type of general illumination is white light (or near white light), i.e., light that is close to the blackbody locus, e.g., within about 10 MacAdam ellipses of the blackbody locus on a 1931 CIE Chromaticity Diagram. The 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of primary colors.

Because light that is perceived as white is necessarily a blend of light of two or more colors (or wavelengths), no single light emitting diode junction has been developed that can produce white light. "White" solid state light emitting lamps have been produced by providing devices that mix different colors of light, e.g., by using light emitting diodes that emit light of differing respective colors and/or by converting some or all of the light emitted from the light emitting diodes using luminescent material. For example, as is well known, some lamps use red, green and blue light emitting diodes to generate light that is perceived as white. Other lamps use (1) one or more light emitting diodes that generate blue light and (2) luminescent material (e.g., one or more phosphor materials) that emits yellow light in response to excitation by light emitted by the light emitting diode, whereby the blue light and the yellow light, when mixed, produce light that is perceived as white light. While there is a need for more efficient white lighting, there is in general a need for more efficient lighting in all hues.

Representative examples of the use of solid state light emitters to provide a lighting device that provides excellent energy efficiency and excellent CRI and excellent duration of service at a reasonable cost are described in U.S. Pat. No. 7,213,940, issued on May 8, 2007. Despite the existence of such devices, there will always be a desire to provide lighting devices which can be used in some situations and which can provide even better energy efficiency, even if such improvement in energy efficiency detracts some other aspect of the device to some degree.

In summary, therefore, there is an ongoing need for ways to use solid state light emitters, e.g., light emitting diodes, in a wider variety of applications, with greater energy efficiency, acceptable color rendering index (CRI), lower cost, and/or longer duration of service.

BRIEF SUMMARY OF THE INVENTIVE SUBJECT MATTER

There exist "white" LED lamp light sources which are relatively efficient but which have poor color rendering, typically having CRI Ra values of less than 75, and which are particularity deficient in the rendering of red colors and also to a significant extent deficient in green. This means that many things, including the typical human complexion, food items, labeling, painting, posters, signs, apparel, home decoration, plants, flowers, automobiles, etc. exhibit odd or wrong color as compared to being illuminated with an incandescent light or natural daylight. Typically, such white LED lamps have a color temperature of approximately 5000 K, which is generally not visually comfortable for general illumination, but which may be desirable for the illumination of commercial produce or advertising and printed materials.

Some so-called "warm white" LED lamps have a more acceptable color temperature (typically 2700 to 3500 K) for indoor use, and in some special cases, good CRI Ra (in the case of a yellow and red phosphor mix as high as CRI Ra=95), but their efficiency is generally significantly less than that of the standard "cool white" LED lamps.

Colored objects illuminated by RGB LED lamps sometimes do not appear in their true colors. For example, an object that reflects only yellow light, and thus that appears to be yellow when illuminated with white light, may appear de-saturated and grayish when illuminated with light having an apparent yellow color, produced by the red and green LEDs of an RGB LED fixture. Such lamps, therefore, are considered not to provide excellent color rendition, particularly when illuminating various settings such as in general illumination and particularly with regard to natural scenes. In addition, currently available green LEDs are relatively inefficient, and thus limit the efficiency of such lamps.

Employing LEDs having a wide variety of hues would similarly necessitate use of LEDs having a variety of efficiencies, including some with low efficiency, thereby reducing the efficiency of such systems and dramatically increasing the complexity and cost of the circuitry to control the many different types of LEDs and maintain the color balance of the light.

There is therefore a need for a high efficiency white light source that combines the efficiency and long life of white LED lamps (i.e., which avoids the use of relatively inefficient light sources) with an acceptable color temperature and good color rendering index, a wide gamut and simple control circuitry.

In accordance with the present inventive subject matter, it has unexpectedly been found that surprisingly high CRI Ra can be obtained, while obtaining surprisingly high efficacy, by (1) illuminating one or more solid state light emitters that emit light having a peak wavelength in the range of from 400 nm to 480 nm, (2) exciting one or more luminescent materials that emit light having a dominant wavelength in the range of from 555 to 585 and (3) illuminating one or more solid state light emitters that emit light having a dominant wavelength in the range of from 600 nm to 630 nm such that:

a combination of light exiting the lighting device which was emitted by (1) the first group of solid state light emitters, (2) the one or more luminescent materials, and (3) the second group of solid state light emitters produces a mixture of light having x, y coordinates on a 1931 CIE Chromaticity Diagram which define a point which is within ten MacAdam ellipses of at least one point on the blackbody locus on a 1931 CIE Chromaticity Diagram, and a combination of light exiting the lighting device which was emitted by (1) the first group of solid state light emitters, and (2) the one or more luminescent materials would, in an absence of any additional light, produce a sub-mixture of light having x, y color coordinates which define a point which is within a first area on a 1931 CIE Chromaticity Diagram or a second area on a 1931 CIE Chromaticity Diagram, the first area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38, the second area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53.

In some embodiments according to the present invention, the sub-mixture of light has x, y color coordinates on a 1931 CIE Chromaticity Diagram which define a point which is within a sub-area which is within the first area defined above, and in which x is between 0.32 and 0.33, and y is between 0.40 and 0.41.

In some embodiments according to the present invention, the sub-mixture of light has x, y color coordinates on a 1931 CIE Chromaticity Diagram which define a point which is within a sub-area which is within the first area defined above, and in which x is between 0.32 and 0.33, and y is between 0.41 and 0.42.

In some embodiments according to the present invention, the sub-mixture of light has x, y color coordinates on a 1931 CIE Chromaticity Diagram which define a point which is within a sub-area which is within the first area defined above, and in which x is between 0.33 and 0.34, and y is between 0.42 and 0.43.

In some embodiments according to the present invention, the sub-mixture of light has x, y color coordinates on a 1931 CIE Chromaticity Diagram which define a point which is within a sub-area which is within the first area defined above, and in which x is between 0.33 and 0.34, and y is between 0.43 and 0.44.

In some embodiments according to the present invention, the sub-mixture of light has x, y color coordinates on a 1931 CIE Chromaticity Diagram which define a point which is within a sub-area which is within the first area defined above, and in which x is between 0.34 and 0.35, and y is between 0.44 and 0.45.

In some embodiments according to the present invention, the sub-mixture of light has x, y color coordinates on a 1931 CIE Chromaticity Diagram which define a point which is within a sub-area which is within the first area defined above, and in which x is between 0.34 and 0.35, and y is between 0.45 and 0.46.

In some embodiments according to the present invention, the sub-mixture of light has x, y color coordinates on a 1931 CIE Chromaticity Diagram which define a point which is within a sub-area which is within the first area defined above, and in which x is between 0.35 and 0.36, and y is between 0.46 and 0.47.

In some embodiments according to the present invention, the sub-mixture of light has x, y color coordinates on a 1931 CIE Chromaticity Diagram which define a point which is within a sub-area which is within the first area defined above, and in which x is between 0.35 and 0.36, and y is between 0.47 and 0.48.

In some embodiments according to the present invention, the sub-mixture of light has x, y color coordinates on a 1931 CIE Chromaticity Diagram which define a point which is within a sub-area which is within the first area defined above, and in which x is between 0.36 and 0.37, and y is between 0.47 and 0.48.

In some embodiments according to the present invention, the sub-mixture of light has x, y color coordinates on a 1931 CIE Chromaticity Diagram which define a point which is within a sub-area which is within the first area defined above, and in which x is between 0.37 and 0.38, and y is between 0.47 and 0.48.

In some embodiments according to the present invention, the sub-mixture of light has x, y color coordinates on a 1931 CIE Chromaticity Diagram which define a point which is within a sub-area which is within the first area defined above, and in which x is between 0.38 and 0.39, and y is between 0.47 and 0.48.

In some embodiments according to the present invention, the sub-mixture of light has x, y color coordinates on a 1931 CIE Chromaticity Diagram which define a point which is within a sub-area which is within the first area defined above, and in which x is between 0.38 and 0.39, and y is between 0.46 and 0.47.

In some embodiments according to the present invention, the sub-mixture of light has x, y color coordinates on a 1931 CIE Chromaticity Diagram which define a point which is within a sub-area which is within the first area defined above, and in which x is between 0.39 and 0.40, and y is between 0.46 and 0.47.

In some embodiments according to the present invention, the sub-mixture of light has x, y color coordinates on a 1931 CIE Chromaticity Diagram which define a point which is within a sub-area which is within the first area defined above, and in which x is between 0.40 and 0.41, and v is between 0.46 and 0.47.

In some embodiments according to the present invention, the sub-mixture of light has x, y color coordinates on a 1931 CIE Chromaticity Diagram which define a point which is within a sub-area which is within the first area defined above, and in which x is between 0.40 and 0.41, and y is between 0.45 and 0.46.

In some embodiments according to the present invention, the sub-mixture of light has x, y color coordinates on a 1931 CIE Chromaticity Diagram which define a point which is within a sub-area which is within the first area defined above, and in which x is between 0.41 and 0.42, and y is between 0.45 and 0.46.

In some embodiments according to the present invention, the sub-mixture of light has x, y color coordinates on a 1931 CIE Chromaticity Diagram which define a point which is within a sub-area which is within the first area defined above, and in which x is between 0.42 and 0.43, and v is between 0.45 and 0.46.

In some embodiments according to the present invention, the sub-mixture of light has x, y color coordinates on a 1931 CIE Chromaticity Diagram which define a point which is within a sub-area which is within the first area defined above, and in which x is between 0.42 and 0.43, and y is between 0.44 and 0.45.

In some embodiments according to the present invention, the sub-mixture of light has x, y color coordinates on a 1931 CIE Chromaticity Diagram which define a point which is within a sub-area which is within the first area defined above, and in which x is between 0.42 and 0.43, and y is between 0.43 and 0.44.

In some embodiments according to the present invention, the sub-mixture of light has x, y color coordinates on a 1931 CIE Chromaticity Diagram which define a point which is within a sub-area which is within the first area defined above, and in which x is between 0.42 and 0.43, and y is between 0.42 and 0.43.

In some embodiments according to the present invention, the sub-mixture of light has x, y color coordinates on a 1931 CIE Chromaticity Diagram which define a point which is within a sub-area which is within the first area defined above, and in which x is between 0.41 and 0.42, and y is between 0.41 and 0.42.

In some embodiments according to the present invention, the sub-mixture of light has x, y color coordinates on a 1931 CIE Chromaticity Diagram which define a point which is within a sub-area which is within the first area defined above, and in which x is between 0.40 and 0.41, and y is between 0.41 and 0.42.

In some embodiments according to the present invention, the sub-mixture of light has x, y color coordinates on a 1931 CIE Chromaticity Diagram which define a point which is within a sub-area which is within the first area defined above, and in which x is between 0.40 and 0.41, and y is between 0.40 and 0.41.

In some embodiments according to the present invention, the sub-mixture of light has x, y color coordinates on a 1931 CIE Chromaticity Diagram which define a point which is within a sub-area which is within the first area defined above, and in which x is between 0.39 and 0.40, and y is between 0.40 and 0.41.

In some embodiments according to the present invention, the sub-mixture of light has x, y color coordinates on a 1931 CIE Chromaticity Diagram which define a point which is within a sub-area which is within the first area defined above, and in which x is between 0.38 and 0.39, and y is between 0.39 and 0.40.

In some embodiments according to the present invention, the sub-mixture of light has x, y color coordinates on a 1931 CIE Chromaticity Diagram which define a point which is within a sub-area which is within the first area defined above, and in which x is between 0.37 and 0.38, and y is between 0.39 and 0.40.

In some embodiments according to the present invention, the sub-mixture of light has x, y color coordinates on a 1931 CIE Chromaticity Diagram which define a point which is within a sub-area which is within the first area defined above, and in which x is between 0.37 and 0.38, and y is between 0.38 and 0.39.

In some embodiments according to the present invention, the sub-mixture of light has x, y color coordinates on a 1931 CIE Chromaticity Diagram which define a point which is within a sub-area which is within the first area defined above, and in which x is between 0.36 and 0.37, and y is between 0.38 and 0.39.

In some embodiments according to the present invention, the sub-mixture of light has x, y color coordinates on a 1931 CIE Chromaticity Diagram which define a point which is within a sub-area which is within the first area defined above, and in which x is between 0.35 and 0.36, and y is between 0.38 and 0.39.

In some embodiments according to the present invention, the sub-mixture of light has x, y color coordinates on a 1931 CIE Chromaticity Diagram which define a point which is within a sub-area which is within the first area defined above, and in which x is between 0.34 and 0.35, and y is between 0.38 and 0.39.

In some embodiments according to the present invention, the sub-mixture of light has x, y color coordinates on a 1931 CIE Chromaticity Diagram which define a point which is within a sub-area which is within the first area defined above, and in which x is between 0.33 and 0.34, and y is between 0.39 and 0.40.

In some embodiments according to the present invention, the sub-mixture of light has x, y color coordinates on a 1931 CIE Chromaticity Diagram which define a point which is within a sub-area which is within the first area defined above, and in which x is between 0.32 and 0.33, and y is between 0.39 and 0.40.

In some embodiments according to the present invention, the sub-mixture of light has x, y color coordinates on a 1931 CIE Chromaticity Diagram which define a point which is within a sub-area in which x is between 0.33 and 0.34, and y is between 0.40 and 0.41.

In some embodiments according to the present invention, the sub-mixture of light has x, y color coordinates on a 1931 CIE Chromaticity Diagram which define a point which is within a sub-area in which x is between 0.33 and 0.34, and y is between 0.41 and 0.42.

In some embodiments according to the present invention, the sub-mixture of light has x, y color coordinates on a 1931 CIE Chromaticity Diagram which define a point which is within a sub-area in which x is between 0.34 and 0.35, and y is between 0.39 and 0.40.

In some embodiments according to the present invention, the sub-mixture of light has x, y color coordinates on a 1931 CIE Chromaticity Diagram which define a point which is within a sub-area in which x is between 0.34 and 0.35, and y is between 0.40 and 0.41.

In some embodiments according to the present invention, the sub-mixture of light has x, y color coordinates on a 1931 CIE Chromaticity Diagram which define a point which is within a sub-area in which x is between 0.34 and 0.35, and y is between 0.41 and 0.42.

In some embodiments according to the present invention, the sub-mixture of light has x, y color coordinates on a 1931 CIE Chromaticity Diagram which define a point which is within a sub-area in which x is between 0.34 and 0.35, and y is between 0.42 and 0.43.

In some embodiments according to the present invention, the sub-mixture of light has x, y color coordinates on a 1931 CIE Chromaticity Diagram which define a point which is within a sub-area in which x is between 0.34 and 0.35, and y is between 0.43 and 0.44.

In some embodiments according to the present invention, the sub-mixture of light has x, y color coordinates on a 1931 CIE Chromaticity Diagram which define a point which is within a sub-area in which x is between 0.35 and 0.36, and y is between 0.39 and 0.40.

In some embodiments according to the present invention, the sub-mixture of light has x, y color coordinates on a 1931 CIE Chromaticity Diagram which define a point which is within a sub-area in which x is between 0.35 and 0.36, and y is between 0.40 and 0.41.

In some embodiments according to the present invention, the sub-mixture of light has x, y color coordinates on a 1931 CIE Chromaticity Diagram which define a point which is within a sub-area in which x is between 0.35 and 0.36, and y is between 0.41 and 0.42.

In some embodiments according to the present invention, the sub-mixture of light has x, y color coordinates on a 1931 CIE Chromaticity Diagram which define a point which is within a sub-area in which x is between 0.35 and 0.36, and y is between 0.42 and 0.43.

In some embodiments according to the present invention, the sub-mixture of light has x, y color coordinates on a 1931 CIE Chromaticity Diagram which define a point which is within a sub-area in which x is between 0.35 and 0.36, and y is between 0.43 and 0.44.

In some embodiments according to the present invention, the sub-mixture of light has x, y color coordinates on a 1931 CIE Chromaticity Diagram which define a point which is within a sub-area in which x is between 0.35 and 0.36, and y is between 0.44 and 0.45.

In some embodiments according to the present invention, the sub-mixture of light has x, y color coordinates on a 1931 CIE Chromaticity Diagram which define a point which is within a sub-area in which x is between 0.35 and 0.36, and y is between 0.45 and 0.46.

In some embodiments according to the present invention, the sub-mixture of light has x, y color coordinates on a 1931 CIE Chromaticity Diagram which define a point which is within a sub-area in which x is between 0.36 and 0.37, and y is between 0.39 and 0.40.

In some embodiments according to the present invention, the sub-mixture of light has x, y color coordinates on a 1931 CIE Chromaticity Diagram which define a point which is within a sub-area in which x is between 0.36 and 0.37, and y is between 0.40 and 0.41.

In some embodiments according to the present invention, the sub-mixture of light has x, y color coordinates on a 1931

CIE Chromaticity Diagram which define a point which is within a sub-area in which x is between 0.36 and 0.37, and y is between 0.41 and 0.42.

In some embodiments according to the present invention, the sub-mixture of light has x, y color coordinates on a 1931 CIE Chromaticity Diagram which define a point which is within a sub-area in which x is between 0.36 and 0.37, and y is between 0.42 and 0.43.

In some embodiments according to the present invention, the sub-mixture of light has x, y color coordinates on a 1931 CIE Chromaticity Diagram which define a point which is within a sub-area in which x is between 0.36 and 0.37, and y is between 0.43 and 0.44.

In some embodiments according to the present invention, the sub-mixture of light has x, y color coordinates on a 1931 CIE Chromaticity Diagram which define a point which is within a sub-area in which x is between 0.36 and 0.37, and y is between 0.44 and 0.45.

In some embodiments according to the present invention, the sub-mixture of light has x, y color coordinates on a 1931 CIE Chromaticity Diagram which define a point which is within a sub-area in which x is between 0.36 and 0.37, and y is between 0.45 and 0.46.

In some embodiments according to the present invention, the sub-mixture of light has x, y color coordinates on a 1931 CIE Chromaticity Diagram which define a point which is within a sub-area in which x is between 0.36 and 0.37, and y is between 0.46 and 0.47.

In some embodiments according to the present invention, the sub-mixture of light has x, y color coordinates on a 1931 CIE Chromaticity Diagram which define a point which is within a sub-area in which x is between 0.37 and 0.38, and y is between 0.40 and 0.41.

In some embodiments according to the present invention, the sub-mixture of light has x, y color coordinates on a 1931 CIE Chromaticity Diagram which define a point which is within a sub-area in which x is between 0.37 and 0.38, and y is between 0.41 and 0.42.

In some embodiments according to the present invention, the sub-mixture of light has x, y color coordinates on a 1931 CIE Chromaticity Diagram which define a point which is within a sub-area in which x is between 0.37 and 0.38, and y is between 0.42 and 0.43.

In some embodiments according to the present invention, the sub-mixture of light has x, y color coordinates on a 1931 CIE Chromaticity Diagram which define a point which is within a sub-area in which x is between 0.37 and 0.38, and y is between 0.43 and 0.44.

In some embodiments according to the present invention, the sub-mixture of light has x, y color coordinates on a 1931 CIE Chromaticity Diagram which define a point which is within a sub-area in which x is between 0.37 and 0.38, and y is between 0.44 and 0.45.

In some embodiments according to the present invention, the sub-mixture of light has x, y color coordinates on a 1931 CIE Chromaticity Diagram which define a point which is within a sub-area in which x is between 0.37 and 0.38, and y is between 0.45 and 0.46.

In some embodiments according to the present invention, the sub-mixture of light has x, y color coordinates on a 1931 CIE Chromaticity Diagram which define a point which is within a sub-area in which x is between 0.37 and 0.38, and y is between 0.46 and 0.47.

In some embodiments according to the present invention, the sub-mixture of light has x, y color coordinates on a 1931 CIE Chromaticity Diagram which define a point which is within a sub-area in which x is between 0.38 and 0.39, and y is between 0.40 and 0.41.

In some embodiments according to the present invention, the sub-mixture of light has x, y color coordinates on a 1931 CIE Chromaticity Diagram which define a point which is within a sub-area in which x is between 0.38 and 0.39, and y is between 0.41 and 0.42.

In some embodiments according to the present invention, the sub-mixture of light has x, y color coordinates on a 1931 CIE Chromaticity Diagram which define a point which is within a sub-area in which x is between 0.38 and 0.39, and y is between 0.42 and 0.43.

In some embodiments according to the present invention, the sub-mixture of light has x, y color coordinates on a 1931 CIE Chromaticity Diagram which define a point which is within a sub-area in which x is between 0.38 and 0.39, and y is between 0.43 and 0.44.

In some embodiments according to the present invention, the sub-mixture of light has x, y color coordinates on a 1931 CIE Chromaticity Diagram which define a point which is within a sub-area in which x is between 0.38 and 0.39, and y is between 0.44 and 0.45.

In some embodiments according to the present invention, the sub-mixture of light has x, y color coordinates on a 1931 CIE Chromaticity Diagram which define a point which is within a sub-area in which x is between 0.38 and 0.39, and y is between 0.45 and 0.46.

In some embodiments according to the present invention, the sub-mixture of light has x, y color coordinates on a 1931 CIE Chromaticity Diagram which define a point which is within a sub-area in which x is between 0.39 and 0.40, and y is between 0.41 and 0.42.

In some embodiments according to the present invention, the sub-mixture of light has x, y color coordinates on a 1931 CIE Chromaticity Diagram which define a point which is within a sub-area in which x is between 0.39 and 0.40, and y is between 0.42 and 0.43.

In some embodiments according to the present invention, the sub-mixture of light has x, y color coordinates on a 1931 CIE Chromaticity Diagram which define a point which is within a sub-area in which x is between 0.39 and 0.40, and y is between 0.43 and 0.44.

In some embodiments according to the present invention, the sub-mixture of light has x, y color coordinates on a 1931 CIE Chromaticity Diagram which define a point which is within a sub-area in which x is between 0.39 and 0.40, and y is between 0.44 and 0.45.

In some embodiments according to the present invention, the sub-mixture of light has x, y color coordinates on a 1931 CIE Chromaticity Diagram which define a point which is within a sub-area in which x is between 0.39 and 0.40, and y is between 0.45 and 0.46.

In some embodiments according to the present invention, the sub-mixture of light has x, y color coordinates on a 1931 CIE Chromaticity Diagram which define a point which is within a sub-area in which x is between 0.40 and 0.41, and y is between 0.42 and 0.43.

In some embodiments according to the present invention, the sub-mixture of light has x, y color coordinates on a 1931 CIE Chromaticity Diagram which define a point which is within a sub-area in which x is between 0.40 and 0.41, and y is between 0.43 and 0.44.

In some embodiments according to the present invention, the sub-mixture of light has x, y color coordinates on a 1931

CIE Chromaticity Diagram which define a point which is within a sub-area in which x is between 0.40 and 0.41, and y is between 0.44 and 0.45.

In some embodiments according to the present invention, the sub-mixture of light has x, y color coordinates on a 1931 CIE Chromaticity Diagram which define a point which is within a sub-area in which x is between 0.41 and 0.42, and y is between 0.42 and 0.43.

In some embodiments according to the present invention, the sub-mixture of light has x, y color coordinates on a 1931 CIE Chromaticity Diagram which define a point which is within a sub-area in which x is between 0.41 and 0.42, and y is between 0.43 and 0.44.

In some embodiments according to the present invention, the sub-mixture of light has x, y color coordinates on a 1931 CIE Chromaticity Diagram which define a point which is within a sub-area in which x is between 0.41 and 0.42, and v is between 0.44 and 0.45.

In some embodiments according to the present invention, the sub-mixture of light has x, y color coordinates on a 1931 CIE Chromaticity Diagram which define a point which is within a combined area consisting of a combination of any two or more of the sub-areas defined above.

In some embodiments according to the present inventive subject matter, there is provided a lighting device comprising at least one light source that, when illuminated, emits light which, in an absence of any additional light, has x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to the present inventive subject matter, there is provided a lighting device comprising at least one light source that, when illuminated, emits light which, in an absence of any additional light, has x, y color coordinates which define a point which is within a second area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53.

In some embodiments according to the present inventive subject matter, there is provided a lighting device comprising a first group of solid state light emitters, the first group of solid state light emitters comprising at least a first solid state light emitter, each of the first group of light emitters, when illuminated, emitting light having a dominant emission wavelength in the range of from about 600 nm to about 630 nm.

In some embodiments according to the present inventive subject matter, there is provided a lighting device comprising a first group of solid state light emitters, the first group of solid state light emitters comprising at least a first solid state light emitter, each of the first group of light emitters, when illuminated, emits light having a dominant emission wavelength in the range of from about 602 nm to about 615 nm.

In some embodiments according to the present inventive subject matter, there is provided a lighting device comprising:

at least one light source which, when illuminated, emits light which, in an absence of any additional light, has x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38; and a first group of solid state light emitters, the first group of solid state light emitters comprising at least a first solid state light emitter, each of the first group of light emitters, when illuminated, emitting light having a dominant emission wavelength in the range of from about 600 nm to about 630 nm.

In some embodiments according to the present inventive subject matter, there is provided a lighting device comprising:

at least one light source which, when illuminated, emits light which, in an absence of any additional light, has x, y color coordinates which define a point which is within a second area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53; and a first group of solid state light emitters, the first group of solid state light emitters comprising at least a first solid state light emitter, each of the first group of light emitters, when illuminated, emitting light having a dominant emission wavelength in the range of from about 600 nm to about 630 nm.

In some embodiments according to the present inventive subject matter, there is provided a lighting device comprising:

at least one light source which, when illuminated, emits light which, in an absence of any additional light, has x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38;

a first group of solid state light emitters, the first group of solid state light emitters comprising at least a first solid state light emitter, each of the first group of light emitters, when illuminated, emitting light having a dominant emission wavelength in the range of from about 600 nm to about 630 nm; and at least a first power line, each of the at least one light source and each of the first group of solid state light emitters being electrically connected to the first power line, wherein:

if current is supplied to the first power line, a combination of (1) light exiting the lighting device which was emitted by the at least one light source, and (2) light exiting the lighting device which was emitted by the first group of solid state light emitters would, in an absence of any additional light, produce a mixed illumination which defines a point which is within 10 MacAdam ellipses of at least one point on the blackbody locus on a 1931 CIE Chromaticity Diagram.

In some embodiments according to the present inventive subject matter, there is provided a lighting device comprising:

at least one light source which, when illuminated, emits light which, in an absence of any additional light, has x, y color coordinates which define a point which is within a second area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53;

a first group of solid state light emitters, the first group of solid state light emitters comprising at least a first solid state light emitter, each of the first group of light emitters, when illuminated, emitting light having a dominant emission wavelength in the range of from about 600 µm to about 630 µm; and at least a first power line, each of the at least one light source and each of the first group of solid state light emitters being electrically connected to the first power line, wherein:

if current is supplied to the first power line, a combination of (1) light exiting the lighting device which was emitted by the at least one light source, and (2) light exiting the lighting device which was emitted by the first group of solid state light emitters would, in an absence of any additional light, produce a mixed illumination which defines a point which is within 10 MacAdam ellipses of at least one point on the blackbody locus on a 1931 CIE Chromaticity Diagram.

In some embodiments according to the present inventive subject matter, including some embodiments that include or do not include any of the features as discussed herein, when the at least one light source is illuminated and the first group of solid state light emitters is illuminated, a mixed illumination of (a) light exiting the lighting device which was emitted by the at least one light source and (b) light exiting the lighting device which was emitted by the first group of solid state light emitters has x, y coordinates on a 1931 CIE Chromaticity Diagram which define a point which is within 10 MacAdam ellipses of at least one point on the blackbody locus on a 1931 CIE Chromaticity Diagram.

In some embodiments according to the present inventive subject matter, including some embodiments that include or do not include any of the features as discussed herein, at least a first of the at least one light source comprises at least a second solid state light emitter and at least one luminescent material. In some of such embodiments, including some embodiments that include or do not include any of the features as discussed herein, when the second solid state light emitter is illuminated, at least a portion of light emitted from the second solid state light emitter is absorbed by the luminescent material, thereby exciting the luminescent material.

In some embodiments according to the present inventive subject matter, including some embodiments that include or do not include any of the features as discussed herein:

at least a first of the at least one light source comprises a second group of solid state light emitters and at least a first luminescent material, the second group of solid state light emitters includes at least a second solid state light emitter;

each of the second group of solid state light emitters, when illuminated, emits light having a peak emission wavelength in the range of from 400 nm to 480 nm; and the first luminescent material, when excited, emits light having a dominant emission wavelength in the range of from about 555 nm to about 585 nm.

In some embodiments according to the present inventive subject matter that comprise a second group of solid state light emitters and at least a first luminescent material, including some embodiments that include or do not include any of the features as discussed herein:

if each of the second group of solid state light emitters is illuminated, a combination of (1) light exiting the lighting device which was emitted by the second group of solid state light emitters, and (2) light exiting the lighting device which was emitted by the first luminescent material would, in an absence of any additional light, produce a mixed illumination which defines a point which is within the first area.

In some embodiments according to the present inventive subject matter that comprise a second group of solid state light emitters, including some embodiments that include or do not include any of the features as discussed herein, each of the second group of solid state light emitters, when illuminated, emits light having a peak emission wavelength in the range of from 430 nm to 480 nm.

In some embodiments according to the present inventive subject matter that comprise a second group of solid state light emitters and at least a first luminescent material, including some embodiments that include or do not include any of the features as discussed herein, if all of the solid state light emitters in the second group of solid state light emitters are illuminated, at least some of the first luminescent material would be excited by light emitted from the second group of solid state light emitters.

In some embodiments according to the present inventive subject matter, including some embodiments that include or do not include any of the features as discussed herein, the light source comprises at least one packaged solid state light emitter which comprises at least a second solid state light emitter and at least one luminescent material.

In some embodiments according to the present inventive subject matter, including some embodiments that include or do not include any of the features as discussed herein:

at least a first of the at least one light source comprises a white light source and a filter, the white light source emits white light source light that has x, y coordinates on a 1931 CIE Chromaticity Diagram which define a point which is within 10 MacAdam ellipses of at least one point on the blackbody locus on a 1931 CIE Chromaticity Diagram, and the filter removes at least some light from the white light source light to form filtered light which, in an absence of any additional light, has x, y color coordinates which define a point which is within the first area on a 1931 CIE Chromaticity Diagram as defined above.

In some embodiments according to the present inventive subject matter, including some embodiments that include or do not include any of the features as discussed herein:

at least a first of the at least one light source comprises at least a second light emitter and a third light emitter, the second light emitter, when illuminated, emits light of a second color, the third light emitter, when illuminated, emits light of a third color, and the third color is different from the second color.

In some embodiments according to the present inventive subject matter in which at least a first of the at least one light source comprises at least a second light emitter and a third light emitter, including some embodiments that include or do not include any of the features as discussed herein, the second light emitter is a second solid state light emitter and the third light emitter is a third solid state light emitter.

In some of such embodiments, including some embodiments that include or do not include any of the features as discussed herein, the first solid state light emitter comprises a first light emitting diode, the second solid state light emitter comprises a second light emitting diode and the third solid state light emitter comprises a third light emitting diode.

In some embodiments according to the present inventive subject matter, including some embodiments that include or do not include any of the features as discussed herein, there is provided a light fixture comprising at least one lighting device corresponding to any lighting device as described herein.

The lighting devices in accordance with the present inventive subject matter are also particularly applicable to situations where energy savings are especially critical, for example, in solar and/or battery powered applications.

In some embodiments according to the present inventive subject matter, there is provided a method comprising:

illuminating at least one light source to emit light which, in an absence of any additional light, has x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38; and illuminating a first group of solid state light emitters, the first group of solid state light emitters comprising at least one solid state light emitter, to emit light having a wavelength in the range of from about 600 nm to about 630 nm.

In some embodiments according to the present inventive subject matter, there is provided a method comprising:

illuminating at least one light source to emit light which, in an absence of any additional light, has x, y color coordinates which define a point which is within a second area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53; and illuminating a first group of solid state light emitters, the first group of solid state light emitters comprising at least one solid state light emitter, to emit light having a wavelength in the range of from about 600 nm to about 630 nm.

In some embodiments according to the present inventive subject matter, including some embodiments that include or do not include any of the features as discussed herein, a mixed illumination of (a) light emitted by the at least one light source and (b) light emitted by the first group of solid state light emitters has x, y coordinates on a 1931 CIE Chromaticity Diagram which define a point which is within 10 MacAdam ellipses of at least one point on the blackbody locus on a 1931 CIE Chromaticity Diagram. In some of such embodiments, including some embodiments that include or do not include any of the features as discussed herein:

the mixed illumination has a correlated color temperature of not greater than 5000 K; and/or the mixed illumination has a CRI of at least 70 and the mixed illumination is emitted at a wall plug efficiency of at least 70 lumens per watt.

With regard to any mixed light described herein in terms of its proximity (e.g., in MacAdam ellipses) to the blackbody locus on a 1931 CIE Chromaticity Diagram and/or on a 1976 CIE Chromaticity Diagram, the present inventive subject matter is further directed to such mixed light in the proximity of light on the blackbody locus having color temperature of 2700 K, 3000 K or 3500 K, namely:

mixed light having x, y color coordinates which define a point which is within a third area on a 1931 CIE Chromaticity Diagram, the third area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4578, 0.4101, the second point having x, y coordinates of 0.4813, 0.4319, the third point having x, y coordinates of 0.4562, 0.4260, the fourth point having x, y coordinates of 0.4373, 0.3893, and the fifth point having x, y coordinates of 0.4593, 0.3944 (i.e., proximate to 2700 K); or mixed light having x, y color coordinates which define a point which is within a fourth area on a 1931 CIE Chromaticity Diagram, the fourth area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4338, 0.4030, the second point having x, y coordinates of 0.4562, 0.4260, the third point having x, y coordinates of 0.4299, 0.4165, the fourth point having x, y coordinates of 0.4147, 0.3814, and the fifth point having x, y coordinates of 0.4373, 0.3893 (i.e., proximate to 3000 K); or mixed light having x, y color coordinates which define a point which is within a fifth area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4073, 0.3930, the second point having x, y coordinates of 0.4299, 0.4165, the third point having x, y coordinates of 0.3996, 0.4015, the fourth point having x, y coordinates of 0.3889, 0.3690, and the fifth point having x, y coordinates of 0.4147, 0.3814 (i.e., proximate to 3500 K).

Aspects related to the present inventive subject matter can be represented on either the 1931 CIE (Commission International de l'Eclairage) Chromaticity Diagram or the 1976 CIE Chromaticity Diagram. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). For a technical description of CIE chromaticity diagrams, see, for example, "Encyclopedia of Physical Science and Technology", vol. 7, 230-231 (Robert A Meyers ed., 1987). The spectral colors are distributed around the edge of the outlined space, which includes all of the hues perceived by the human eye. The boundary line represents maximum saturation for the spectral colors. As noted above, the 1976 CIE Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues which would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2 + \Delta v'^2)^{1/2}$, and the hues defined by a locus of points which are each a common distance from a specified hue consist of hues which would each be perceived as differing from the specified hue to a common extent.

Chromaticity coordinates and the CIE chromaticity diagrams are explained in detail in a number of books and other publications, such as pages 98-107 of K. H. Butler, "Fluorescent Lamp Phosphors" (The Pennsylvania State University Press 1980) and pages 109-110 of G. Blasse et al., "Luminescent Materials" (Springer-Verlag 1994), both incorporated herein by reference.

The chromaticity coordinates (i.e., color points) that lie along the blackbody locus obey Planck's equation: $E(\lambda) = A \lambda^{-5}/(e^{(B/T)} - 1)$, where E is the emission intensity, $\lambda$ is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

The present inventive subject matter may be more fully understood with reference to the accompanying drawings and the following detailed description of the inventive subject matter.

BRIEF DESCRIPTION OF THE DRAWING FIGURES

DETAILED DESCRIPTION OF THE INVENTION(S)

Figure 1:
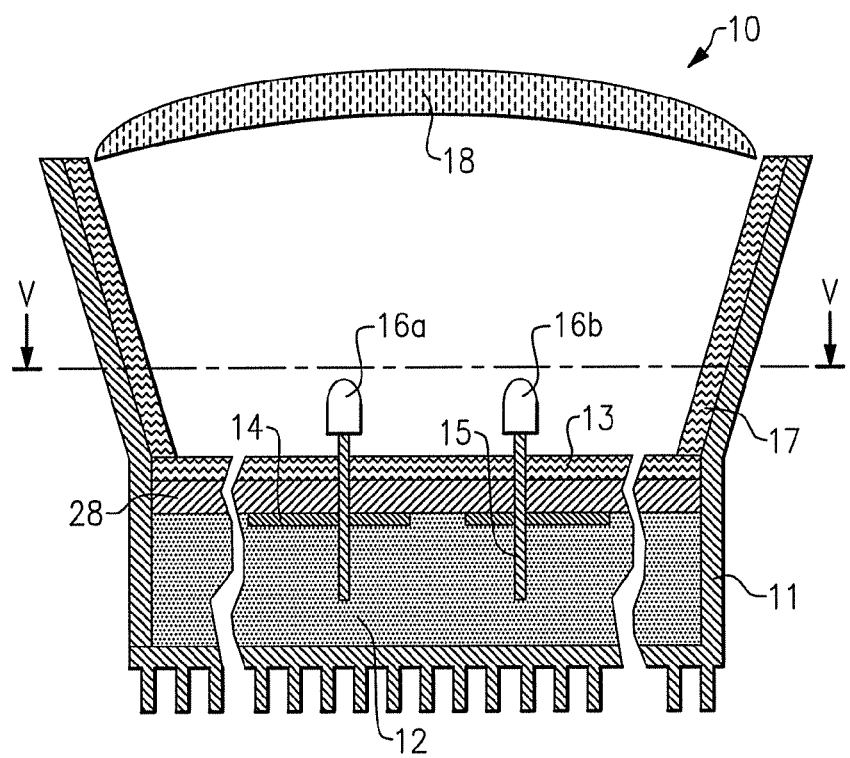
FIG. 1 depicts a first embodiment of a lighting device in accordance with the present inventive subject matter.

The present inventive subject matter now will be described more fully hereinafter with reference to the accompanying drawings, in which embodiments of the inventive subject matter are shown. However, this inventive subject matter should not be construed as being limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present. In addition, a statement that a first element is "on" a second element is synonymous with a statement that the second element is "on" the first element.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Relative terms, such as "lower", "bottom", "below", "upper", "top" or "above," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously, or intermittently at a rate such that a human eye would perceive it as emitting light continuously or intermittently, or where a plurality of solid state light emitters of the same color or different colors are emitting light intermittently and/or alternatingly (with or without overlap in "on" times) in such a way that a human eye would perceive them as emitting light continuously or intermittently (and, in some cases where different colors are emitted, as a mixture of those colors).

The expression "excited", as used herein when referring to luminescent material, means that at least some electromagnetic radiation (e.g., visible light, UV light or infrared light) is contacting the luminescent material, causing the luminescent material to emit at least some light. The expression "excited" encompasses situations where the luminescent material emits light continuously, or intermittently at a rate such that a human eye would perceive it as emitting light continuously or intermittently, or where a plurality of luminescent materials of the same color or different colors are emitting light intermittently and/or alternatingly (with or without overlap in "on" times) in such a way that a human eye would perceive them as emitting light continuously or intermittently (and, in some cases where different colors are emitted, as a mixture of those colors).

The expression "lighting device", as used herein, is not limited, except that it indicates that the device is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

The expression "dominant emission wavelength", as used herein, means (1) in the case of a solid state light emitter, the dominant wavelength of light that the solid state light emitter emits if it is illuminated, and (2) in the case of a luminescent material, the dominant wavelength of light that the luminescent material emits if it is excited.

The expression "peak emission wavelength", as used herein, means (1) in the case of a solid state light emitter, the peak wavelength of light that the solid state light emitter emits if it is illuminated, and (2) in the case of a luminescent material, the peak wavelength of light that the luminescent material emits if it is excited.

The expression "at least one light source" encompasses a single light source and a plurality of light sources.

The expression "wall plug efficiency", as used herein, is measured in lumens per watt, and means lumens exiting a lighting device, divided by all energy supplied to create the light, as opposed to values for individual components and/or assemblies of components. Accordingly, wall plug efficiency, as used herein, accounts for all losses, including, inter alia, any quantum losses, i.e., losses generated in converting line voltage into current supplied to light emitters, the ratio of the number of photons emitted by luminescent material(s) divided by the number of photons absorbed by the luminescent material(s), any Stokes losses, i.e., losses due to the change in frequency involved in the absorption of light and the re-emission of visible light (e.g., by luminescent material(s)), and any optical losses involved in the light emitted by a component of the lighting device actually exiting the lighting device. In some embodiments, the lighting devices in accordance with the present inventive subject matter provide the wall plug efficiencies specified herein when they are supplied with AC power (i.e., where the AC power is converted to DC power before being supplied to some or all components, the lighting device also experiences losses from such conversion), e.g., AC line voltage. The expression "line voltage" is used in accordance with its well known usage to refer to electricity supplied by an energy source, e.g., electricity supplied from a grid, including AC and DC.

As used herein, the term "substantially" means at least about 90% correspondence with the feature recited.

The expression "400 μm to 480 nm solid state light emitter" means any solid state light emitter which, if illuminated, would emit light having a peak wavelength in the range of from about 400 nm to about 480 nm (and analogously for other analogous expressions, e.g., the expression "430 μm to 480 nm solid state light emitter" or the like means any solid state light emitter which, if illuminated, would emit light having a peak wavelength in the range of from about 430 nm to about 480 μm).

The expression "555 nm to 585 nm luminescent material" means any luminescent material which, if excited, would emit light having a dominant wavelength in the range of from about 555 nm to about 585 nm.

The expression "600 nm to 630 nm solid state light emitter" means any solid state light emitter which, if illuminated, would emit light having a dominant wavelength in the range of from about 600 nm to about 630 μm (and analogously for other analogous expressions, e.g., the expression "602 nm to 615 nm solid state light emitter" or the like means any solid state light emitter which, if illuminated, would emit light having a peak wavelength in the range of from about 602 nm to about 615 nm).

The term "current", as used in the expression "if current is supplied to the first power line" means electrical current which is sufficient to cause the 400 nm to 480 nm solid state light emitter(s) to emit light having a peak wavelength in the range of from about 400 nm to about 480 nm, and/or to cause the 600 nm to 630 nm solid state light emitter(s) to emit light having a dominant wavelength in the range of from about 600 nm to about 630 mm.

The expression "directly or switchably electrically connected" means "directly electrically connected" or "switchably electrically connected."

A statement herein that one or more solid state light emitters are "electrically connected" to a power line means that current can be supplied to the solid state light emitter(s) by supplying current to the power line.

A statement herein that one or more switch is electrically connected to a power line means that current can flow through the power line if the switch (or switches) are closed, and current can be prevented from flowing through the power line if the switch (or one or more of the switches) is open.

A statement herein that two components in a device are "switchably electrically connected" means that there is a switch located between the two components, the switch being selectively closed or opened, wherein if the switch is closed, the two components are electrically connected, and if the switch is open (i.e., during any time period that the switch is open), the two components are not electrically connected.

All references herein to "some embodiments of the present inventive subject matter" can include embodiments of the present inventive subject matter that include or do not include any of the features as discussed herein.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As noted above, in some embodiments, the present inventive subject matter provides lighting devices that comprise (1) at least one light source which, when illuminated, emits light which, in an absence of any additional light, has x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38, and (2) one or more solid state light emitters that emit red light, and such lighting devices can provide high wall plug efficiencies and excellent CRI Ra.

In accordance with the present inventive subject matter, it has been determined that further increases in the wall plug efficiencies of such lighting devices can be achieved by substituting one or more solid state light emitters that emit light having dominant emission wavelength in the range of from about 602 nm to about 615 nm (i.e., red/orange solid state light emitters) for the solid state light emitter(s) that emit red light. The maximum efficacy has been found to be achieved in the range of from about 611 nm to about 615 nm.

In some instances, the substitution described in the previous paragraph, or the use of solid state light emitters that emit light having dominant emission wavelength in the range of from about 602 nm to about 615 nm as the solid state light emitter(s) that emit red/orange light, results in a moderate reduction in CRI Ra (for example, in the case of a 3500 K lighting device, from CRI Ra of >90 if the red dominant wavelength is 620 nm to CRI Ra of about 85 if the wavelength is 608 nm). In such instances, despite the moderate reduction in CRI Ra, such devices, with their increased wall plug efficiency, can be used in situations where the moderately reduced CRI Ra is still acceptable, and/or in situations where even more significantly reduced CRI Ra would not be considered to be a problem (for example, in some general illumination, security lighting, street lighting and/or emergency lighting). In addition, in instances where moderately reduced CRI Ra is tolerable and neutral to warm color temperature is desired (e.g., correlated color temperature of not greater than 5000 K, or, in some embodiments, not greater than 3500 K), the lighting devices in accordance with the present inventive subject matter can be useful.

In accordance with the present inventive subject matter, the present inventors recognized that a limiting factor in the production of high efficiency white light sources comprising (1) at least one light source which, when illuminated, emits light which, in an absence of any additional light, has x, y color coordinates which define a point which is within the first area on the 1931 CIE Chromaticity Diagram as defined above, and (2) one or more solid state light emitters that emit red light, is the efficiency of the solid state light emitters that emit red light. By substituting one or more solid state light emitters that emit light having dominant emission wavelength in the range of from about 602 nm to about 615 μm (i.e., red/orange solid state light emitters) for the solid state light emitter(s) that emit red light, or by using one or more solid state light emitters that emit light having dominant emission wavelength in the range of from about 602 nm to about 615 nm as the solid state light emitter(s) that emit red light, wall plug efficiency is increased and CRI Ra is reduced only a small amount. Accordingly, for applications where such a reduction in CRI Ra is tolerable, or where high CRI Ra is not essential, wall plug efficiency can be increased to be even higher than what is achieved in the above-mentioned high efficiency white light sources.

With phosphor-converted warm white light provided by lighting devices that comprise (1) at least one light source which, when illuminated, emits light which, in an absence of any additional light, has x, y color coordinates which define a point which is within the first area and/or the second area on the 1931 CIE Chromaticity Diagram as described above, and (2) one or more solid state light emitters that emit red light, there is a penalty of about 30% in adjusting output from respective light emitters to change from phosphor-converted cool white to phosphor-converted warm white. By substituting one or more solid state light emitters that emit light having dominant emission wavelength in the range of from about 602 nm to about 615 nm (i.e., red/orange solid state light emitters) for the solid state light emitter(s) that emit red light, or by using one or more solid state light emitters that emit light having dominant emission wavelength in the range of from about 602 nm to about 615 nm as the solid state light emitter(s) that emit red light, up to 25% more lumens can be obtained from the solid state light emitters, i.e., 60-80 lumens per watt red light emitting diodes (i.e., light emitting diodes that emit red light) can be replaced with 75-100 lumens per watt red/orange light emitting diodes (i.e., light emitting diodes that emit red and/or orange light). In such devices in accordance with the present inventive subject matter, as noted above, CRI Ra is in the 80 to 90 range, i.e., reduced as compared to lighting devices with solid state light emitters that emit red light, but the wall plug efficiency is increased from about 80 lumens per watt to about 95 lumens per watt (assuming that the red/orange light emitting device has an efficacy of about 100 lumens per watt). In some situations, the present inventive subject matter can achieve an increase in efficiency of about 10 to about 15 lumens per watt with a CRI Ra drop of about 10 using 613 nm red/orange light emitting diodes in place of the red light emitting diodes.

In accordance with the present inventive subject matter, the use of solid state light emitters that emit red/orange light in place of the solid state light emitters that emit red light provide higher efficiency as a result of the following two factors:

(1) for AlInGaP light emitting diodes, which are typically used as the light emitting diodes that emit red light, the total amount of radiation (in terms of energy) for a fixed amount of applied power (i.e., its efficiency) is maximum near 650 nm, and decreases at shorter wavelengths (i.e., in the direction of green); and (2) human eye response to color peaks at about 555 nm, and decreases at shorter or longer wavelengths (e.g., 1 watt of 605 nm light looks brighter to the human eye than 1 watt of 620 nm light; 1 watt of 595 nm light looks brighter to the human eye than 1 watt of 605 nm light; 1 watt of 585 nm light looks brighter to the human eye than 1 watt of 595 nm light, etc., down to about 555 nm), i.e., as the color changes toward red, the human eye's response/sensitivity decreases.

As a result, there are two slopes—the eye response falls from 555 mm toward 650 nm, whereas the AlInGaP efficiency increases from 555 nm to 650 nm. In accordance with the present inventive subject matter, by using light in the range of from about 602 nm to about 615 nm dominant wavelength (and in some cases light of about 613 nm dominant wavelength—this corresponds to about 619 nm peak wavelength) an excellent combination of efficiency of the AlInGaP light emitting diode and human eye luminous response can be achieved.

In some embodiments according to the present inventive subject matter, including some embodiments that include or do not include any of the features as discussed herein, each of the first group of light emitters, when illuminated, emits light having a dominant emission wavelength in the range of from about 602 nm to about 615 nM.

In some embodiments according to the present inventive subject matter, including some embodiments that include or do not include any of the features as discussed herein, each of the first group of light emitters, when illuminated, emits light having a dominant emission wavelength in the range of from about 611 nm to about 615 nm.

In some embodiments according to the present inventive subject matter, including some embodiments that include or do not include any of the features as discussed herein, each of the first group of light emitters, when illuminated, emits light having a dominant emission wavelength in the range of from about 605 nm to about 615 nm.

In some embodiments according to the present inventive subject matter, including some embodiments that include or do not include any of the features as discussed herein, each of the first group of light emitters, when illuminated, emits light having a dominant emission wavelength in the range of from about 610 nm to about 615 nm.

In some embodiments according to the present inventive subject matter, including some embodiments that include or do not include any of the features as discussed herein, each of the first group of light emitters, when illuminated, emits light having a dominant emission wavelength in the range of from about 612 nm to about 615 nm.

The at least one light source can be any desired light source that emits light which is within the first area and/or the second area on a 1931 CIE Chromaticity Diagram as described above. Persons of skill in the art are familiar with, and have ready access to, and can envision a wide variety of lighting components, and combinations of lighting components, that can provide light within the specified areas on the 1931 CIE Chromaticity Diagram, and any of such components and combinations of components can be employed in accordance with the present inventive subject matter.

Persons of skill in the art are familiar with, and have ready access to, a wide variety of light emitters of different colors, and any desired light emitters can be employed in accordance with the present inventive subject matter.

Representative examples of light sources include incandescent lights, fluorescent lamps, solid state light emitters, laser diodes, thin film electroluminescent devices, light emitting polymers (LEPs), halogen lamps, high intensity discharge lamps, electron-stimulated luminescence lamps, etc., with or without filters.

In some embodiments, the at least one light source comprises at least a second solid state light emitter and at least one luminescent material. In such embodiments, the one or more solid state light emitters can be any desired solid state light emitter, and the at least one luminescent material can be any desired luminescent material.

In some embodiments, the at least one light source comprises at least second and third light emitters that emit light of different colors.

In some embodiments, the at least one light source comprises at least one light source and a filter which removes light from the light emitted by the light source(s) to result in light that has (or would have in the absence of any other light) x, y color coordinates which define a point which is within the first area and/or the second area on the 1931 CIE Chromaticity Diagram as described above. In some embodiments, the at least one light source comprises one or more white light sources and one or more filters.

Persons of skill in the art are familiar with, and have ready access to, a wide variety of white light sources (discussed in more detail below), and any desired white light source (or sources), or combinations of different types of white light sources, can be employed in accordance with the present inventive subject matter.

Persons of skill in the art are familiar with, and have ready access to, a wide variety of filters (discussed in more detail below), and any desired filter (or filters), or combinations of different types of filters, can be employed in accordance with the present inventive subject matter. Such filters include (1) pass-through filters, i.e., filters in which light to be filtered is directed toward the filter, and some or all of the light passes through the filter (e.g., some of the light does not pass through the filter) and the light which passes through the filter is the filtered light, (2) reflection filters, i.e., filters in which light to be filtered is directed toward the filter, and some or all of the light is reflected by the filter (e.g., some of the light is not reflected by the filter) and the light which is reflected by the filter is the filtered light, and (3) filters which provide a combination of both pass-through filtering and reflection filtering.

The expression "at least one light source which, when illuminated, emits light which, in an absence of any additional light, has x, y color coordinates which define a point which is within an area on a 1931 CIE Chromaticity Diagram . . . ", as used herein (where the area on the 1931 CIE Chromaticity Diagram is as described above) encompasses arrangements comprising one or more white light sources and one or more filters, wherein light from one or more of the first group of solid state light emitters (and/or any other light emitters in the lighting device), like light from the one or more white light sources, passes through the filter.

For instance, a lighting device in accordance with the present inventive subject matter can comprise white light sources adjacent to red/orange solid state light emitters, with white light emitted by the light sources mixing with light emitted by red/orange solid state light emitters mixing and forming pink light before passing through the filter, and the filter removing some light (e.g., removing some yellow light and a small amount of blue light) from the pink light as it passes through the filter to result in white light. Such a lighting device is within the scope of the present inventive subject matter because the light emitted by the white light sources that passes through the filter has x, y color coordinates which define a point which is within an area on a 1931 CIE Chromaticity Diagram (i.e., not considering other light mixed with such light), and the mixture of such light with light emitted by the red/orange solid state light emitters which passes through the filter makes white light.

Representative examples of filters, and combinations of components by which a white light source and a filter can be used to provide light having light within the specified area on the 1931 CIE Chromaticity Diagram are described in U.S. patent application Ser. No. 12/035,604, filed on Feb. 22, 2008 (now U.S. Patent Publication No. 2008/0259589), the entirety of which is hereby incorporated by reference as if set forth in its entirety.

In some embodiments according to the present inventive subject matter (e.g., where the one or more solid state light emitters in the first group of solid state light emitters emit light having dominant wavelength in the range of from about 615 nm to about 616 nm), including some embodiments that include or do not include any of the features as discussed herein, the at least one light source, when illuminated, emits light which, in an absence of any additional light, has x, y color coordinates which define a point which is within a sixth area on a 1931 CIE Chromaticity Diagram enclosed by first, second, third and fourth line segments, the first line segment connecting a first point to a second point, the second line segment connecting the second point to a third point, the third line segment connecting the third point to a fourth point, the fourth line segment connecting the fourth point to the first point, the first point having x, y coordinates of 0.376, 0.487, the second point having x, y coordinates of 0.407, 0.470, the third point having x, y coordinates of 0.359, 0.384, and the fourth point having x, y coordinates of 0.326, 0.391.

In some embodiments according to the present inventive subject matter (e.g., where the one or more solid state light emitters in the first group of solid state light emitters emit light having dominant wavelength in the range of from about 615 nm to about 616 nm), including some embodiments that include or do not include any of the features as discussed herein, the at least one light source, when illuminated, emits light which, in an absence of any additional light, has x, y color coordinates which define a point which is within a sub-area in which x is in the range of from about 0.373 to about 0.383 and y is in the range of from about 0.441 to about 0.451. In some such embodiments, a mixture of light from the at least one light source and light from the first group of solid state light emitters has x, y color coordinates on a 1931 CIE Chromaticity Diagram which define a point which is within a sub-area in which x is in the range of from about 0.454 to about 0.464 and y is in the range of from about 0.407 to about 0.417.

In some embodiments according to the present inventive subject matter (e.g., where the one or more solid state light emitters in the first group of solid state light emitters emit light having dominant wavelength in the range of from about 615 nm to about 616 nm), including some embodiments that include or do not include any of the features as discussed herein, the at least one light source, when illuminated, emits light which, in an absence of any additional light, has x, y color coordinates on a 1931 CIE Chromaticity Diagram which define a point which is within a sub-area in which x is in the range of from about 0.367 to about 0.377 and y is in the range of from about 0.431 to about 0.441. In some such embodiments, a mixture of light from the at least one light source and light from the first group of solid state light emitters has x, y color coordinates on a 1931 CIE Chromaticity Diagram which define a point which is within a sub-area in which x is in the range of from about 0.443 to about 0.453 and y is in the range of from about 0.402 to about 0.412.

In some embodiments according to the present inventive subject matter (e.g., where the one or more solid state light emitters in the first group of solid state light emitters emit light having dominant wavelength in the range of from about 615 nm to about 616 nm), including some embodiments that include or do not include any of the features as discussed herein, the at least one light source, when illuminated, emits light which, in an absence of any additional light, has x, y color coordinates on a 1931 CIE Chromaticity Diagram which define a point which is within a sub-area in which x is in the range of from about 0.363 to about 0.373 and y is in the range of from about 0.423 to about 0.433. In some such embodiments, a mixture of light from the at least one light source and light from the first group of solid state light emitters has x, y color coordinates on a 1931 CIE Chromaticity Diagram which define a point which is within a sub-area in which x is in the range of from about 0.435 to about 0.445 and y is in the range of from about 0.398 to about 0.408.

In some embodiments according to the present inventive subject matter (e.g., where the one or more solid state light emitters in the first group of solid state light emitters emit light having dominant wavelength in the range of from about 615 nm to about 616 nm), including some embodiments that include or do not include any of the features as discussed herein, the at least one light source, when illuminated, emits light which, in an absence of any additional light, has x, y color coordinates on a 1931 CIE Chromaticity Diagram which define a point which is within a sub-area in which x is in the range of from about 0.352 to about 0.362 and y is in the range of from about 0.403 to about 0.413. In some such embodiments, a mixture of light from the at least one light source and light from the first group of solid state light emitters has x, y color coordinates on a 1931 CIE Chromaticity Diagram which define a point which is within a sub-area in which x is in the range of from about 0.406 to about 0.416 and y is in the range of from about 0.388 to about 0.398.

In some embodiments according to the present inventive subject matter, including some embodiments that include or do not include any of the features as discussed herein, the at least one light source, when illuminated, emits light which, in an absence of any additional light, has x, y color coordinates which define a point which is within a seventh area on a 1931 CIE Chromaticity Diagram enclosed by first, second, third and fourth line segments, the first line segment connecting a first point to a second point, the second line segment connecting the second point to a third point, the third line segment connecting the third point to a fourth point, the fourth line segment connecting the fourth point to the first point, the first point having x, y coordinates of 0.32, 0.40, the second point having x, y coordinates of 0.36, 0.48, the third point having x, y coordinates of 0.41, 0.455, and the fourth point having x, y coordinates of 0.36, 0.38.

The solid state light emitters used in the devices according to the present inventive subject matter, and the luminescent material (or luminescent materials) (which can in some embodiments be included in one or more lumiphors) used in some embodiments according to the present inventive subject matter, can be selected from among any solid state light emitters and luminescent materials (and/or lumiphors) known to persons of skill in the art. Wide varieties of such solid state light emitters and lums (and lumiphors) are readily obtainable and well known to those of skilled in the art, and any of them can be employed.

The solid state light emitters can be nearly saturated or non-saturated. The expression "nearly saturated", as used herein, means having a purity of at least 85%, the term "purity" having a well-known meaning to persons skilled in the art, and procedures for calculating purity being well-known to those of skill in the art.

The lighting devices according to the present inventive subject matter can comprise any desired number of solid state light emitters (and/or any amount of luminescent material or number of lumiphors). For example, a lighting device according to the present inventive subject matter can include 50 or more solid state light emitters, or can include 100 or more solid state light emitters, etc.

Representative examples of suitable solid state light emitters, including suitable light emitting diodes, luminescent materials, lumiphors, encapsulants, etc. that may be used in practicing the present inventive subject matter, are described in:

U.S. patent application Ser. No. 11/614,180, filed Dec. 21, 2006 (now U.S. Patent Publication No. 2007/0236911), the entirety of which is hereby incorporated by reference as if set forth in its entirety;

U.S. patent application Ser. No. 11/624,811, filed Jan. 19, 2007 (now U.S. Patent Publication No. 2007/0170447), the entirety of which is hereby incorporated by reference as if set forth in its entirety;

U.S. patent application Ser. No. 11/751,982, filed May 22, 2007 (now U.S. Patent Publication No. 2007/0274080), the entirety of which is hereby incorporated by reference as if set forth in its entirety;

U.S. patent application Ser. No. 11/753,103, filed May 24, 2007 (now U.S. Patent Publication No. 2007/0280624), the entirety of which is hereby incorporated by reference as if set forth in its entirety;

U.S. patent application Ser. No. 11/751,990, filed May 22, 2007 (now U.S. Patent Publication No. 2007/0274063), the entirety of which is hereby incorporated by reference as if set forth in its entirety;

U.S. patent application Ser. No. 11/736,761, filed Apr. 18, 2007 (now U.S. Patent Publication No. 2007/0278934), the entirety of which is hereby incorporated by reference as if set forth in its entirety;

U.S. patent application Ser. No. 11/936,163, filed Nov. 7, 2007 (now U.S. Patent Publication No. 2008/0106895), the entirety of which is hereby incorporated by reference as if set forth in its entirety;

U.S. patent application Ser. No. 11/843,243, filed Aug. 22, 2007 (now U.S. Patent Publication No. 2008/0084685), the entirety of which is hereby incorporated by reference as if set forth in its entirety;

U.S. patent application Ser. No. 11/870,679, filed Oct. 11, 2007 (now U.S. Patent Publication No. 2008/0089053), the entirety of which is hereby incorporated by reference as if set forth in its entirety;

U.S. patent application Ser. No. 12/117,148, filed May 8, 2008 (now U.S. Patent Publication No. 2008/0304261), the entirety of which is hereby incorporated by reference as if set forth in its entirety; and U.S. patent application Ser. No. 12/017,676, filed on Jan. 22, 2008 (now U.S. Patent Publication No. 2009-0108269), the entirety of which is hereby incorporated by reference as if set forth in its entirety.

A variety of solid state light emitters are well known, and any of such light emitters can be employed according to the present inventive subject matter. Representative examples of solid state light emitters include light emitting diodes (inorganic or organic, including polymer light emitting diodes (PLEDs)) with or without luminescent materials.

Light emitting diodes are semiconductor devices that convert electrical current into light. A wide variety of light emitting diodes are used in increasingly diverse fields for an ever-expanding range of purposes. More specifically, light emitting diodes are semiconducting devices that emit light (ultraviolet, visible, or infrared) when a potential difference is applied across a p-n junction structure.

Persons of skill in the art are familiar with, and have ready access to, a variety of solid state light emitters that emit light having a desired peak emission wavelength and/or dominant emission wavelength, and any of such solid state light emitters (discussed in more detail below), or any combinations of such solid state light emitters, can be employed in embodiments that comprise a solid state light emitter.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

The one or more luminescent materials can be any desired luminescent material (representative examples including YAG and BOSE). Persons of skill in the art are familiar with, and have ready access to, a variety of luminescent materials that emit light having a desired peak emission wavelength and/or dominant emission wavelength, or a desired hue, and any of such luminescent materials (discussed in more detail below), or any combinations of such luminescent materials, can be employed in embodiments that comprise luminescent material. The one or more luminescent materials can be down-converting or up-converting, or can include a combination of both types. For example, the one or more luminescent materials can be selected from among phosphors, scintillators, day glow tapes, inks which glow in the visible spectrum upon illumination with ultraviolet light, etc.

The one or more luminescent materials can be provided in any desired form. For example, the luminescent element can be embedded in a resin (i.e., a polymeric matrix), such as a silicone material, an epoxy material, a glass material or a metal oxide material, to provide a lumiphor.

A wide variety of lumiphors are known to those skilled in the art. For example, a lumiphor can comprise (or can consist essentially of, or can consist of) one or more phosphor. A lumiphor can, if desired, further comprise one or more highly transmissive (e.g., transparent or substantially transparent, or somewhat diffuse) binder, e.g., made of epoxy, silicone, glass, metal oxide, or any other suitable material (for example, in any given lumiphor comprising one or more binder, one or more phosphor can be dispersed within the one or more binder). For example, the thicker the lumiphor, in general, the lower the weight percentage of the phosphor can be. Depending on the overall thickness of the lumiphor, however, the weight percentage of the phosphor could be generally any value, e.g., from 0.1 weight percent to 100 weight percent (e.g., a lumiphor formed by subjecting pure phosphor to a hot isostatic pressing procedure). Any lumiphor can further comprise any of a number of well-known additives, e.g., diffusers, scatterers, tints, etc.

In some embodiments in accordance with the present inventive subject matter, the lighting device can comprise more than two groups of solid state light emitters, e.g., a third group of solid state light emitters, in some cases a fourth group of solid state light emitters, etc., along with the at least one luminescent material. In such embodiments, the respective solid state light emitters and/or luminescent material(s) can be selected so as to emit any desired wavelengths or hues, and can be positioned and oriented such that any desired combinations of light mix in any desired combinations at any desired locations. Persons of skill in the art are familiar with, and have ready access to, and can readily envision a wide variety of combinations of light of different wavelengths and hues.

In some embodiments according to the present inventive subject matter, one or more of the light emitting diode chips can be included in a package together with one or more of the luminescent material, and the one or more luminescent material in the package can be spaced from the one or more light emitting diode chip in the package to achieve improved light extraction efficiency, as described in U.S. patent application Ser. No. 11/614,180, filed Dec. 21, 2006 (now U.S. Patent Publication No. 2007/0236911), the entirety of which is hereby incorporated by reference as if set forth in its entirety.

In some embodiments according to the present inventive subject matter, two or more lumiphors can be provided, two or more of the lumiphors being spaced from each other, as described in U.S. patent application Ser. No. 11/624,811, filed Jan. 19, 2007 (now U.S. Patent Publication No. 2007/0170447), the entirety of which is hereby incorporated by reference as if set forth in its entirety.

Inclusion of luminescent materials in LED devices can be accomplished by adding the luminescent materials to a clear or translucent encapsulant material (e.g., epoxy-based, silicone-based, glass-based or metal oxide-based material) as discussed above, for example by a blending or coating process.

For example, U.S. Pat. No. 6,963,166 (Yano '166) (the entirety of which is hereby incorporated by reference as if set forth in its entirety) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

A representative example of a "white LED lamp" includes a package of a blue light emitting diode chip, made of indium gallium nitride (InGaN) or gallium nitride (GaN), coated with a phosphor such as YAG or BOSE. In such an LED lamp, the blue light emitting diode chip produces a blue emission and the phosphor produces yellow fluorescence on receiving that emission. For instance, a white light emitting diode lamp can be fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light. Another type can use a blue or violet light emitting diode chip which is combined with phosphor materials that produce red or orange and green or yellowish-green light rays. In such a lamp, part of the blue or violet light emitted by the light emitting diode chip excites the phosphors, causing the phosphors to emit red or orange and yellow or green light rays. These rays, combined with the blue or violet rays, can produce the perception of white light.

Designs are provided in which LED component packages and other electronics are assembled into a fixture. In such designs, a packaged LED can be mounted to a circuit board (or directly to a heat sink), the circuit board is mounted to a heat sink, and the heat sink is mounted to the fixture housing along with drive electronics. In many cases, additional optics (secondary to the package parts) can be included.

As noted above, some embodiments in accordance with the present inventive subject matter comprise a power line. Persons of skill in the art are familiar with, and have ready access to, a variety of structures that can be used as a power line. A power line can be any structure that can carry electrical energy to a light emitter, such as a solid state light emitter. In some embodiments, a string of solid state light emitters, and/or an arrangement comprising a plurality of strings of solid state light emitters arranged in parallel, is/are arranged in series with a power line, such that current is supplied through a power line and is ultimately supplied to the string or strings. In some embodiments, power is supplied to a power line before and/or after going through a power supply.

As noted above, some embodiments of the present inventive subject matter comprise at least a first power line, a second group of solid state light emitters and at least a first luminescent material. In some of such embodiments, including some embodiments that include or do not include any of the features as discussed herein, if current is supplied to a first power line, substantially all of the light emitted by the lighting device is emitted by the first group of solid state light emitters, the at least a first luminescent material and the second group of solid state light emitters.

In some embodiments of the present inventive subject matter that comprise at least a first power line, a second group of solid state light emitters and at least a first luminescent material, including some embodiments that include or do not include any of the features as discussed herein, if current is supplied to the first power line, the intensity of light emitted by the first group of solid state light emitters, the at least a first luminescent material and the second group of solid state light emitters is at least about 75 percent (in some embodiments at least about 85 percent, and in some embodiments at least about 90 percent, 95 percent) of the total intensity of light being emitted by the lighting device.

In some embodiments of the present inventive subject matter that comprise at least a first power line and a second group of solid state light emitters, including some embodiments that include or do not include any of the features as discussed herein, the first and second groups of solid state light emitters are illuminated by supplying current to the first power line.

As noted above, some embodiments of the present inventive subject matter comprise a second group of solid state light emitters and at least a first luminescent material. In some of such embodiments, including some embodiments that include or do not include any of the features as discussed herein, at least one of the solid state light emitters in the second group of solid state light emitters is embedded within an encapsulant element in which at least some of the first luminescent material is also embedded.

In some embodiments in which the at least one light source comprises at least a second solid state light emitter and at least one luminescent material, at least a portion of light emitted from the second solid state light emitter is absorbed by the luminescent material, thereby exciting the luminescent material. In some of such embodiments, the luminescent materials can be included within one or more solid state light emitters. Such inclusion of luminescent material in a packaged solid state light emitter has been accomplished in a variety of ways, one representative way being by adding the luminescent materials to a clear or transparent encapsulant material (e.g., epoxy-based, silicone-based, glass-based or metal oxide-based material) as discussed above, for example by a blending or coating process.

For example, one representative example of a conventional solid state light emitter lamp that comprises a solid state light emitter and luminescent material includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion in which a luminescent material is dispersed, the first resin portion being further encapsulated with a second resin portion. The first resin portion can be obtained by filling the cup reflector with a resin material and curing it after the light emitting diode chip has been mounted onto the bottom of the cup reflector and then has had its cathode and anode electrodes electrically connected to the leads by way of wires. The luminescent material can be dispersed in the first resin portion so as to be excited with the light A that has been emitted from the light emitting diode chip, the excited luminescent material produces fluorescence ("light B") that has a longer wavelength than the light A, a portion of the light A is transmitted through the first resin portion including the luminescent material, and as a result, light C, as a mixture of the light A and light B, is used as illumination.

As noted above, in some embodiments, the light source comprises at least one packaged solid state light emitter which comprises at least a second solid state light emitter and at least one luminescent material.

Some embodiments in accordance with the present inventive subject matter include one or more lenses or diffusers. Persons of skill in the art are familiar with a wide variety of lenses and diffusers, and can readily envision a variety of materials out of which a lens or a diffuser can be made, and are familiar with and/or can envision a wide variety of shapes that lenses and diffusers can be. Any of such materials and/or shapes can be employed in a lens and/or a diffuser in an embodiment that includes a lens and/or a diffuser. As will be understood by persons skilled in the art, a lens or a diffuser in a lighting device according to the present inventive subject matter can be selected to have any desired effect on incident light (or no effect), such as focusing, diffusing, etc.

In embodiments in accordance with the present inventive subject matter that include one or more lenses and/or one or more diffusers, the lens(es) and/or the diffuser(s) can be positioned in any desired location and orientation.

In some embodiments according to the present inventive subject matter, including some embodiments that include or do not include any of the features as discussed herein, the lighting device further comprises at least one enclosing structure surrounding the light source and the first group of solid state light emitters, and the enclosing structure comprises a diffusing element.

As noted above, some embodiments of the present inventive subject matter comprise a second group of solid state light emitters and at least a first luminescent material. In some of such embodiments, including some embodiments that include or do not include any of the features as discussed herein:

each of the second group of solid state light emitters, if illuminated, would emit light having a peak wavelength in the range of from 440 nm to 480 nm (in some embodiments, in the range of from 440 nm to 470 nm);

the first luminescent material, if excited, would emit light having a dominant wavelength in the range of from about 560 nm to about 580 nm (in some embodiments, in the range of from 565 nm to 575 nm); and/or each of the first group of solid state light emitters, if illuminated, would emit light having a dominant wavelength in the range of from 605 nm to 630 nm (in some embodiments, in the range of from 610 nm to 620 nm).

In some embodiments according to the present inventive subject matter, including some embodiments that include or do not include any of the features as discussed herein, a sub-mixture of light is produced by a first sub-group of light emitting diodes, a first sub-group of at least a first luminescent material, a second sub-group of light emitting diodes and a second sub-group of at least one luminescent material (which can be the same as the first luminescent material, different from the first luminescent material or include the first luminescent material and at least one other luminescent material), wherein:

when each of the first sub-group of light emitting diodes is illuminated and each of the first sub-group of at least a first luminescent material is excited, a mixture of light emitted from the first sub-group of light emitting diodes and the first group of at least a first luminescent material would, in the absence of any additional light, have a first sub-group mixed illumination has x, y color coordinates which are within a first sub-group area on a 1931 CIE Chromaticity Diagram which is outside of the first area (defined above), e.g., an area which is enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.36, 0.48, the second point having x, y coordinates of 0.43, 0.45, the third point having x, y coordinates of 0.5125, 0.4866, and the fourth point having x, y coordinates of 0.4087, 0.5896;

when each of the second sub-group of light emitting diodes is illuminated and each of the second sub-group of at least one luminescent material is excited, a mixture of light emitted from the second sub-group of light emitting diodes and the second sub-group of at least one luminescent material would, in the absence of any additional light, have a second sub-group mixed illumination having x, y color coordinates which are within a second sub-group area on a 1931 CIE Chromaticity Diagram which is outside the first area (defined above) and outside the first sub-group area, e.g., an area which is enclosed by fifth, sixth, seventh and eighth line segments, the fifth line segment connecting a fifth point to a sixth point, the sixth line segment connecting the sixth point to a seventh point, the seventh line segment connecting the seventh point to an eighth point, and the eighth line segment connecting the eighth point to the fifth point, the fifth point having x, y coordinates of 0.32, 0.40, the sixth point having x, y coordinates of 0.36, 0.38, the seventh point having x, y coordinates of 0.25, 0.29, and the eighth point having x, y coordinates of 0.30, 0.26; and when each of the first sub-group of light emitting diodes and the second sub-group of light emitting diodes is illuminated and each of the first sub-group of at least a first luminescent material and the second sub-group of at least one luminescent material is excited, a mixture of light emitted from the first sub-group of light emitting diodes, the second sub-group of light emitting diodes, the first sub-group of at least a first luminescent material and the second sub-group of at least one luminescent material would, in the absence of any additional light, have a first group-second group mixed illumination having x, y color coordinates which are within the first area on a 1931 CIE Chromaticity Diagram as defined above, i.e., enclosed by ninth, tenth, eleventh, twelfth and thirteenth line segments, the ninth line segment connecting a ninth point to a tenth point, the tenth line segment connecting the tenth point to an eleventh point, the eleventh line segment connecting the eleventh point to a twelfth point, the twelfth line segment connecting the twelfth point to a thirteenth point, and the thirteenth line segment connecting the thirteenth point to the ninth point, the ninth point having x, y coordinates of 0.32, 0.40, the tenth point having x, y coordinates of 0.36, 0.48, the eleventh point having x, y coordinates of 0.43, 0.45, the twelfth point having x, y coordinates of 0.42, 0.42, and the thirteenth point having x, y coordinates of 0.36, 0.38. A variety of such lighting devices are disclosed in U.S. patent application Ser. No. 11/936,163, filed Nov. 7, 2007 (now U.S. Patent Publication No. 2008/0106895), the entirety of which is hereby incorporated by reference as if set forth in its entirety.

In some embodiments of lighting devices in accordance with the present inventive subject matter, if electricity is supplied to the lighting device, a mixture of all light exiting from said lighting device which is outside the range of between 600 nm and 700 nm would have x, y color coordinates which define a point which is within the first area and/or the second area on the 1931 CIE Chromaticity Diagram as described above.

In some embodiments, the at least one light source comprises a second group of solid state light emitters that emit light having a peak emission wavelength in the range of from about 400 nm to about 480 nm (and in some embodiments, from about 430 nm to about 480 nm) and a first luminescent material that emits light having a dominant emission wavelength in the range of from about 555 nm to about 585 nm.

Persons of skill in the art are familiar with, and have ready access to, a variety of solid state light emitters that emit light having a peak emission wavelength in the range of from about 400 nm to about 480 nm, and any of such solid state light emitters (discussed in more detail below), and any desired combinations of such solid state light emitters, can be employed in accordance with the present inventive subject matter.

Persons of skill in the art are familiar with, and have ready access to, a variety of luminescent materials that emit light having a dominant emission wavelength in the range of from about 555 nm to about 585 nm, and any of such luminescent materials (discussed in more detail below), and any desired combinations of such luminescent materials, can be employed in accordance with the present inventive subject matter.

In some embodiments that include a first group of solid state light emitters, a second group of solid state light emitters and at least a first luminescent material, the solid state light emitters in the first group of solid state light emitters, the solid state light emitters in the second group of solid state light emitters and the first luminescent material are selected, oriented and proportioned as described in U.S. Pat. No. 7,213,940, issued on May 8, 2007, the entirety of which is hereby incorporated by reference as if set forth in its entirety, so as to provide light output that is perceived as white (or near white) with high efficacy and high CRI Ra.

In some embodiments of the present inventive subject matter, including some embodiments that include or do not include any of the features as discussed herein, a combination of (1) light exiting the lighting device which was emitted by the at least one light source, and (2) light exiting the lighting device which was emitted by the first group of solid state light emitters would have x, y coordinates on a 1931 CIE Chromaticity Diagram which define a point which is within five MacAdam ellipses, in some cases within three MacAdam ellipses, of at least one point on the blackbody locus on a 1931 CIE Chromaticity Diagram In some embodiments according to the present inventive subject matter, including some embodiments that include or do not include any of the features as discussed herein, a combination of (1) light exiting the lighting device which was emitted by the at least one light source, and (2) light exiting the lighting device which was emitted by the first group of solid state light emitters has a correlated color temperature of not greater than 5000 K (and in some embodiments, not greater than 3500 K).

In some embodiments of the present inventive subject matter, including some embodiments that include or do not include any of the features as discussed herein, a combination of (1) light exiting the lighting device which was emitted by the at least one light source, and (2) light exiting the lighting device which was emitted by the first group of solid state light emitters would have a CRI Ra of at least 80, in some cases at least 83, in some cases at least 85, in some cases at least 90, and in some cases at least 92.

In some embodiments according to the present inventive subject matter, including some embodiments that include or do not include any of the features as discussed herein, the lighting device has an efficacy of at least 25 lumens per watt, in some cases at least 50 lumens per watt, in some cases at least 60 lumens per watt, in some cases at least 70 lumens per watt, and in some cases at least 80 lumens per watt.

In some embodiments according to the present inventive subject matter, including some embodiments that include or do not include any of the features as discussed herein, a combination of (1) light exiting the lighting device which was emitted by the at least one light source, and (2) light exiting the lighting device which was emitted by the first group of solid state light emitters has a CRI of at least 70 and the lighting device has a wall plug efficiency of at least 70 lumens per watt.

In general, light of any combination and number of colors can be mixed in lighting devices according to the present inventive subject matter. Representative examples of blends of light colors, including blends which provide light within any of the first, second, third, fourth, fifth, sixth and/or seventh areas on the 1931 CIE Chromaticity Diagram, are described in:

U.S. patent application Ser. No. 11/613,714, filed Dec. 20, 2006 (now U.S. Patent Publication No. 2007/0139920), the entirety of which is hereby incorporated by reference as if set forth in its entirety;

U.S. patent application Ser. No. 11/613,733, filed Dec. 20, 2006 (now U.S. Patent Publication No. 2007/0137074), the entirety of which is hereby incorporated by reference as if set forth in its entirety;

U.S. patent application Ser. No. 11/736,761, filed Apr. 18, 2007 (now U.S. Patent Publication No. 2007/0278934), the entirety of which is hereby incorporated by reference as if set forth in its entirety;

U.S. patent application Ser. No. 11/736,799, filed Apr. 18, 2007 (now U.S. Patent Publication No. 2007/0267983), the entirety of which is hereby incorporated by reference as if set forth in its entirety;

U.S. patent application Ser. No. 11/737,321, filed Apr. 19, 2007 (now U.S. Patent Publication No. 2007/0278503), the entirety of which is hereby incorporated by reference as if set forth in its entirety;

U.S. patent application Ser. No. 11/936,163, filed Nov. 7, 2007 (now U.S. Patent Publication No. 2008/0106895), the entirety of which is hereby incorporated by reference as if set forth in its entirety;

U.S. patent application Ser. No. 12/117,122, filed May 8, 2008 (now U.S. Patent Publication No. 2008/0304260), the entirety of which is hereby incorporated by reference as if set forth in its entirety;

U.S. patent application Ser. No. 12/117,131, filed May 8, 2008 (now U.S. Patent Publication No. 2008/0278940), the entirety of which is hereby incorporated by reference as if set forth in its entirety;

U.S. patent application Ser. No. 12/117,136, filed May 8, 2008 (now U.S. Patent Publication No. 2008/0278928), the entirety of which is hereby incorporated by reference as if set forth in its entirety;

U.S. Pat. No. 7,213,940, issued on May 8, 2007, the entirety of which is hereby incorporated by reference as if set forth in its entirety;

U.S. Patent Application No. 60/868,134, filed on Dec. 1, 2006, entitled "LIGHTING DEVICE AND LIGHTING METHOD" (inventors: Antony Paul van de Ven and Gerald H. Negley), the entirety of which is hereby incorporated by reference as if set forth in its entirety;

U.S. patent application Ser. No. 11/948,021, filed on Nov. 30, 2007 (now U.S. Patent Publication No. 2008/0130285), the entirety of which is hereby incorporated by reference as if set forth in its entirety;

U.S. patent application Ser. No. 12/248,220, filed on Oct. 9, 2008 (now U.S. Patent Publication No. 2009/0184616), the entirety of which is hereby incorporated by reference as if set forth in its entirety;

U.S. patent application Ser. No. 11/951,626, filed Dec. 6, 2007 (now U.S. Patent Publication No. 2008/0136313), the entirety of which is hereby incorporated by reference as if set forth in its entirety;

U.S. patent application Ser. No. 12/035,604, filed on Feb. 22, 2008 (now U.S. Patent Publication No. 2008/0259589), the entirety of which is hereby incorporated by reference as if set forth in its entirety;

U.S. patent application Ser. No. 12/117,148, filed May 8, 2008 (now U.S. Patent Publication No. 2008/0304261), the entirety of which is hereby incorporated by reference as if set forth in its entirety; and U.S. Patent Application No. 60/990,435, filed on Nov. 27, 2007, entitled "WARM WHITE ILLUMINATION WITH HIGH CRI AND HIGH EFFICACY" (inventors: Antony Paul van de Ven and Gerald H. Negley), the entirety of which is hereby incorporated by reference as if set forth in its entirety.

In some embodiments of the present inventive subject matter, including some embodiments that include or do not include any of the features as discussed herein, a set of parallel solid state light emitter strings (i.e., two or more strings of solid state light emitters arranged in parallel with each other) is arranged in series with a power line, such that current is supplied through the power line to each of the respective strings of solid state light emitter. The expression "string", as used herein, means that at least two solid state light emitters are electrically connected in series. In some such embodiments, the relative quantities of solid state light emitters in the respective strings differ from one string to the next, e.g., a first string contains a first percentage of 400 nm to 480 nm solid state light emitters and a second string contains a second percentage (different from the first percentage) of 400 nm to 480 nm solid state light emitters. As a representative example, first and second strings each contain solely (i.e., 100%) 400 nm to 480 nm solid state light emitters, and a third string contains 50% 400 nm to 480 nm solid state light emitters and 50% 600 nm to 630 nm solid state light emitters (each of the three strings being electrically connected in parallel to each other and in series with a common power line). By doing so, it is possible to easily adjust the relative intensities of the light of the respective wavelengths, and thereby effectively navigate within the CIE Diagram and/or compensate for other changes. For example, the intensity of red light can be increased, when necessary, in order to compensate for any reduction of the intensity of the light generated by the 600 nm to 630 nm solid state light emitters. Thus, for instance, in the representative example described above, by increasing or decreasing the current supplied to the third power line, and/or by increasing or decreasing the current supplied to the first power line and/or the second power line (and/or by intermittently interrupting the supply of power to the first power line or the second power line), the x, y coordinates of the mixture of light emitted from the lighting device can be appropriately adjusted.

Some embodiments of the present inventive subject matter comprise at least a first power line and a second group of solid state light emitters. In some of such embodiments, including some embodiments that include or do not include any of the features as discussed herein, the lighting device comprises at least a first set of parallel LED strings (the arrangement of strings are being referred to herein as being "parallel", even though different voltages and/or currents can be applied to the respective strings), the first set of parallel LED strings comprising at least a first LED string and a second LED string, the first set of parallel LED strings being arranged in series relative to the first power line, and a first ratio differs from a second ratio, the first ratio being equal to (1) a number of LEDs in the second group of solid state light emitters and in the first LED string, divided by (2) a number of LEDs in the first group of solid state light emitters and in the first LED string;

the second ratio being equal to (3) a number of LEDs in the second group of solid state light emitters and in the second LED string, divided by (4) a number of LEDs in the first group of solid state light emitters and in the second LED string.

In some embodiments according to the present inventive subject matter, including some embodiments that include or do not include any of the features as discussed herein:

at least a first of the at least one light source comprises at least a second light emitter, the lighting device comprises at least a first light emitter string and a second light emitter string (the expression "string", as used herein, means that at least two solid state light emitters are electrically connected in series), the first light emitter string and the second light emitter string being electrically arranged in parallel (again, the arrangement of strings are being referred to herein as being "parallel", even though different voltages and/or currents can be applied to the respective strings), the first light emitter string comprises a plurality of first string light emitters, a first string ratio being defined as a quantity of the first string light emitters which emit light of a first color divided by a quantity of the first string light emitters which emit light of a second color, the second light emitter string comprises a plurality of second string light emitters, a second string ratio being defined as a quantity of the second string light emitters which emit light of the first color divided by a quantity of the second string light emitters which emit light of the second color, the first solid state light emitter emits light of the first color, and the second light emitter emits light of the second color.

In some of such embodiments:

the lighting device further comprises at least one current adjuster directly or switchably electrically connected to at least one of the first and second light emitter strings, and the current adjuster, when adjusted, adjusts the current supplied to at least one of the first and second light emitter strings, and/or:

the first solid state light emitter comprises a first light emitting diode and the second light emitter comprises a second light emitting diode.

In some embodiments of the present inventive subject matter, a set of parallel (again, the arrangement of strings are being referred to herein as being "parallel", even though different voltages and/or currents can be applied to the respective strings) solid state light emitter strings (i.e., two or more strings of solid state light emitters arranged in parallel with each other) and current is supplied to each of the respective strings of solid state light emitters. Again, the expression "string", as used herein, means that at least two solid state light emitters are electrically connected in series. In some such embodiments, the relative quantities of solid state light emitters in the respective strings differ from one string to the next, e.g., a first string contains a first percentage of solid state light emitters which emit light having wavelength in a first range (with the remainder being solid state light emitters which emit light having wavelength in one or more other wavelength ranges) and a second string contains a second percentage (different from the first percentage) of such solid state light emitters. By doing so, it is possible to easily adjust the relative intensities of the light of the respective wavelengths, and thereby effectively navigate within the CIE Diagram and/or compensate for other changes and/or adjust color temperature. Representative examples of such string arrangements are described in:

U.S. patent application Ser. No. 12/117,122, filed May 8, 2008 (now U.S. Patent Publication No. 2008/0304260), the entirety of which is hereby incorporated by reference as if set forth in its entirety;

U.S. patent application Ser. No. 12/117,131, filed May 8, 2008 (now U.S. Patent Publication No. 2008/0278940), the entirety of which is hereby incorporated by reference as if set forth in its entirety;

U.S. patent application Ser. No. 12/117,136, filed May 8, 2008 (now U.S. Patent Publication No. 2008/0278928), the entirety of which is hereby incorporated by reference as if set forth in its entirety;

U.S. Pat. No. 7,213,940, issued on May 8, 2007, the entirety of which is hereby incorporated by reference as if set forth in its entirety;

U.S. patent application Ser. No. 11/948,021, filed on Nov. 30, 2007 (now U.S. Patent Publication No. 2008/0130285), the entirety of which is hereby incorporated by reference as if set forth in its entirety;

U.S. patent application Ser. No. 12/117,148, filed May 8, 2008 (now U.S. Patent Publication No. 2008/0304261), the entirety of which is hereby incorporated by reference as if set forth in its entirety;

U.S. patent application Ser. No. 12/117,271, filed May 8, 2008 (now U.S. Patent Publication No. 2008/0310154), the entirety of which is hereby incorporated by reference as if set forth in its entirety;

U.S. patent application Ser. No. 12/117,280, filed May 8, 2008 (now U.S. Patent Publication No. 2008/0309255), the entirety of which is hereby incorporated by reference as if set forth in its entirety; and U.S. patent application Ser. No. 12/257,804, filed on Oct. 24, 2008 (now U.S. Patent Publication No. 2009/0160363), the entirety of which is hereby incorporated by reference as if set forth in its entirety.

Some embodiments in accordance with the present inventive subject matter employ at least one current adjuster that adjusts the current supplied to one or more other components, e.g., one or more strings of solid state light emitters. In such embodiments, the current adjuster, when adjusted, adjusts the current supplied to such component(s). For example, in some embodiments, a current adjuster is directly or switchably electrically connected to at least one string of solid state light emitters, and in other embodiments, a plurality of current adjusters are each directly or switchably electrically connected to a respective string of solid state light emitters (or strings of solid state light emitters).

Persons of skill in the art are familiar with, and have ready access to, a variety of current adjusters, and any of such current adjusters can be employed in embodiments in accordance with the present inventive subject matter.

In some embodiments of the present inventive subject matter, there are further provided one or more current adjusters directly or switchably electrically connected to one or more of respective strings of solid state light emitters, whereby the current adjuster can be adjusted to adjust the current supplied to one or more of the respective strings of solid state light emitters. In some of such embodiments, the current adjuster is automatically adjusted to maintain the mixture of light within a specific desired region, e.g., within ten MacAdam ellipses (or five MacAdam ellipses, or three MacAdam ellipses) of at least one point on the blackbody locus, on a 1931 CIE Chromaticity Diagram.

In some embodiments of the present inventive subject matter, there are further provided one or more switches electrically connected to one or more of the respective strings, whereby the switch selectively switches on and off current to the solid state light emitter(s) on the respective string.

In some embodiments of the present inventive subject matter, one or more current adjusters and/or one or more switches automatically interrupt and/or adjust current passing through one or more respective strings in response to a detected change in the output from the lighting device (e.g., an extent of deviation from the blackbody locus), a detected change in temperature (e.g., in the lighting device or ambient) or in accordance with a desired pattern (e.g., based on the time of day or night, such as altering the correlated color temperature of the combined emitted light).

Some embodiments in accordance with the present inventive subject matter can employ at least one temperature sensor. Persons of skill in the art are familiar with, and have ready access to, a variety of temperature sensors (e.g., thermistors), and any of such temperature sensors can be employed in embodiments in accordance with the present inventive subject matter. Temperature sensors can be used for a variety of purposes, e.g., to provide feedback information to current adjusters, as described in U.S. patent application Ser. No. 12/117,280, filed May 8, 2008 (now U.S. Patent Publication No. 2008/0309255), the entirety of which is hereby incorporated by reference as if set forth in its entirety.

In some embodiments of the present inventive subject matter, there are further provided one or more thermistors which detect temperature and, as temperature changes, cause one or more current adjusters and/or one or more switches to automatically interrupt and/or adjust current passing through one or more respective strings in order to compensate for such temperature change. In general, 600 nm to 630 nm light emitting diodes get dimmer as their temperature increases—in such embodiments, fluctuations in intensity caused by such temperature variation can be compensated for.

In some embodiments according to the present inventive subject matter, including some embodiments that include or do not include any of the features as discussed above, the lighting device further comprises circuitry which delivers current from at least one energy source to at least one of the light source and at least one of the first group of solid state light emitters, or the method further comprises supplying current from at least one energy source to illuminate the light source and the first group of solid state light emitters.

In some lighting devices according to the present inventive subject matter, there are further included one or more circuitry components, e.g., drive electronics for supplying and controlling current passed through at least one of the one or more solid state light emitters in the lighting device. Persons of skill in the art are familiar with a wide variety of ways to supply and control the current passed through light emitters, e.g., solid state light emitters, and any such ways can be employed in the devices of the present inventive subject matter. For example, such circuitry can include at least one contact, at least one leadframe, at least one current regulator, at least one power control, at least one voltage control, at least one boost, at least one capacitor and/or at least one bridge rectifier, persons of skill in the art being familiar with such components and being readily able to design appropriate circuitry to meet whatever current flow characteristics are desired. For example, circuitry which may be used in practicing the present inventive subject matter is described in:

(1) U.S. patent application Ser. No. 11/613,692, filed Dec. 20, 2006 (now U.S. Patent Publication No. 2007/0139923), the entirety of which is hereby incorporated by reference as if set forth in its entirety;

(2) U.S. patent application Ser. No. 11/743,754, filed May 3, 2007 (now U.S. Patent Publication No. 2007/0263393), the entirety of which is hereby incorporated by reference as if set forth in its entirety;

(3) U.S. patent application Ser. No. 11/626,483, filed Jan. 24, 2007 (now U.S. Patent Publication No. 2007/0171145), the entirety of which is hereby incorporated by reference as if set forth in its entirety;

(4) U.S. patent application Ser. No. 11/755,162, filed May 30, 2007 (now U.S. Patent Publication No. 2007/0279440), the entirety of which is hereby incorporated by reference as if set forth in its entirety;

(5) U.S. patent application Ser. No. 11/854,744, filed Sep. 13, 2007 (now U.S. Patent Publication No. 2008/0088248), the entirety of which is hereby incorporated by reference as if set forth in its entirety.

In addition, persons of skill in the art are familiar with a wide variety of mounting structures for many different types of lighting, and any such structures can be used according to the present inventive subject matter.

Some embodiments in accordance with the present inventive subject matter employ one or more enclosing structures that surround the at least one light source and the first group of solid state light emitters, and/or one or more reflective element, and/or one or more housings. In addition, the present inventive subject matter provides fixtures that comprise one or more lighting devices in accordance with the present inventive subject matter, and methods in which the at least one light source and the first group of solid state light emitters are part of such a light fixture.

Persons of skill in the art are familiar with, and can readily envision, and have ready access to, a variety of enclosing structures, and any of such enclosing structures can be employed in embodiments in accordance with the present inventive subject matter.

Persons of skill in the art are familiar with, and can readily envision, and have ready access to, a variety of reflective elements, and any of such reflective elements can be employed in embodiments in accordance with the present inventive subject matter. Persons of skill in the art are familiar with, and can readily obtain, a wide variety of reflective materials for use in such reflective elements. A representative example of a suitable reflective material for such purposes is a material marketed by Furukawa (a Japanese corporation) under the trademark MCPET®.

Persons of skill in the art are familiar with, and can envision, a wide variety of materials out of which a housing can be constructed, and a wide variety of shapes for such housings, and housings made of any of such materials and having any of such shapes can be employed in accordance with the present inventive subject matter. In some embodiments that include a housing, at least a portion of the internal surface of the housing is highly reflective. As noted above, persons of skill in the art are familiar with, and can readily obtain, a wide variety of reflective materials, and any of such materials can be used in making such housings.

Persons of skill in the art are familiar with, and can readily envision, and have ready access to, a variety of components that can be used in making fixtures, and any of such fixture components can be employed in embodiments of fixtures in accordance with the present inventive subject matter.

For example, fixtures, other mounting structures and complete lighting assemblies which may be used in practicing the present inventive subject matter are described in:

U.S. patent application Ser. No. 11/613,692, filed Dec. 20, 2006 (now U.S. Patent Publication No. 2007/0139923), the entirety of which is hereby incorporated by reference as if set forth in its entirety;

U.S. patent application Ser. No. 11/743,754, filed May 3, 2007 (now U.S. Patent Publication No. 2007/0263393), the entirety of which is hereby incorporated by reference as if set forth in its entirety;

U.S. patent application Ser. No. 11/755,153, filed May 30, 2007 (now U.S. Patent Publication No. 2007/0279903), the entirety of which is hereby incorporated by reference as if set forth in its entirety;

U.S. patent application Ser. No. 11/856,421, filed Sep. 17, 2007 (now U.S. Patent Publication No. 2008/0084700), the entirety of which is hereby incorporated by reference as if set forth in its entirety;

U.S. patent application Ser. No. 11/859,048, filed Sep. 21, 2007 (now U.S. Patent Publication No. 2008/0084701), the entirety of which is hereby incorporated by reference as if set forth in its entirety;

U.S. patent application Ser. No. 11/939,047, filed Nov. 13, 2007 (now U.S. Patent Publication No. 2008/0112183), the entirety of which is hereby incorporated by reference as if set forth in its entirety;

U.S. patent application Ser. No. 11/939,052, filed Nov. 13, 2007 (now U.S. Patent Publication No. 2008/0112168), the entirety of which is hereby incorporated by reference as if set forth in its entirety;

U.S. patent application Ser. No. 11/939,059, filed Nov. 13, 2007 (now U.S. Patent Publication No. 2008/0112170), the entirety of which is hereby incorporated by reference as if set forth in its entirety;

U.S. patent application Ser. No. 11/877,038, filed Oct. 23, 2007 (now U.S. Patent Publication No. 2008/0106907), the entirety of which is hereby incorporated by reference as if set forth in its entirety;

U.S. Patent Application No. 60/861,901, filed on Nov. 30, 2006, entitled "LED DOWNLIGHT WITH ACCESSORY ATTACHMENT" (inventors: Gary David Trott, Paul Kenneth Pickard and Ed Adams), the entirety of which is hereby incorporated by reference as if set forth in its entirety;

U.S. patent application Ser. No. 11/948,041, filed Nov. 30, 2007 (now U.S. Patent Publication No. 2008/0137347), the entirety of which is hereby incorporated by reference as if set forth in its entirety;

U.S. patent application Ser. No. 12/114,994, filed May 5, 2008 (now U.S. Patent Publication No. 2008/0304269), the entirety of which is hereby incorporated by reference as if set forth in its entirety;

U.S. patent application Ser. No. 12/116,341, filed May 7, 2008 (now U.S. Patent Publication No. 2008/0278952), the entirety of which is hereby incorporated by reference as if set forth in its entirety;

U.S. patent application Ser. No. 12/116,346, filed May 7, 2008 (now U.S. Patent Publication No. 2008/0278950), the entirety of which is hereby incorporated by reference as if set forth in its entirety;

U.S. patent application Ser. No. 12/116,348, filed on May 7, 2008 (now U.S. Patent Publication No. 2008/0278957), the entirety of which is hereby incorporated by reference as if set forth in its entirety;

U.S. Patent Application No. 61/108,130, filed on Oct. 24, 2008, entitled "LIGHTING DEVICE WHICH INCLUDES ONE OR MORE SOLID STATE LIGHT EMITTING DEVICE" (inventors: Antony Paul van de Ven and Gerald H. Negley), the entirety of which is hereby incorporated by reference as if set forth in its entirety;

U.S. Patent Application No. 61/108,133, filed on Oct. 24, 2008, entitled "LIGHTING DEVICE" (inventors: Gerald H. Negley and Antony Paul van de Ven), the entirety of which is hereby incorporated by reference as if set forth in its entirety; and U.S. Patent Application No. 61/108,149, filed on Oct. 24, 2008, entitled "LIGHTING DEVICE, HEAT TRANSFER STRUCTURE AND HEAT TRANSFER ELEMENT" (inventors: Antony Paul van de Ven and Gerald H. Negley), the entirety of which is hereby incorporated by reference as if set forth in its entirety.

In some embodiments according to the present inventive subject matter, including some embodiments that include or do not include any of the features as discussed herein:

the lighting device further comprises at least one reflective element; and the light source and the first group of solid state light emitters are positioned and oriented such that light emitted from the light source and light emitted from the first group of solid state light emitters exit from a remote end of the reflective element.

In some lighting devices according to the present inventive subject matter, there are further included one or more power sources, e.g., one or more batteries and/or solar cells, and/or one or more standard AC power plugs.

The sources of visible light in the lighting devices of the present inventive subject matter can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present inventive subject matter. The lighting devices of the present inventive subject matter can be electrically connected (or selectively connected) to any desired power source, persons of skill in the art being familiar with a variety of such power sources.

Representative examples of apparatuses for supplying electricity to lighting devices and power supplies for lighting devices, all of which are suitable for the lighting devices of the present inventive subject matter, are described in:

U.S. patent application Ser. No. 11/626,483, filed Jan. 24, 2007 (now U.S. Patent Publication No. 2007/0171145), the entirety of which is hereby incorporated by reference as if set forth in its entirety;

U.S. patent application Ser. No. 11/755,162, filed May 30, 2007 (now U.S. Patent Publication No. 2007/0279440), the entirety of which is hereby incorporated by reference as if set forth in its entirety;

U.S. patent application Ser. No. 11/854,744, filed Sep. 13, 2007 (now U.S. Patent Publication No. 2008/0088248), the entirety of which is hereby incorporated by reference as if set forth in its entirety;

U.S. patent application Ser. No. 12/117,280, filed May 8, 2008 (now U.S. Patent Publication No. 2008/0309255), the entirety of which is hereby incorporated by reference as if set forth in its entirety; and U.S. patent application Ser. No. 12/328,144, filed Dec. 4, 2008 (now U.S. Patent Publication No. 2009/0184666), the entirety of which is hereby incorporated by reference as if set forth in its entirety.

The lighting devices according to the present inventive subject matter can further comprise any desired electrical connector, a wide variety of which are familiar to those of skill in the art, e.g., an Edison connector (for insertion in an Edison socket), a GU-24 connector, etc.

In some embodiments according to the present inventive subject matter, the lighting device is a self-ballasted device. For example, in some embodiments, the lighting device can be directly connected to AC current (e.g., by being plugged into a wall receptacle, by being screwed into an Edison socket, by being hard-wired into a circuit, etc.). Representative examples of self-ballasted devices are described in U.S. patent application Ser. No. 11/947,392, filed on Nov. 29, 2007 (now U.S. Patent Publication No. 2008/0130298), the entirety of which is hereby incorporated by reference as if set forth in its entirety.

In some embodiments in accordance with the present inventive subject matter, some or all of the energy supplied to the at least one light source and/or the first group of solid state light emitters is supplied by one or more batteries and/or by one or more photovoltaic energy collection device (i.e., a device which includes one or more photovoltaic cells which converts energy from the sun into electrical energy).

The solid state light emitters (and any luminescent material) can be arranged in any desired pattern. In some embodiments according to the present inventive subject matter, some or all of the 600 nm to 630 nm solid state light emitters are surrounded by five or six 400 nm to 480 nm solid state light emitters (some or all of which may or may not include 555 nm to 585 nm luminescent material), e.g., the 600 nm to 630 nm solid state light emitters and the 400 nm to 480 nm solid state light emitters are arranged in generally laterally arranged rows and spaced from one another substantially evenly, each row being laterally offset from the next adjacent (in a longitudinal direction) row by half the distance between laterally adjacent solid state light emitters, with, in most locations, two 400 nm to 480 nm solid state light emitters being located between each 600 nm to 630 nm solid state light emitter and its nearest neighbor in the same row, and with the 600 nm to 630 nm solid state light emitters in each row being offset from the nearest 600 nm to 630 solid state light emitter(s) in the next adjacent (in a longitudinal direction) row by one and a half times the distance between laterally spaced adjacent solid state light emitters. Alternatively or additionally, in some embodiments according to the present inventive subject matter, some or all of the brighter solid state light emitters are placed closer to a center of the lighting device than the dimmer solid state light emitters.

The devices according to the present inventive subject matter can further comprise one or more long-life cooling device (e.g., a fan with an extremely high lifetime). Such long-life cooling device(s) can comprise piezoelectric or magnetorestrictive materials (e.g., MR, GMR, and/or HMR materials) that move air as a "Chinese fan". In cooling the devices according to the present inventive subject matter, typically only enough air to break the boundary layer is required to induce temperature drops of 10 to 15 degrees C. Hence, in such cases, strong "breezes" or a large fluid flow rate (large CFM) are typically not required (thereby avoiding the need for conventional fans).

The devices according to the present inventive subject matter can further comprise secondary optics to further change the projected nature of the emitted light. Such secondary optics are well-known to those skilled in the art, and so they do not need to be described in detail herein—any such secondary optics can, if desired, be employed.

The devices according to the present inventive subject matter can further comprise sensors or charging devices or cameras, etc. For example, persons of skill in the art are familiar with, and have ready access to, devices which detect one or more occurrence (e.g., motion detectors, which detect motion of an object or person), and which, in response to such detection, trigger illumination of a light, activation of a security camera, etc. As a representative example, a device according to the present inventive subject matter can include a lighting device according to the present inventive subject matter and a motion sensor, and can be constructed such that (1) while the light is illuminated, if the motion sensor detects movement, a security camera is activated to record visual data at or around the location of the detected motion, or (2) if the motion sensor detects movement, the light is illuminated to light the region near the location of the detected motion and the security camera is activated to record visual data at or around the location of the detected motion, etc.

In some embodiments according to the present inventive subject matter, including some embodiments that include or do not include any of the features as discussed herein, the lighting device further comprises at least one additional white solid state light emitter, i.e., a device that emits light which is perceived as white or near white (e.g., a packaged LED which contains at least one light emitting diode chip and at least one luminescent material, e.g., included in a lumiphor, which, when illuminated and/or excited, emits a combination of light that is perceived as white or near white, such as a packaged LED which consists of a blue light emitting diode chip and a yellow lumiphor), in which the one or more additional white solid state light emitter lamps each emit a combination of light which has x, y color coordinates which define a point which is outside the first area on a 1931 CIE Chromaticity Diagram as defined above.

The present inventive subject matter further relates to an illuminated enclosure (the volume of which can be illuminated uniformly or non-uniformly), comprising an enclosed space and at least one lighting device corresponding to any embodiment of a lighting device according to the present inventive subject matter as described herein, wherein the lighting device illuminates at least a portion of the enclosed space (uniformly or non-uniformly).

As noted above, some embodiments of the present inventive subject matter comprise at least a first power line, and some embodiments of the present inventive subject matter are directed to a structure comprising a surface and at least one lighting device corresponding to any embodiment of a lighting device according to the present inventive subject matter as described herein, wherein if current is supplied to the first power line, and/or if at least one solid state light emitter in the lighting device is illuminated, the lighting device would illuminate at least a portion of the surface.

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device corresponding to any embodiment of a lighting device according to the present inventive subject matter as described herein.

Embodiments in accordance with the present inventive subject matter are described herein in detail in order to provide exact features of representative embodiments that are within the overall scope of the present inventive subject matter. The present inventive subject matter should be understood to be not limited to such detail.

Embodiments in accordance with the present inventive subject matter are also described with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

FIG. 1 depicts a first embodiment of a lighting device in accordance with the present inventive subject matter.

Referring to FIG. 1, there is shown a lighting device 10 that includes a heat spreading element 11 (formed of aluminum), electrically insulating regions 12 (comprising any desired material which is thermally conductive and not electrically conductive, a wide variety of which are well-known to those skilled in the art, e.g., ceramic, epoxy or silicone optionally filled with silicon carbide, diamond, cubic boron nitride, alumina, etc), a highly reflective surface 13 (which can be formed in situ by polishing the surface of the aluminum heat spreading element, or made of MCPET® (marketed by Furukawa, a Japanese corporation)), conductive traces 14 formed of copper, lead frames 15 formed of silver-plated copper (or silver-plated mild steel), packaged LEDs 16a, 16b (described in more detail below), a reflective cone 17 (made of MCPET®) with a diffuse light scattering surface and a diffusing element 18 (the diffusing element 18 performs a light scattering function).

The thickness of the heat spreading element 11 is, in this embodiment, about 3.0 mm.

The reflective cone 17 is, in this embodiment, about 1 mm thick.

The diffusing element 18 is, in this embodiment, about 3.0 mm thick and is made of glass or plastic with surface features.

The device depicted in FIG. 1 further includes a printed circuit board (PCB) 28 with the conductive traces 14. The PCB is about 1.6 mm thick and is FR4.

Figure 2:
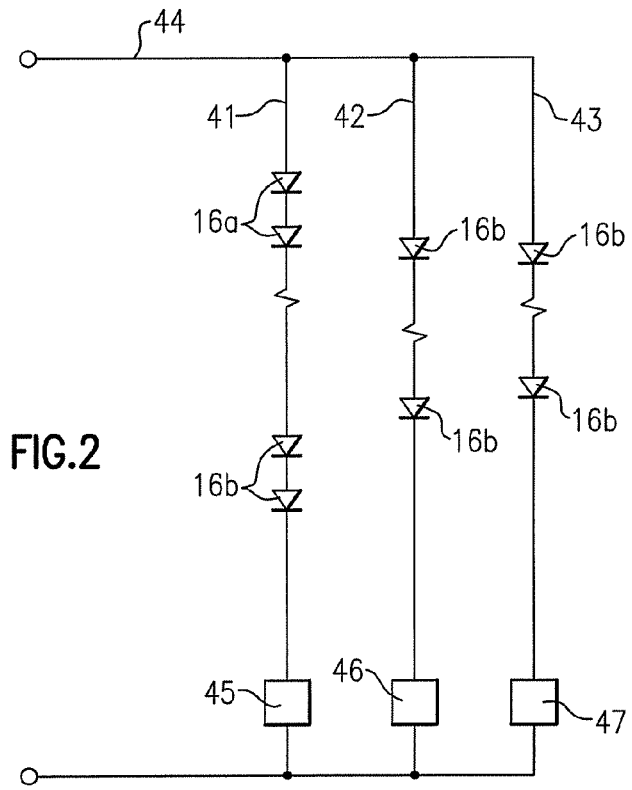
FIG. 2 is a schematic electrical diagram of a portion of the circuitry in the device depicted in FIG. 1

Referring to FIG. 2, which is a schematic electrical diagram of a portion of the circuitry in the device depicted in FIG. 1, the lighting device includes a set of strings comprising a first string 41 of LEDs, a second string 42 of LEDs and a third string 43 of LEDs arranged in parallel with one another, the set of strings being electrically connected in series with a common power line 44.

Figure 3:
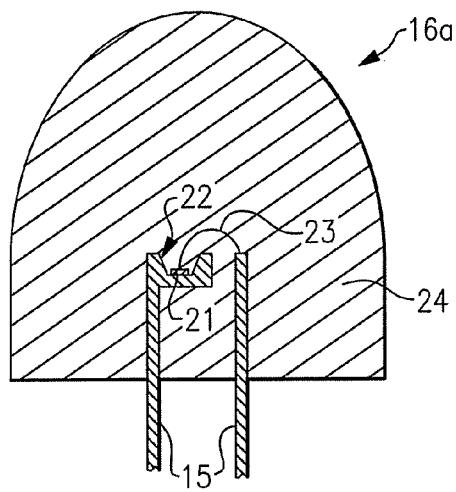
FIG. 3 is a cross-sectional view of a red/orange LED 16a in the embodiment depicted in FIG. 1.
Figure 4:
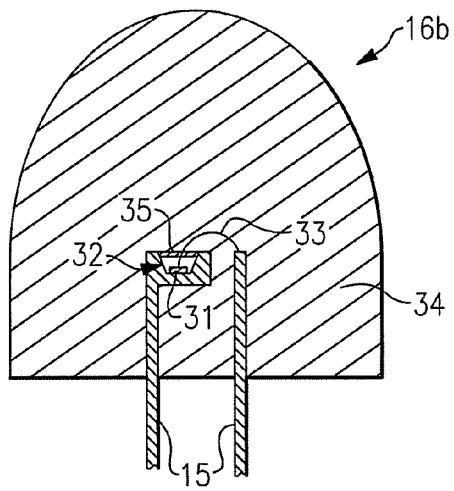
FIG. 4 is a cross-sectional view of a light source 16b in the embodiment depicted in FIG. 1.

Connected to the first string 41 of LED emitters are a current regulator 45, forty-seven red LEDs 16a (one is shown in more detail in FIG. 3—only two are depicted in FIG. 2), and twenty-one greenish-yellowish emitters 16b (each including a blue LED and a broad spectrum emitting lumiphor) (one is shown in more detail in FIG. 4—only two are depicted in FIG. 2).

Connected to the second string 42 of LED emitters are a current regulator 46, zero red LEDs and fifty-one greenish-yellowish emitters 16b (only two are depicted in FIG. 2).

Connected to the third string 43 of LED emitters are a current regulator 47, zero red LEDs and fifty-one greenish-yellowish emitters 16b (only two are depicted in FIG. 2).

The voltage drop across each of the red LEDs 16a is about 2 volts.

The voltage drop across each of the blue LEDs (in the greenish-yellowish emitters 16b) is about 3 volts.

The voltage drop across each of the current regulators is about 7 volts.

The current passing through the first string 41 of LED emitters is regulated to be about 20 milliamps.

The current passing through the second string 42 of LED emitters is regulated to be about 20 milliamps.

The current passing through the third string 43 of LED emitters is regulated to be about 20 milliamps.

The diffusing element 18 is located about two inches from the highly reflective surface 13. The diffusing element 18 is attached to a top region of the reflective cone 17. The insulating element 28 is attached to a bottom region of the reflective cone 17.

The heat spreading element 11 serves to spread out the heat, act as a heat sink, and dissipate the heat from the LEDs. Likewise, the reflective cone 17 functions as a heat sink.

Figure 5:
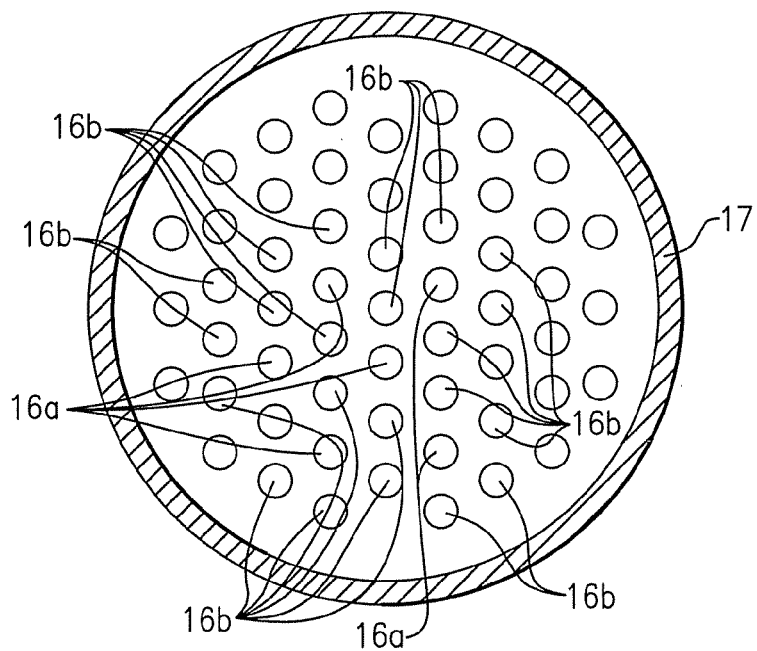
FIG. 5 is a sectional view taken along plane V-V shown in FIG. 1.

FIG. 5 is a sectional view taken along plane V-V shown in FIG. 1.

As shown in FIG. 5, each of the red LEDs 16a is surrounded by five or six greenish-yellowish emitters 16b, i.e., the red LEDs 16a and the greenish-yellowish emitters 16b are arranged in generally laterally arranged rows and spaced from one another substantially evenly, each row being laterally offset from the next adjacent (in a longitudinal direction) row by half the distance between laterally adjacent LEDs, with, in most locations, two greenish-yellowish emitters 16b being located between each red LED 16a and its nearest red LED 16a neighbor in the same row, and with the red LEDs 16a in each row being offset from the nearest red LED(s) 16a in the next adjacent (in a longitudinal direction) row by one and a half times the distance between laterally spaced adjacent LEDs. The spacing between each adjacent LED in each row is about 6 mm.

FIG. 3 is a cross-sectional view of one of the red LEDs 16a employed in the embodiment depicted in FIGS. 1 and 5.

Referring to FIG. 3, each of the red LEDs 16a includes a red light emitting diode chip 21 (from Epistar in Taiwan, measuring 14 mils×14 mils, comprising AlInGaP and having a brightness of not less than 600 mcd), a lead frame 15 having a reflective surface 22, a copper wire 23, and an encapsulant region 24. The reflective surface 22 is made of silver. The encapsulant region 24 is made of Hysol OS 4000. The red LEDs 16a are nearly saturated, i.e., they have a purity of at least 85%, the term "purity" having a well-known meaning to persons skilled in the art, and procedures for calculating purity being well-known to those of skill in the art. The red LEDs 16a can emit light having a dominant wavelength in the range of from about 612 nm to about 625 mm.

FIG. 4 is a cross-sectional view of one of the greenish-yellowish emitters 16b employed in the embodiment depicted in FIGS. 1 and 5.

Referring to FIG. 4, each of the greenish-yellowish emitters 16b includes a blue light emitting diode chip 31 (namely, it can be a Cree XT LED (C460XT290) die with a wavelength range of from about 450 μm to about 465 nm, and optical power greater than 24 mW), a lead frame 15 having a reflective surface 32, a copper wire 33, an encapsulant region 34, and a broad spectrum emitting lumiphor 35. The reflective surface 32 is made of silver. The encapsulant region 34 is made of Hysol OS400 or GE/Toshiba Invisil 5332. The lumiphor 35 comprises a luminescent material consisting of QMK58/F-U1 YAG:Ce by Phosphor Teck-UK dispersed in a binder made of Hysol OS400 or GE/Toshiba 5332. The luminescent material is loaded in the binder in an amount in the range of from about 10 to about 12 percent by weight, based on the total weight of the binder and the luminescent material. The luminescent material particles can have particle sizes in the range of from about 1.6 micrometers to about 8.6 micrometers, with the mean particle size being in the range of from about 4 micrometers to about 5 micrometers. The lumiphor 35 is spaced from the chip 31 by a distance in the range of from about 100 micrometers to about 750 micrometers (for example, from about 500 micrometers to about 750 micrometers, e.g., about 750 micrometers). The blue chip 31 emits light having a peak wavelength in the range of from about 450 μm to about 465 nm.

The combined light exiting the LED 16b (i.e., a mixture of (1) light including light emitted by the blue chip 31 which passes through the lumiphor and exits the LED 16b and (2) light emitted by the luminescent material upon being excited by light emitted from the blue chip 31 which exits the LED 16*b*), corresponds to a point on the 1931 CIE Chromaticity Diagram having x, y color coordinates which are within the first area on a 1931 CIE Chromaticity Diagram, i.e., an area enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38, specific examples including a point having x, y color coordinates of 0.3706, 0.4370 for 2850 K light, and 0.3550, 0.4089 for 3400 K light.

The combined light exiting the lighting device 10, i.e., a combination of (1) light exiting the lighting device 10 which was emitted by the first group of solid state light emitters 16*b*, (2) light exiting the lighting device 10 which was emitted by the lumiphors 35, and (3) light exiting the lighting device 10 which was emitted by the second group of solid state light emitters 16*a* corresponds to a point on a 1931 CIE Chromaticity Diagram which is within ten MacAdam ellipses of at least one point on the blackbody locus on a 1931 CIE Chromaticity Diagram.

For indoor residential illumination, a color temperature of 2700 k to 3300 k is normally preferred, and for outdoor flood lighting of colorful scenes a color temperature approximating daylight 5000K (4500–6500K) is preferred.

Figure 19:
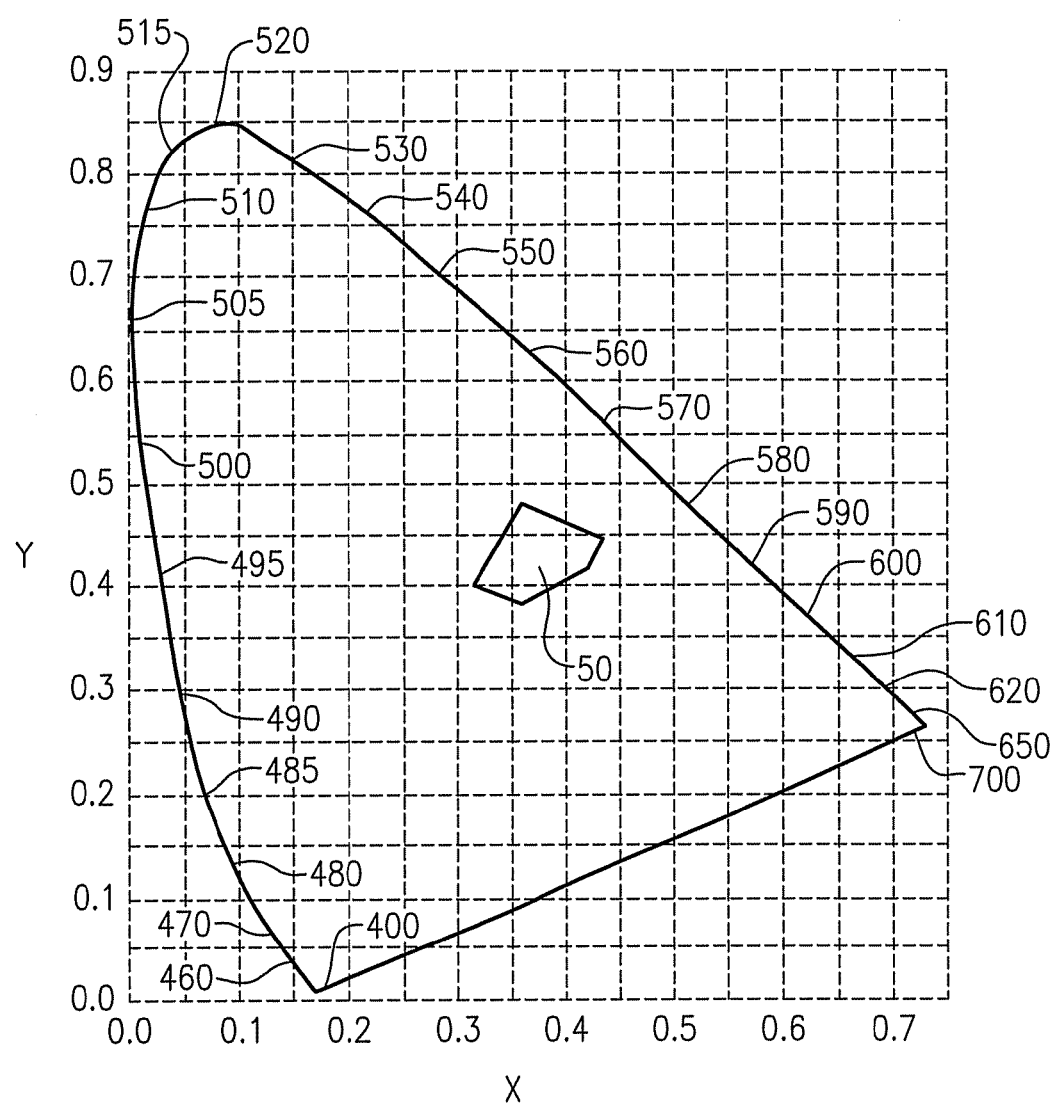
FIG. 19 depicts the first area, as defined herein, on a 1931 CIE Chromaticity Diagram.

FIG. 19 depicts the first area 50 on a 1931 CIE Chromaticity Diagram, i.e., an area enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

Figure 20:
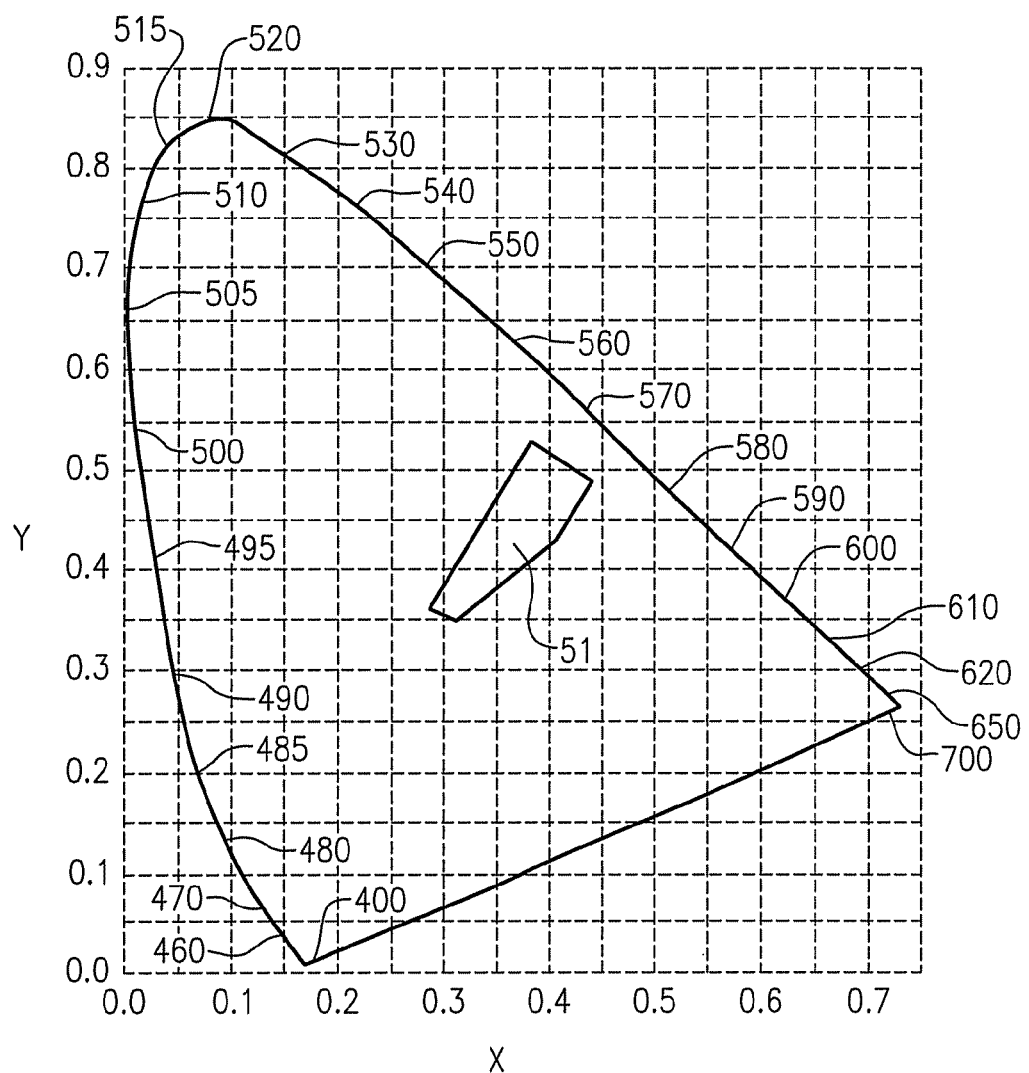
FIG. 20 depicts the second area, as defined herein, on a 1931 CIE Chromaticity Diagram.

FIG. 20 depicts the second area 51 on a 1931 CIE Chromaticity Diagram, i.e., an area enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53.

Figure 6:
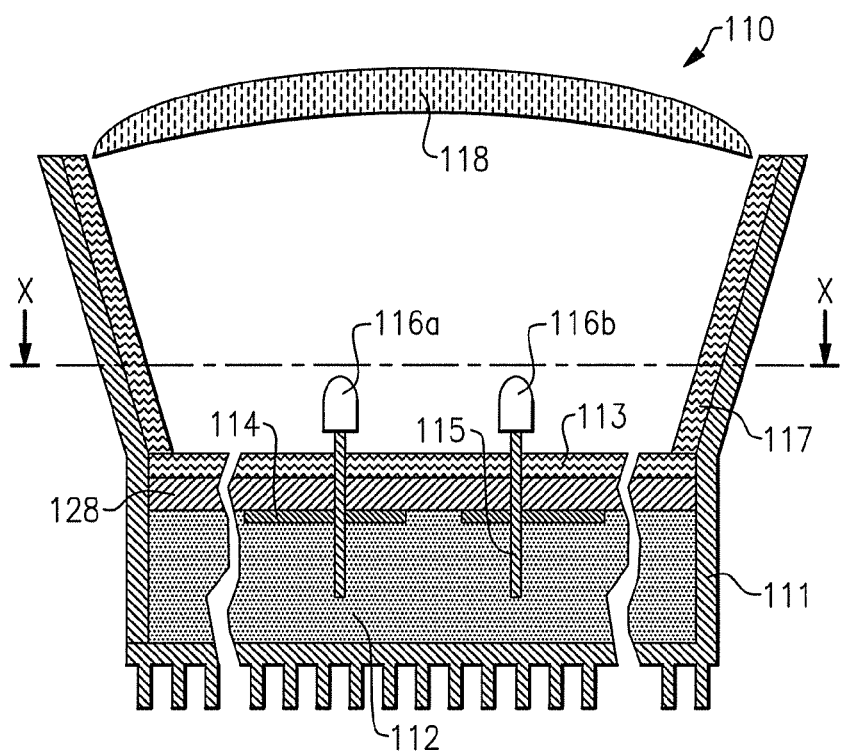
FIG. 6 depicts a second embodiment of a lighting device in accordance with the present inventive subject matter.

FIG. 6 depicts a second embodiment of a lighting device in accordance with the present inventive subject matter.

Referring to FIG. 6, there is shown a lighting device 110 which includes a heat spreading element 111 (formed of aluminum), electrically insulating regions 112 (comprising any desired material which is thermally conductive and not electrically conductive, a wide variety of which are well known to those skilled in the art, e.g., ceramic, epoxy or silicone optionally filled with silicon carbide, diamond, cubic boron nitride, alumina, etc), a highly reflective surface 113 (formed in situ by polishing the surface of the aluminum heat spreading element, or made of MCPET® (marketed by Furukawa, a Japanese corporation)), conductive traces 114 formed of copper, lead frames 115 formed of silver-plated copper (or silver-plated mild steel), packaged LEDs 116*a*, 116*b* (described in more detail below), a reflective cone 117 (made of MCPET®) with a diffuse light scattering surface and a diffusing element 118 (the diffusing element 118 performs a light scattering function).

The thickness of the heat spreading element 111 is about 3.0 mm.

The reflective cone 117 is about 1 mm thick.

The diffusing element 118 is about 3.0 mm thick and is made of glass or plastic with surface features.

The device depicted in FIG. 6 further includes a printed circuit board (PCB) 128 with the conductive traces 114. The PCB is about 1.6 mm thick and is FR4.

Figure 7:
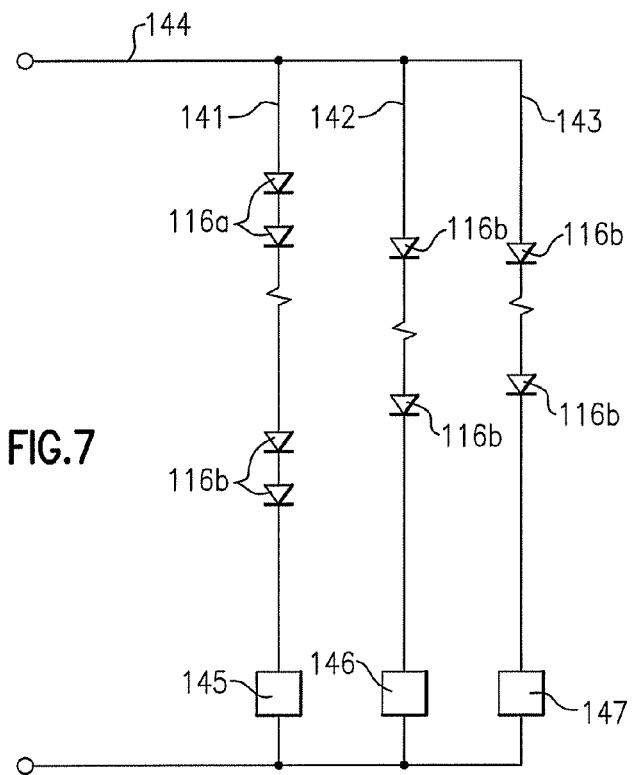
FIG. 7 is a schematic electrical diagram of a portion of the circuitry in the device depicted in FIG. 6.

Referring to FIG. 7, which is a schematic electrical diagram of a portion of the circuitry in the device depicted in FIG. 6, the lighting device includes a set of strings comprising a first string 141 of LEDs, a second string 142 of LEDs and a third string 143 of LEDs arranged in parallel with one another, the set of strings being electrically connected in series with a common power line 144.

Figure 8:
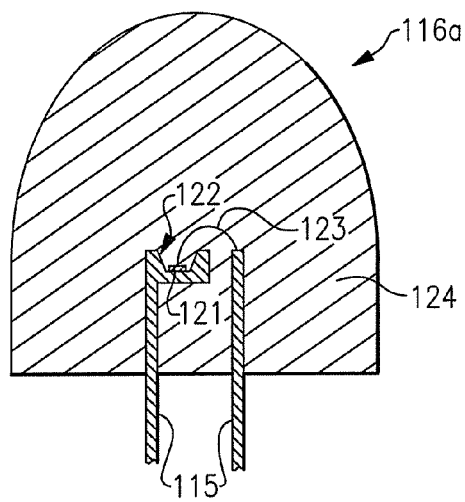
FIG. 8 is a cross-sectional view of a red/orange LED 116a in the embodiment depicted in FIG. 6.
Figure 9:
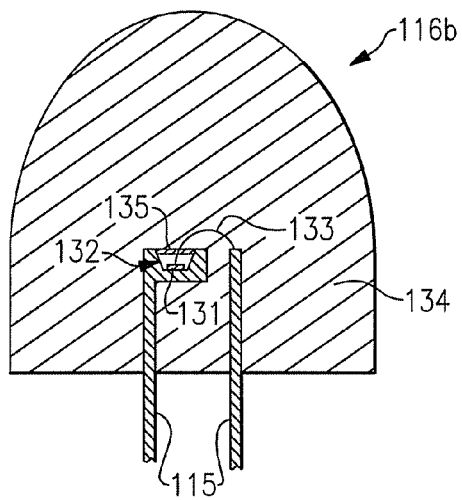
FIG. 9 is a cross-sectional view of a light source 116b in the embodiment depicted in FIG. 6.

Connected to the first string 141 of LED emitters are a current regulator 145, forty-seven red/orange LEDs 116*a* (one is shown in more detail in FIG. 8—only two are depicted in FIG. 7) that emit light having dominant emission wavelength in the range of from about 602 nm to about 615 μm, and twenty-one light sources 116*b* that emit light that has x, y color coordinates which define a point which is within the first area and/or the second area on the 1931 CIE Chromaticity Diagram as described above (each emitter 116*b* including a blue LED and a broad spectrum emitting lumiphor, i.e., an element containing luminescent material) (a light source 116*b* is shown in more detail in FIG. 9—only two are depicted in FIG. 7).

Accordingly, in this embodiment, a first string ratio of red/orange LEDs 116*a* to light sources 116*b* is 47 divided by 21, i.e., about 2.24.

Connected to the second string 142 of LED emitters are a current regulator 146, zero red/orange LEDs and fifty-one light sources 116*b* that emit light that has x, y color coordinates which define a point which is within the first area and/or the second area on the 1931 CIE Chromaticity Diagram as described above (only two are depicted in FIG. 7).

Accordingly, in this embodiment, a second string ratio of red/orange LEDs 116*a* to light sources 116*b* is 0 divided by 51, i.e., 0, which differs from the first string ratio.

Connected to the third string 143 of LED emitters are a current regulator 147, zero LEDs and fifty-one light sources 116*b* that emit light that has x, y color coordinates which define a point which is within the first area and/or the second area on the 1931 CIE Chromaticity Diagram as described above (only two are depicted in FIG. 7).

Accordingly, in this embodiment, a third string ratio of red/orange LEDs 116*a* to light sources 116*b* is 0 divided by 51, i.e., 0, which differs from the first string ratio.

The voltage drop across each of the red/orange LEDs 116*a* is about 2 volts.

The voltage drop across each of the blue LEDs (in the light sources 116*b* that emit light that has x, y color coordinates which define a point which is within the first area and/or the second area on the 1931 CIE Chromaticity Diagram as described above) is about 3 volts.

The voltage drop across each of the current regulators is about 7 volts.

The current passing through the first string 141 of LED emitters is regulated and/or adjusted to be about 20 milliamps.

The current passing through the second string 142 of LED emitters is regulated and/or adjusted to be about 20 milliamps.

The current passing through the third string 143 of LED emitters is regulated and/or adjusted to be about 20 milliamps.

The diffusing element 118 is located about two inches from the highly reflective surface 113. The diffusing element 118 is attached to a top region of the reflective cone 117. The insulating element 128 is attached to a bottom region of the reflective cone 117. A mixture of light emitted from the light sources 116b and from the LEDs 116a exits from a remote end of the reflective cone 117, i.e., through the diffusing element 118.

The heat spreading element 111 serves to spread out the heat, act as a heat sink, and dissipate the heat from the LEDs. Likewise, the reflective cone 117 functions as a heat sink.

Figure 10:
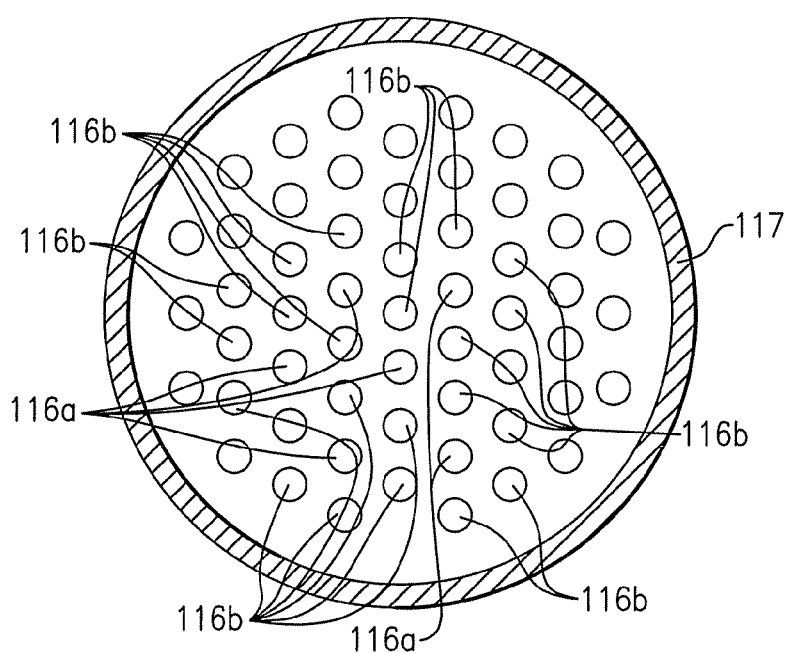
FIG. 10 is a sectional view taken along plane X-X shown in FIG. 6.

FIG. 10 is a sectional view taken along plane X-X shown in FIG. 6.

As shown in FIG. 10, each of the red/orange LEDs 116a is surrounded by five or six light sources 116b, i.e., the red/orange LEDs 116a and the light sources 116b are arranged in generally laterally arranged rows and spaced from one another substantially evenly, each row being laterally offset from the next adjacent (in a longitudinal direction) row by half the distance between laterally adjacent LEDs, with, in most locations, two light sources 116b being located between each red/orange LED 116a and its nearest red/orange LED 116a neighbor in the same row, and with the red/orange LEDs 116a in each row being offset from the nearest red/orange LED(s) 116a in the next adjacent (in a longitudinal direction) row by one and a half times the distance between laterally spaced adjacent LEDs. The spacing between each adjacent LED in each row is about 6 mm.

FIG. 8 is a cross-sectional view of one of the red/orange LEDs 116a employed in the embodiment depicted in FIGS. 6 and 10.

Referring to FIG. 8, each of the red/orange LEDs 116a includes an red/orange light emitting diode chip 121 (from Epistar in Taiwan, measuring 14 mils×14 mils, comprising AlInGaP and having a brightness of not less than 600 mcd), a lead frame 115 having a reflective surface 122, a copper wire 123, and an encapsulant region 124. The reflective surface 122 is made of silver. The encapsulant region 124 is made of Hysol OS 4000. The red/orange LEDs 116a are nearly saturated, i.e., they have a purity of at least 85%, the term "purity" having a well known meaning to persons skilled in the art, and procedures for calculating purity being well known to those of skill in the art. The red/orange LEDs 116a can emit light having a dominant emission wavelength in the range of from about 602 nm to about 615 nm.

FIG. 9 is a cross-sectional view of one of the light sources 116b employed in the embodiment depicted in FIGS. 6 and 10.

Referring to FIG. 9, each of the light sources 116b includes a blue light emitting diode chip 131 (namely, it can be a Cree XT LED (C460XT290) die with a wavelength range of from about 450 nm to about 465 nm, and optical power greater than 24 mW), a lead frame 115 having a reflective surface 132, a copper wire 133, an encapsulant region 134, and a broad spectrum emitting lumiphor 135. The reflective surface 132 is made of silver. The encapsulant region 134 is made of Hysol OS400 or GE/Toshiba Invisil 5332. The lumiphor 135 comprises a luminescent material consisting of QMK58/F-U1 YAG:Ce by Phosphor Teck-UK dispersed in a binder made of Hysol OS400 or GE/Toshiba 5332. The luminescent material is loaded in the binder in an amount in the range of from about 10 to about 12 percent by weight, based on the total weight of the binder and the luminescent material. The luminescent material particles can have particle sizes in the range of from about 1.6 micrometers to about 8.6 micrometers, with the mean particle size being in the range of from about 4 micrometers to about 5 micrometers. The lumiphor 135 is spaced from the chip 131 by a distance in the range of from about 100 micrometers to about 750 micrometers (for example, from about 500 micrometers to about 750 micrometers, e.g., about 750 micrometers). The blue chip 131 emits light having a peak emission wavelength in the range of from about 450 nm to about 465 nm, and the luminescent material emits light having a dominant emission wavelength in the range of from about 555 nm to about 585 nm.

The combined light exiting the lighting device 110, i.e., a combination of (1) light exiting the lighting device 110 which was emitted by the light sources 116b and (2) light exiting the lighting device 110 which was emitted by the second group of solid state light emitters 116a corresponds to a point on a 1931 CIE Chromaticity Diagram which is within four MacAdam ellipses of at least one point on the blackbody locus on a 1931 CIE Chromaticity Diagram.

In an alternative embodiment, instead of the light sources 116b, the device has LEDs that emit light of a first color and LEDs that emit light of a second color, with the mixture providing light that has x, y color coordinates which define a point which is within the first area and/or the second area on the 1931 CIE Chromaticity Diagram as defined above. For example, a representative example of such an alternative embodiment comprises a lighting device in which, in place of the light sources 116b, the device has a plurality of LEDs that emit light of wavelength in the range of from about 400 nm to about 480 nm and a plurality of LEDs that emit light of wavelength in the range of from about 555 m to about 585 μm, and a mixture of light from these LEDs would, in an absence of any other light, have x, y color coordinates which define a point which is within the first area and/or the second area on the 1931 CIE Chromaticity Diagram as defined above.

Figure 11:
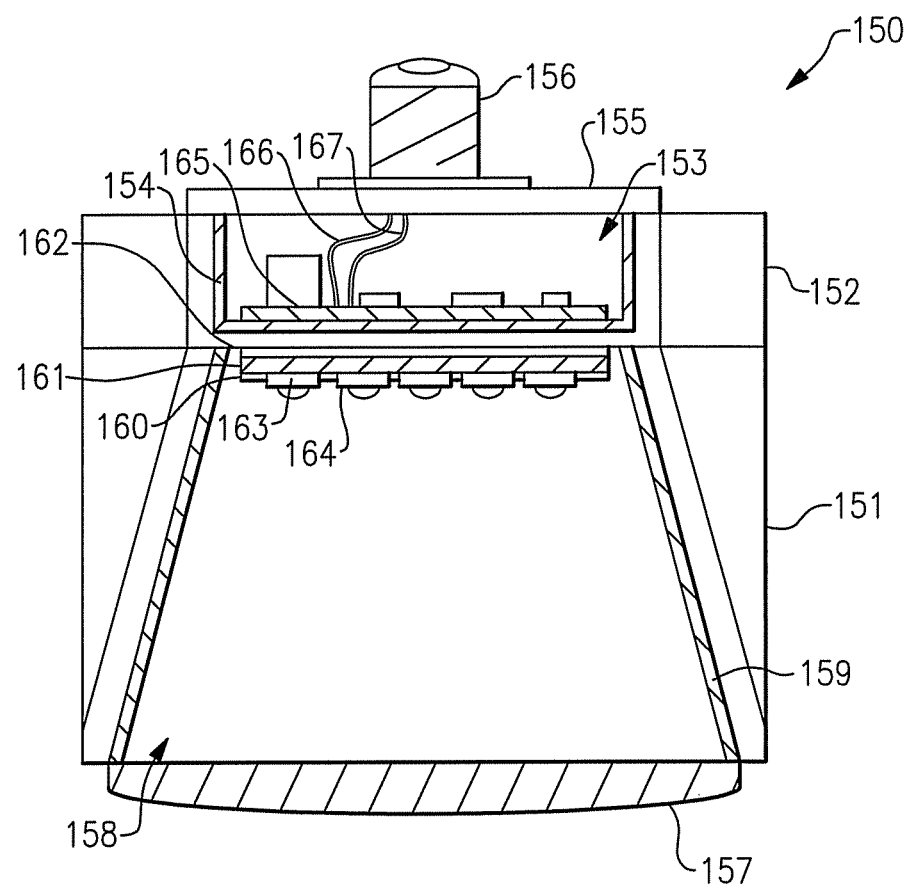
FIG. 11 is a schematic diagram of a high efficiency lamp 150 according to a second embodiment in accordance with the inventive subject matter.

FIG. 11 is a schematic diagram of a high efficiency lamp 150 according to a third embodiment in accordance with the inventive subject matter. The lamp 150 includes a lower housing 151 and an upper housing 152, light sources 163 and red/orange light emitting diodes 164. The lower housing 151 is a cast aluminum housing having fins surrounding the circumference and provides sidewalls of the mixing enclosure 158. The lower housing may be a lower housing of an LR6 fixture from Cree LED Lighting Solutions, Inc., Durham, N.C., with the trim flange removed such that the housing does not extend past the lens 157. Other suitable lower housing materials having similar thermal properties could also be utilized. The lower housing 151 and the lens 157, in combination, comprise an enclosing structure that surrounds the light sources 163 and the red/orange light emitting diodes 164.

The upper housing 152 includes a cavity 153 and also has fins to increase the overall area for heat extraction. The upper housing 152 has substantially the same configuration as the upper housing of the LR6 fixture. In the present embodiment, the upper housing 152 is made from copper.

Other suitable upper housing materials having similar thermal properties could also be utilized. For example, the upper housing could be made from aluminum or other thermally conductive material. An electrically insulating layer 154 is provided within the upper housing 152 to isolate the power supply 165 from the upper housing 152. The insulating layer 154 may, for example, be Formex. A thermal gasket (not shown) is provided between the upper housing 152 and the lower housing 151 to assure a good thermal coupling between the two housings. The thermal gasket may, for example, be Sil-Pad from The Bergquist Company.

A top plate 155 is provided on the upper housing 152 and encloses the cavity 153. A connector 156, such as an Edison type screw connector, is provided on the top plate 155 to allow connection of the lamp 150 to a power source, such as an AC line. Other connector types could be utilized and may depend on the power source to which the lamp 150 is to be connected.

A lens 157 is provided on the opening of the lower housing 151 to provide a mixing enclosure 158 having sidewalls defined by the lower housing 151 and opposing ends formed by the upper housing 152 and the lens 157. The mixing enclosure 158 is a frustoconical shape with a height of about 2.15" and with a diameter at one end of 2.91" and of 4.56" at the opposing end. The lens 157 includes optical features on the side facing the light sources that obscures the light sources and mixes the light. The lens used in the present embodiment is a lens from the LR6 fixture that is provided by RPC Photonics, Rochester, N.Y. In general, the lens 157 has a full width, half max (FWHM) of between 50° and 60°, which balances light transmission with diffusion to obscure the light sources.

The mixing enclosure 158 is lined with a highly reflective material 159, such as MCPET® from Furakawa, to reduce losses from light reflected back into the mixing enclosure 158 by the lens. The highly reflective material 159 reflects between 98% and 99% of the light across the visible spectrum. A reflective material 160 is also provided on a copper metal core circuit board 161 and may be provided on any exposed portions of the upper housing 152. The reflective material 160 can also be MCPET®, laser cut to fit around the light sources 163 and the red/orange light emitting diodes 164.

The light sources 163 are phosphor light emitting diodes. The light sources 163 emit light which has x, y color coordinates which define a point which is within the first area and/or the second area on the 1931 CIE Chromaticity Diagram as described above, and light emitting diodes 164 that emit red/orange light. In this particular embodiment, 21 phosphor converted light emitting diodes 163 and 11 red/orange light emitting diodes 164 are utilized. The phosphor converted light emitting diodes 163 are Cree X Lamps from Cree, Inc., Durham, N.C. The red/orange light emitting diodes 164 are OSRAM Golden Dragon parts to which lenses are attached to improve light extraction. In particular, an optical adhesive is used to attach lenses, such as the lenses from Cree XRE parts, to the Golden Dragons. The brightnesses of the parts are sufficiently high to achieve the desired light output and wall plug efficiency.

The light sources 163 and the red/orange light emitting diodes 164 are serially connected in a single string. This provides a high voltage string that allows for increased efficiency in driving the light sources 163 and the red/orange light emitting diodes 164. The light sources 163 have color points that are close to a line between x,y coordinates of the 1931 CIE diagram of 0.3431, 0.3642; and 0.3625, 0.3979 and light emitting diodes having color points that are close to a line between x,y coordinates of the 1931 CIE diagram of 0.3638, 0.4010; and 0.3844, 0.4400. The phosphor converted light emitting diodes have outputs that are within the range of from 108.2 lumens to 112.6 lumens at 350 mA. The red/orange light emitting diodes have a dominant emission wavelength of about 613 nm.

The light sources 163 and the red/orange light emitting diodes 164 are mounted on the circuit board 161 which is mounted with a thermal gasket material 162 to the upper housing 152. A conformal coating (not shown) of HumiSeal 1C49LV is applied to the circuit board 161. The circuit board 161 is connected to the power supply 165 through the upper housing 152.

Figure 12:
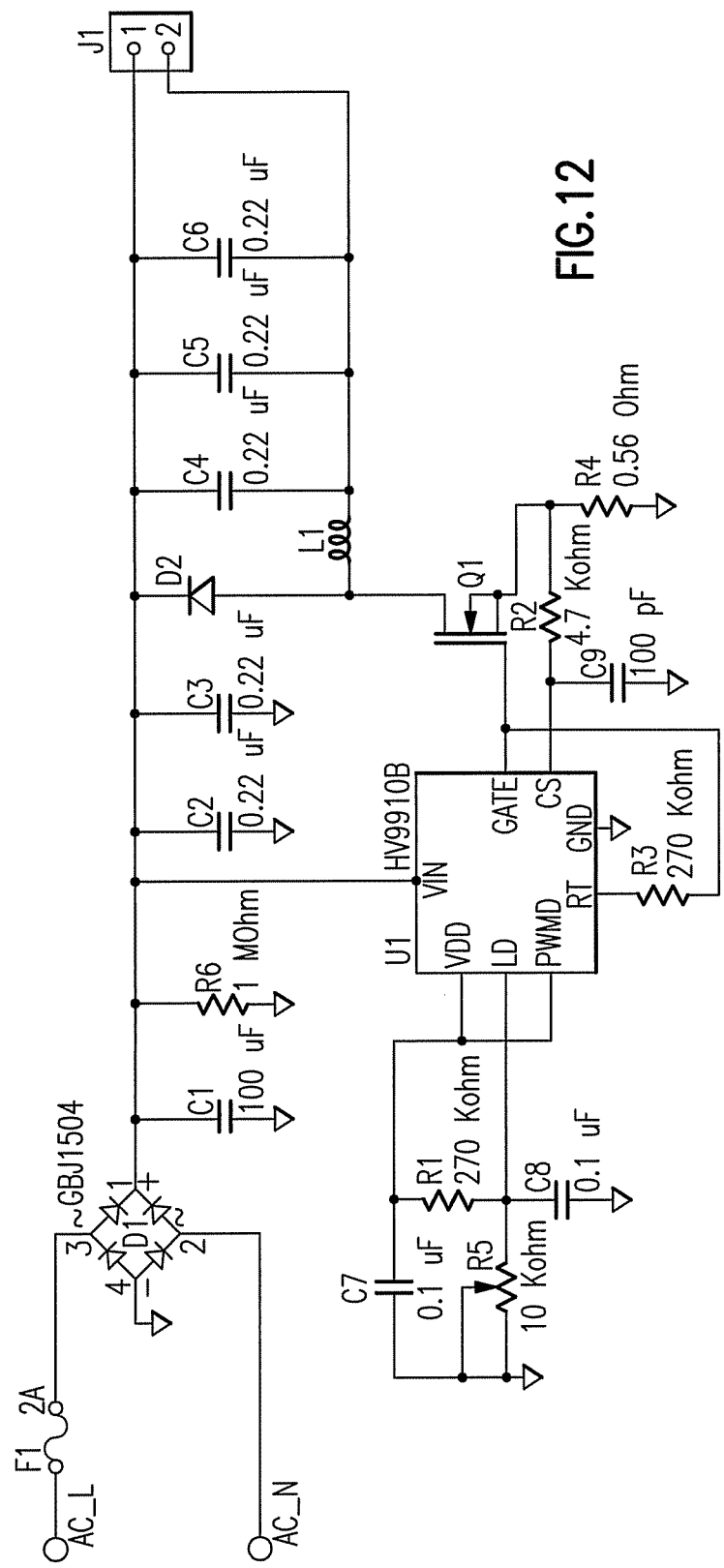
FIG. 12 is a schematic diagram of the power supply 165 shown in FIG. 11.

The power supply 165 is connected to the Edison connector 156 through wires 166 and 167. A schematic of the power supply 165 is provided in FIG. 12. In FIG. 12, the string of light sources 163 and light emitting diodes 164 is connected between pins 1 and 2 of J1. With regard to specific parts, the values in the present embodiment are provided in FIG. 12 for the majority of parts. With regard to parts without values, the diode D2 is a MURS140 from Digikey, the inductor L1 is 3.9 mH and the transistor Q1 is an NFET FQP3N30-ND from Digikey. The HV9910B is a universal high brightness LED driver from Supertex, Inc, Sunnyvale, Calif. The variable resistance R5 is provided to adjust the current through the string connected across J1.

Figure 13:
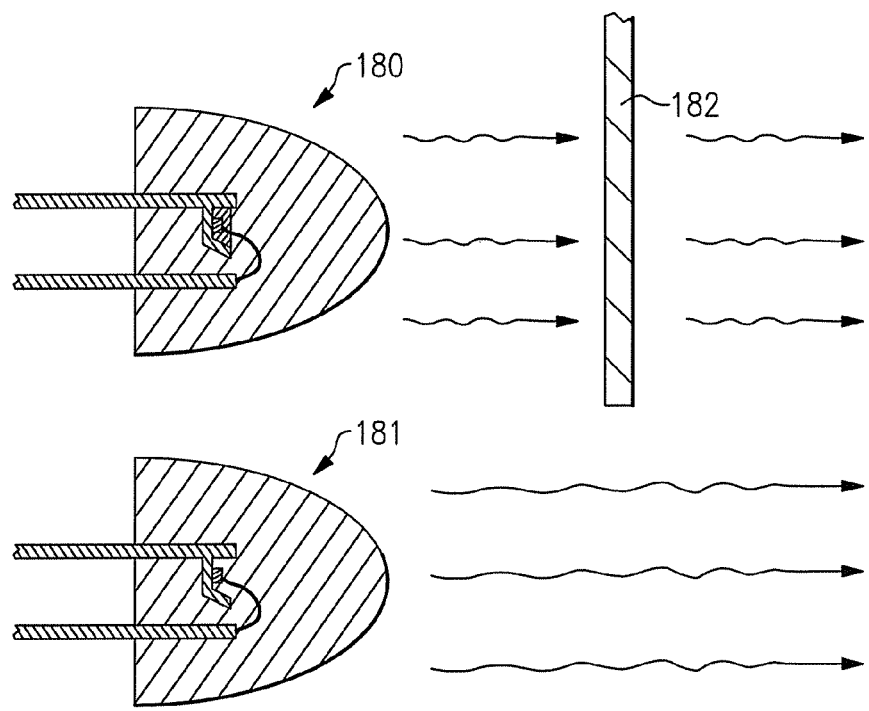
FIG. 13 is a cross-sectional view of another representative embodiment of a lighting device in accordance with the present inventive subject matter.

Another representative embodiment of a lighting device according to the present inventive subject matter is depicted in FIG. 13. Referring to FIG. 13, the lighting device comprises an LED lamp 180, an LED 181 and a filter 182. In this embodiment, the LED lamp 180 emits white light and the LED 181 emits red/orange light. The white light emitted from the LED lamp 180 passes through the filter 182 and modified light exits from the filter 182. The modified light has x, y color coordinates which define a point which is within the first area and/or the second area on the 1931 CIE Chromaticity Diagram as described above. The modified light mixes with the red/orange light from the LED 181.

Figure 14:
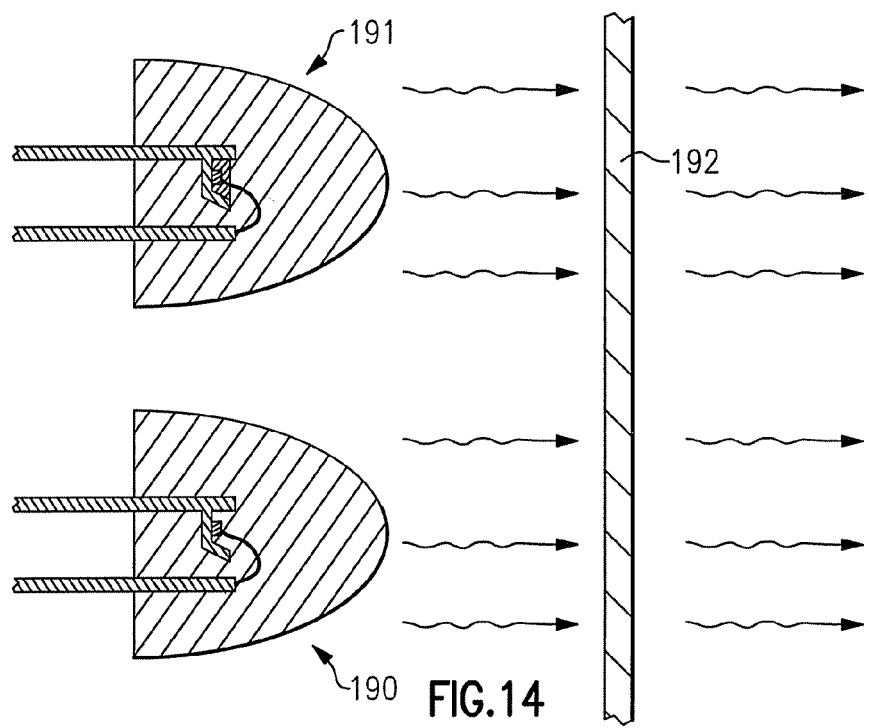
FIG. 14 is a cross-sectional view of another representative embodiment of a lighting device in accordance with the present inventive subject matter.

Another representative embodiment of a lighting device according to the present inventive subject matter is depicted in FIG. 14. Referring to FIG. 14, the lighting device comprises an LED 190, an LED lamp 191 and a pale yellow filter 192. In this embodiment, the LED 190 emits red/orange light, the LED lamp 191 emits white light, the red/orange light and the white light mix to produce pink light, the pink light passes through the filter 192, resulting in warm white light exiting the filter 192.

Figure 15:
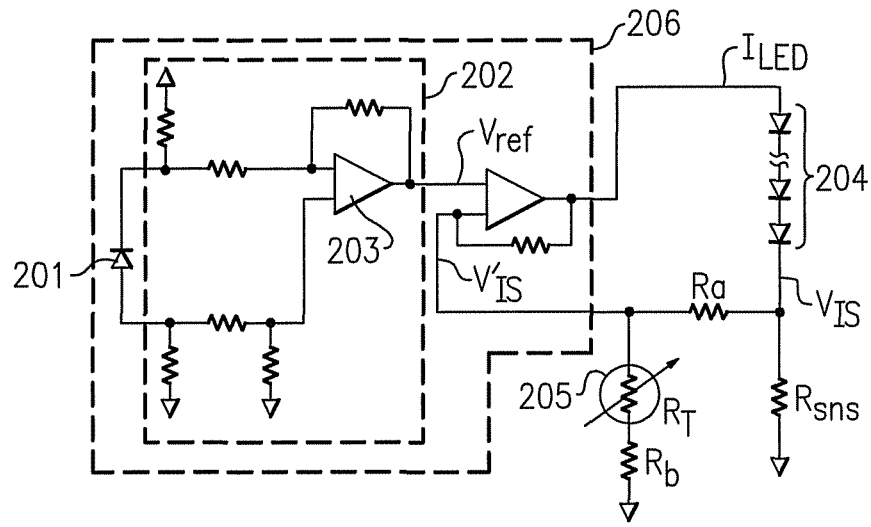
FIGS. 15 and 16 are diagrams of circuitry that can be employed in the methods and devices of the present inventive subject matter.

Another embodiment is depicted in FIG. 15, which is a diagram of a circuit which can be employed in the methods and devices of the present inventive subject matter. The circuit shown in FIG. 15 includes a sensor 201, a differential amplifier circuit 202 (which includes a comparator 203), a plurality of red/orange LEDs 204 and a thermistor 205. Features of this circuit include:

This circuit increases the red/orange LED current with increasing temperature by altering the LED sense signal as seen by the controlling element.

Figure 16:
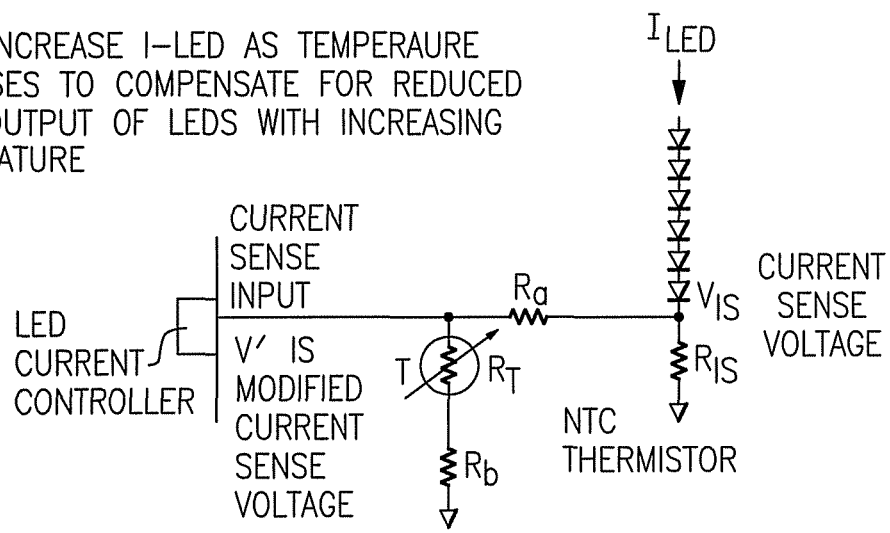

In normal operation, the controller 206 will maintain constant current by adjusting the LED current to maintain a constant voltage as seen at the current sense input (see FIG. 16). A) if $I_{LED}$ increases, $V'_{IS}$ increases, and the controller 206 will reduce current in response. B) If $I_{LED}$ decreases, $V'_{IS}$ decreases, and the controller 206 will increase current in response.

A voltage divider circuit consisting of $R_a$, $R_b$ and $R_T$ modifies the signal to the current sense input.

a) $V'_{IS} = V_{IS} \times (R_T + R_b)/(R_a + R_b + R_T)$ b) As the temperature at $R_T$ increases, voltage $V'_{IS}$ decreases, and the controller 206 will increase $I_{LED}$ in response.

c) As the temperature at $R_T$ decreases, voltage $V'_{IS}$ increases, and the controller 206 decreases LED in response.

This circuit, and other circuitry that can be employed in accordance with the present inventive subject matter, is described in U.S. patent application Ser. No. 12/117,280, filed May 8, 2008 (now U.S. Patent Publication No. 2008/0309255), the entirety of which is hereby incorporated by reference as if set forth in its entirety.

Figure 17:
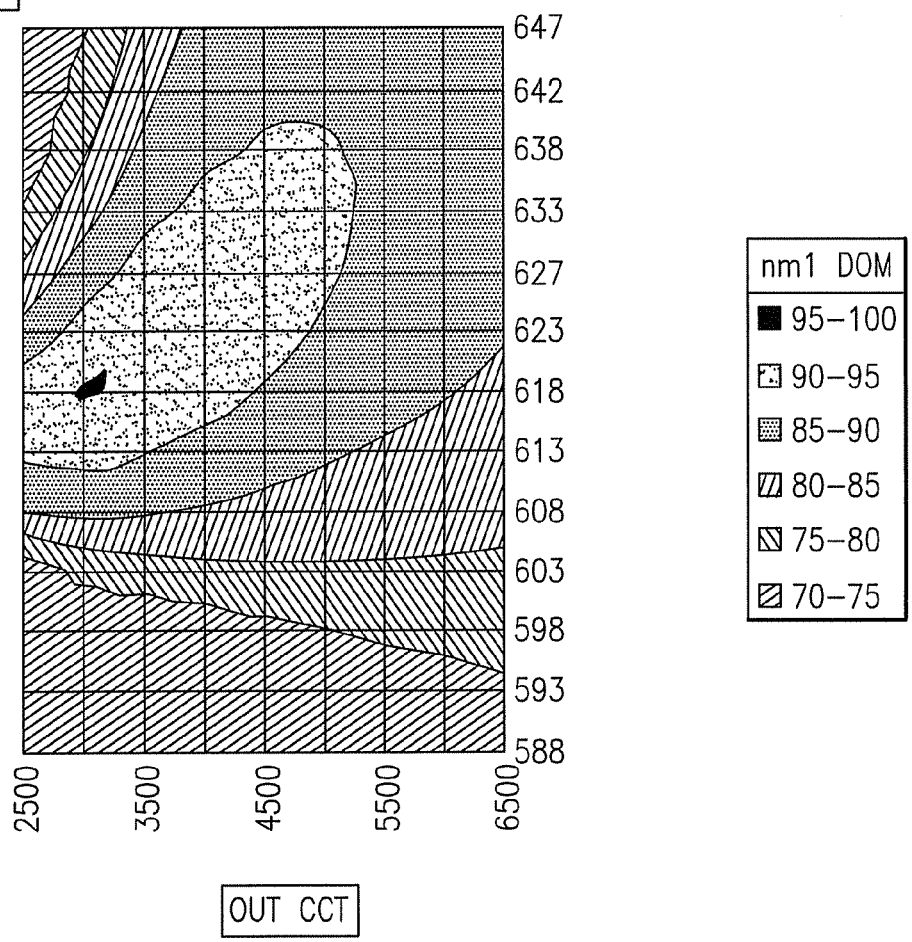
FIG. 17 is a plot that shows variation in CRI Ra in relation to the dominant wavelength of the red/orange portion and the color temperature of the lighting device.

FIG. 17 is a plot that shows variation in CRI Ra in relation to the dominant wavelength of the red/orange portion (y axis) and the color temperature of the lighting device (x axis).

Figure 18:
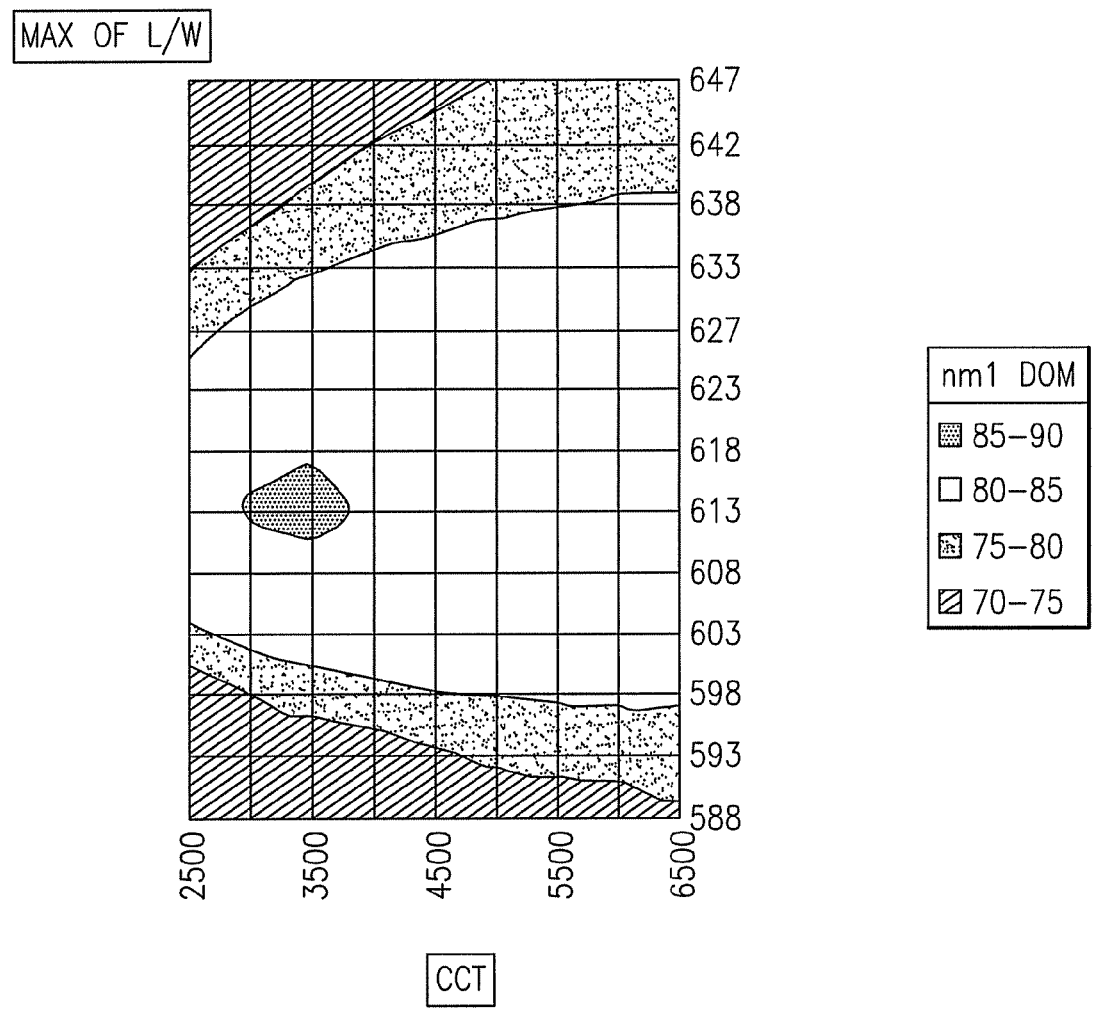
FIG. 18 is a plot that shows variation in efficacy (lumens per watt) in relation to the dominant wavelength of the red/orange portion and the color temperature of the lighting device.

FIG. 18 is a plot that shows variation in efficacy (lumens per watt) in relation to the dominant wavelength of the red/orange portion (y axis) and the color temperature of the lighting device (x axis).

Any two or more structural parts of the lighting devices described herein can be integrated. Any structural part of the lighting devices described herein can be provided in two or more parts which are held together, if necessary. Similarly, any two or more functions can be conducted simultaneously, and/or any function can be conducted in a series of steps.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

The invention claimed is:

1. A lighting device comprising:
a plurality of light sources and at least a first group of solid state light emitters, each of the light sources comprising at least one of a second group of solid state light emitters,
at least one of the first group of solid state light emitters and at least one of the second group of solid state light emitters on a first string,
at least one of the first group of solid state light emitters and at least one of the second group of solid state light emitters on a second string,
the first string electrically parallel to the second string,
each light source, when illuminated, emits light which, in an absence of any additional light, has x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38, each of the first group of light emitters, when illuminated, emitting light having a dominant emission wavelength in the range of from about 602 nm to about 615 nm, wherein:

a first ratio differs from a second ratio, said first ratio equal to (1) a number of solid state light emitters in said second group of solid state light emitters and in said first string, divided by (2) a number of solid state light emitters in said first group of solid state light emitters and in said first string;

said second ratio equal to (3) a number of solid state light emitters in said second group of solid state light emitters and in said second string, divided by (4) a number of solid state light emitters in said first group of solid state light emitters and in said second string.

2. A lighting device as recited in claim 1, wherein each of the first group of light emitters, when illuminated, emits light having a dominant emission wavelength in the range of from about 611 nm to about 615 nm.

3. A lighting device as recited in claim 1, wherein each of the first group of light emitters, when illuminated, emits light having a dominant emission wavelength in the range of from about 605 nm to about 615 nm.

4. A lighting device as recited in claim 1, wherein each of the first group of light emitters, when illuminated, emits light having a dominant emission wavelength in the range of from about 610 nm to about 615 nm.

5. A lighting device as recited in claim 1, wherein each of the first group of light emitters, when illuminated, emits light having a dominant emission wavelength in the range of from about 612 nm to about 615 nm.

6. A lighting device as recited in claim 1, wherein when each of the plurality of light sources is illuminated and the first group of solid state light emitters is illuminated,
a mixed illumination of (a) light exiting the lighting device which was emitted by the plurality of light sources and (b) light exiting the lighting device which was emitted by the first group of solid state light emitters has x, y coordinates on a 1931 CIE Chromaticity Diagram which define a point which is within 10 MacAdam ellipses of at least one point on the blackbody locus on a 1931 CIE Chromaticity Diagram.

7. A lighting device as recited in claim 6, wherein the mixed illumination has a CRI of at least 70 and the lighting device has a wall plug efficiency of at least 70 lumens per watt.

8. A lighting device as recited in claim 1, wherein:
each of the plurality of light sources comprises a second group of solid state light emitters and at least a first luminescent material, each of the second group of solid state light emitters, when illuminated, emits light having a peak emission wavelength in the range of from 400 nm to 480 nm; and the first luminescent material, when excited, emits light having a dominant emission wavelength in the range of from about 555 nm to about 585 nm.

9. A lighting device as recited in claim 8, wherein:
if each of the second group of solid state light emitters is illuminated, a combination of (1) light exiting the lighting device which was emitted by the second group of solid state light emitters, and (2) light exiting the lighting device which was emitted by the first luminescent material would, in an absence of any additional light, produce a mixed illumination which defines a point which is within the first area.

10. A lighting device as recited in claim 8, wherein each of the second group of solid state light emitters, when illuminated, emits light having a peak emission wavelength in the range of from 430 nm to 480 nm.

11. A lighting device as recited in claim 1, wherein:
at least a first of the plurality of light sources comprises a white light source and a filter,
the white light source emits white light source light that has x, y coordinates on a 1931 CIE Chromaticity Diagram which define a point which is within 10 MacAdam ellipses of at least one point on the blackbody locus on a 1931 CIE Chromaticity Diagram, and
the filter removes at least some light from the white light source light to form light which, in an absence of any additional light, has x, y color coordinates which define a point which is within the first area on a 1931 CIE Chromaticity Diagram enclosed by the first, second, third, fourth and fifth line segments.

12. A lighting device as recited in claim 1, wherein:
at least a first of the plurality of light sources comprises at least a second light emitter and a third light emitter,
the second light emitter, when illuminated, emits light of a second color,
the third light emitter, when illuminated, emits light of a third color, and
the third color is different from the second color.

13. A light fixture comprising a housing and at least one lighting device as recited in claim 1.

14. A lighting device as recited in claim 1, wherein each light source, when illuminated, emits light which, in an absence of any additional light, has x, y color coordinates which define a point which is within a sub-area on a 1931 CIE Chromaticity Diagram enclosed by first, second, third and fourth line segments, the first line segment connecting a first point to a second point, the second line segment connecting the second point to a third point, the third line segment connecting the third point to a fourth point, the fourth line segment connecting the fourth point to the first point, the first point having x, y coordinates of 0.32, 0.40, the second point having x, y coordinates of 0.36, 0.48, the third point having x, y coordinates of 0.41, 0.455, and the fourth point having x, y coordinates of 0.36, 0.38.

15. A lighting device as recited in claim 1, wherein the plurality of light sources when illuminated, emits light which, in an absence of any additional light, has x, y color coordinates which define a point which is within a sub-area on a 1931 CIE Chromaticity Diagram in which x is between 0.36 and 0.37, and y is between 0.42 and 0.43.

16. A lighting device as recited in claim 1, wherein the plurality of light sources when illuminated, emits light which, in an absence of any additional light, has x, y color coordinates which define a point which is within a sub-area on a 1931 CIE Chromaticity Diagram in which x is between 0.36 and 0.37, and y is between 0.43 and 0.44.

17. A lighting device as recited in claim 1, wherein the plurality of light sources when illuminated, emits light which, in an absence of any additional light, has x, y color coordinates which define a point which is within a sub-area on a 1931 CIE Chromaticity Diagram in which x is between 0.37 and 0.38, and y is between 0.42 and 0.43.

18. A lighting device as recited in claim 1, wherein the plurality of light sources when illuminated, emits light which, in an absence of any additional light, has x, y color coordinates which define a point which is within a sub-area on a 1931 CIE Chromaticity Diagram in which x is between 0.37 and 0.38, and y is between 0.43 and 0.44.

19. A lighting device as recited in claim 1, wherein the plurality of light sources when illuminated, emits light which, in an absence of any additional light, has x, y color coordinates which define a point which is within a sub-area on a 1931 CIE Chromaticity Diagram in which x is between 0.37 and 0.38, and y is between 0.44 and 0.45.

20. A lighting device as recited in claim 1, wherein the plurality of light sources when illuminated, emits light which, in an absence of any additional light, has x, y color coordinates which define a point which is within a sub-area on a 1931 CIE Chromaticity Diagram in which x is between 0.37 and 0.38, and y is between 0.45 and 0.46.

21. A lighting device as recited in claim 1, wherein the plurality of light sources when illuminated, emits light which, in an absence of any additional light, has x, y color coordinates which define a point which is within a sub-area on a 1931 CIE Chromaticity Diagram in which x is between 0.38 and 0.39, and y is between 0.43 and 0.44.

22. A lighting device as recited in claim 1, wherein the plurality of light sources when illuminated, emits light which, in an absence of any additional light, has x, y color coordinates which define a point which is within a sub-area on a 1931 CIE Chromaticity Diagram in which x is between 0.38 and 0.39, and y is between 0.44 and 0.45.

23. A lighting device as recited in claim 1, wherein the plurality of light sources when illuminated, emits light which, in an absence of any additional light, has x, y color coordinates which define a point which is within a sub-area on a 1931 CIE Chromaticity Diagram in which x is between 0.38 and 0.39, and y is between 0.45 and 0.46.

24. A lighting device as recited in claim 1, wherein:
the first string comprises a first number of solid state light emitters;
the second string comprises a second number of solid state light emitters;
a percentage of the first number of solid state light emitters in the first string that emit light having a dominant emission wavelength in the range of from about 602 nm to about 615 nm differs from a percentage of the second number of solid state light emitters in the second string that emit light having a dominant emission wavelength in the range of from about 602 nm to about 615 nm.

25. A lighting device comprising:
a plurality of light sources and at least a first group of solid state light emitters, each of the light sources comprising at least one of a second group of solid state light emitters,
at least one of the first group of solid state light emitters and at least one of the second group of solid state light emitters on a first string, at least one of the first group of solid state light emitters and at least one of the second group of solid state light emitters on a second string,
the first string electrically parallel to the second string,
each light source, when illuminated, emits light which, in an absence of any additional light, has x, y color coordinates which define a point which is within a second area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53,
each of the first group of light emitters, when illuminated, emits light having a dominant emission wavelength in the range of from about 600 nm to about 630 nm, wherein:
a first ratio differs from a second ratio,
said first ratio equal to (1) a number of solid state light emitters in said second group of solid state light emitters and in said first string, divided by (2) a number of solid state light emitters in said first group of solid state light emitters and in said first string;
said second ratio equal to (3) a number of solid state light emitters in said second group of solid state light emitters and in said second string, divided by (4) a number of solid state light emitters in said first group of solid state light emitters and in said second string.

26. A lighting device as recited in claim 25, wherein each of the first group of light emitters, when illuminated, emits light having a dominant emission wavelength in the range of from about 602 nm to about 615 nm.

27. A lighting device as recited in claim 25, wherein each of the first group of light emitters, when illuminated, emits light having a dominant emission wavelength in the range of from about 611 nm to about 615 nm.

28. A lighting device as recited in claim 25, wherein each of the first group of light emitters, when illuminated, emits light having a dominant emission wavelength in the range of from about 605 nm to about 615 nm.

29. A lighting device as recited in claim 25, wherein each of the first group of light emitters, when illuminated, emits light having a dominant emission wavelength in the range of from about 610 nm to about 615 nm.

30. A lighting device as recited in claim 25, wherein each of the first group of light emitters, when illuminated, emits light having a dominant emission wavelength in the range of from about 612 nm to about 615 nm.

31. A lighting device as recited in claim 25, wherein when the plurality of light sources is illuminated and the first group of solid state light emitters is illuminated,
a mixed illumination of (a) light exiting the lighting device which was emitted by the plurality of light sources and (b) light exiting the lighting device which was emitted by the first group of solid state light emitters has x, y coordinates on a 1931 CIE Chromaticity Diagram which define a point which is within 10 MacAdam ellipses of at least one point on the blackbody locus on a 1931 CIE Chromaticity Diagram.

32. A lighting device as recited in claim 31, wherein the mixed illumination has a CRI of at least 70 and the lighting device has a wall plug efficiency of at least 70 lumens per watt.

33. A lighting device as recited in claim 25, wherein:
each of the plurality of light sources comprises a second group of solid state light emitters and at least a first luminescent material,
each of the second group of solid state light emitters, when illuminated, emits light having a peak emission wavelength in the range of from 400 nm to 480 nm; and
the first luminescent material, when excited, emits light having a dominant emission wavelength in the range of from about 555 nm to about 585 nm.

34. A lighting device as recited in claim 33, wherein:
if each of the second group of solid state light emitters is illuminated, a combination of (1) light exiting the lighting device which was emitted by the second group of solid state light emitters, and (2) light exiting the lighting device which was emitted by the first luminescent material would, in an absence of any additional light, produce a mixed illumination which defines a point which is within the first area.

35. A lighting device as recited in claim 33, wherein each of the second group of solid state light emitters, when illuminated, emits light having a peak emission wavelength in the range of from 430 nm to 480 nm.

36. A lighting device as recited in claim 25, wherein:
at least a first of the plurality of light sources comprises a white light source and a filter,
the white light source emits white light source light that has x, y coordinates on a 1931 CIE Chromaticity Diagram which define a point which is within 10 MacAdam ellipses of at least one point on the blackbody locus on a 1931 CIE Chromaticity Diagram, and
the filter removes at least some light from the white light source light to form light which, in an absence of any additional light, has x, y color coordinates which define a point which is within the first area on a 1931 CIE Chromaticity Diagram enclosed by the first, second, third, fourth and fifth line segments.

37. A lighting device as recited in claim 25, wherein:
at least a first of the plurality of light sources comprises at least a second light emitter and a third light emitter,
the second light emitter, when illuminated, emits light of a second color,
the third light emitter, when illuminated, emits light of a third color, and
the third color is different from the second color.

38. A light fixture comprising a housing and at least one lighting device as recited in claim 25.

39. A lighting device as recited in claim 25, wherein each light source, when illuminated, emits light which, in an absence of any additional light, has x, y color coordinates which define a point which is within a sub-area on a 1931 CIE Chromaticity Diagram enclosed by first, second, third and fourth line segments, the first line segment connecting a first point to a second point, the second line segment connecting the second point to a third point, the third line segment connecting the third point to a fourth point, the fourth line segment connecting the fourth point to the first point, the first point having x, y coordinates of 0.32, 0.40, the second point having x, y coordinates of 0.36, 0.48, the third point having x, y coordinates of 0.41, 0.455, and the fourth point having x, y coordinates of 0.36, 0.38.

40. A lighting device as recited in claim 25, wherein:
the first string comprises a first number of solid state light emitters;
the second string comprises a second number of solid state light emitters;
a percentage of the first number of solid state light emitters in the first string that emit light having a dominant emission wavelength in the range of from about 600 nm to about 630 nm differs from a percentage of the second number of solid state light emitters in the second string that emit light having a dominant emission wavelength in the range of from about 600 nm to about 630 nm.

41. A lighting device comprising:
a plurality of light sources and at least a first group of solid state light emitters, each of the light sources comprising at least one of a second group of solid state light emitters,
at least one of the first group of solid state light emitters and at least one of the second group of solid state light emitters on a first string,
at least one of the first group of solid state light emitters and at least one of the second group of solid state light emitters on a second string,
the first string electrically parallel to the second string,
each light source, when illuminated, emits light which, in an absence of any additional light, has x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38;
each of the first group of light emitters, when illuminated, emitting light having a dominant emission wavelength in the range of from about 602 nm to about 615 nm; and
at least a first power line, each of the plurality of light sources and each of the first group of solid state light emitters electrically connected to the first power line,
the first and second strings electrically parallel to each other and in series relative to the first power line,
wherein:
  a first ratio differs from a second ratio,
  said first ratio equal to (1) a number of solid state light emitters in said second group of solid state light emitters and in said first string, divided by (2) a number of solid state light emitters in said first group of solid state light emitters and in said first string;
  said second ratio equal to (3) a number of solid state light emitters in said second group of solid state light emitters and in said second string, divided by (4) a number of solid state light emitters in said first group of solid state light emitters and in said second string, and
  if current is supplied to the first power line, a combination of (1) light exiting the lighting device which was emitted by the plurality of light sources and (2) light exiting the lighting device which was emitted by the first group of solid state light emitters would, in an absence of any additional light, produce a mixed illumination which defines a point which is within 10 MacAdam ellipses of at least one point on the blackbody locus on a 1931 CIE Chromaticity Diagram.

42. A lighting device as recited in claim 41, wherein:
the first string comprises a first number of solid state light emitters;
the second string comprises a second number of solid state light emitters;
a percentage of the first number of solid state light emitters in the first string that emit light having a dominant emission wavelength in the range of from about 602 nm to about 615 nm differs from a percentage of the second number of solid state light emitters in the second string that emit light having a dominant emission wavelength in the range of from about 602 nm to about 615 nm.

43. A lighting device comprising:
a plurality of light sources and at least a first group of solid state light emitters, each of the light sources comprising at least one of a second group of solid state light emitters,
at least one of the first group of solid state light emitters and at least one of the second group of solid state light emitters on a first string,
at least one of the first group of solid state light emitters and at least one of the second group of solid state light emitters on a second string,
the first string electrically parallel to the second string,
each light source, when illuminated, emits light which, in an absence of any additional light, has x, y color coordinates which define a point which is within a second area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53;
each of the first group of light emitters, when illuminated, emitting light having a dominant emission wavelength in the range of from about 600 nm to about 630 nm; and
at least a first power line, each of the plurality of light sources and each of the first group of solid state light emitters electrically connected to the first power line,
the first and second strings electrically parallel to each other and in series relative to the first power line,
wherein:
  a first ratio differs from a second ratio,
  said first ratio equal to (1) a number of solid state light emitters in said second group of solid state light emitters and in said first string, divided by (2) a number of solid state light emitters in said first group of solid state light emitters and in said first string;
  said second ratio equal to (3) a number of solid state light emitters in said second group of solid state light emitters and in said second string, divided by (4) a number of solid state light emitters in said first group of solid state light emitters and in said second string, and if current is supplied to the first power line, a combination of (1) light exiting the lighting device which was emitted by the plurality of light sources and (2) light exiting the lighting device which was emitted by the first group of solid state light emitters would, in an absence of any additional light, produce a mixed illumination which defines a point which is within 10 MacAdam ellipses of at least one point on the blackbody locus on a 1931 CIE Chromaticity Diagram.

44. A lighting device as recited in claim 43, wherein:
the first string comprises a first number of solid state light emitters;
the second string comprises a second number of solid state light emitters;
a percentage of the first number of solid state light emitters in the first string that emit light having a dominant emission wavelength in the range of from about 600 nm to about 630 nm differs from a percentage of the second number of solid state light emitters in the second string that emit light having a dominant emission wavelength in the range of from about 600 nm to about 630 nm.

45. A method comprising:
illuminating a plurality of light sources to emit light which, in an absence of any additional light, has x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38; and
illuminating a first group of solid state light emitters, the first group of solid state light emitters comprising at least one solid state light emitter, to emit light having a wavelength in the range of from about 602 nm to about 615 nm,
each said light source comprising at least one of a second group of solid state light emitters,
at least one of the first group of solid state light emitters and at least one of the second group of solid state light emitters on a first string,
at least one of the first group of solid state light emitters and at least one of the second group of solid state light emitters on a second string,
the first string electrically parallel to the second string,
a first ratio differing from a second ratio,
said first ratio equal to (1) a number of solid state light emitters in said second group of solid state light emitters and in said first string, divided by (2) a number of solid state light emitters in said first group of solid state light emitters and in said first string;
said second ratio equal to (3) a number of solid state light emitters in said second group of solid state light emitters and in said second string, divided by (4) a number of solid state light emitters in said first group of solid state light emitters and in said second string.

46. A method as recited in claim 45, wherein a mixed illumination of (a) light emitted by the plurality of light sources and (b) light emitted by the first group of solid state light emitters has x, y coordinates on a 1931 CIE Chromaticity Diagram which define a point which is within 10 MacAdam ellipses of at least one point on the blackbody locus on a 1931 CIE Chromaticity Diagram.

47. A method as recited in claim 46, wherein the mixed illumination has a correlated color temperature of not greater than 5000 K.

48. A method as recited in claim 46, wherein the mixed illumination has a CRI of at least 70 and the mixed illumination is emitted at a wall plug efficiency of at least 70 lumens per watt.

49. A method comprising:
illuminating a plurality of light sources to emit light which, in an absence of any additional light, has x, y color coordinates which define a point which is within a second area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53; and
illuminating a first group of solid state light emitters, the first group of solid state light emitters comprising at least one solid state light emitter, to emit light having a wavelength in the range of from about 600 nm to about 630 nm,
each said light source comprising at least one of a second group of solid state light emitters,
at least one of the first group of solid state light emitters and at least one of the second group of solid state light emitters on a first string,
at least one of the first group of solid state light emitters and at least one of the second group of solid state light emitters on a second string,
the first string electrically parallel to the second string,
a first ratio differing from a second ratio,
said first ratio equal to (1) a number of solid state light emitters in said second group of solid state light emitters and in said first string, divided by (2) a number of solid state light emitters in said first group of solid state light emitters and in said first sting;
said second ratio equal to (3) a number of solid state light emitters in said second group of solid state light emitters and in said second string, divided by (4) a number of solid state light emitters in said first group of solid state light emitters and in said second string.

50. A method as recited in claim 49, wherein a mixed illumination of (a) light emitted by the plurality of light sources and (b) light emitted by the first group of solid state light emitters has x, y coordinates on a 1931 CIE Chromaticity Diagram which define a point which is within 10 MacAdam ellipses of at least one point on the blackbody locus on a 1931 CIE Chromaticity Diagram.

51. A method as recited in claim 50, wherein the mixed illumination has a correlated color temperature of not greater than 5000 K.

52. A method as recited in claim 50, wherein the mixed illumination has a CRI of at least 70 and the mixed illumination is emitted at a wall plug efficiency of at least 70 lumens per watt.

* * * * *

UNITED STATES PATENT AND TRADEMARK OFFICE
CERTIFICATE OF CORRECTION

PATENT NO. : 9,441,793 B2
APPLICATION NO. : 12/475850
DATED : September 13, 2016
INVENTOR(S) : Antony Paul Van De Ven and Gerald H. Negley Page 1 of 2

It is certified that error appears in the above-identified patent and that said Letters Patent is hereby corrected as shown below:

On the Title Page

Item (56):

Other Publications, Page 4, Right Column:
Please change: "Krames et al., *Lumileds Lighting, Light from Silicon Valley,* Progress and Future Direction of LED Technology, SSL Workshop, Nov. 13, 2003, Publisher: Limileds Lighting Inc., pp. 1-21." to -- Krames et al., *Lumileds Lighting, Light from Silicon Valley,* Progress and Future Direction of LED Technology, SSL Workshop, Nov. 13, 2003, Publisher: Lumileds Lighting Inc., pp. 1-21. --

Other Publications, Page 4, Right Column:
Please change: "Narendran et al., "Solid State lighting: failure analysis of white LEDs," Journal of Cystal Growth, vol. 268, Issues 1-4, Aug. 2004, Abstract." to -- Narendran et al., "Solid State lighting: failure analysis of white LEDs," Journal of Crystal Growth, vol. 268, Issues 1-4, Aug. 2004, Abstract. --

Other Publications, Page 5, Left Column:
Please change: "Van De Ven et al., "Walla White Illumination with High CRI and High Efficacy by Combining 455 nm Excited Yellowish Phosphor LEDs and Red AlInGaP LEDs," First International Conference on White LEDs and Solid State Lighting, Nov. 30, 2007." to -- Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007. --

Signed and Sealed this
Twenty-fifth Day of April, 2017

Michelle K. Lee
*Director of the United States Patent and Trademark Office*

CERTIFICATE OF CORRECTION (continued)
U.S. Pat. No. 9,441,793 B2

Other Publications, Page 5, Left Column:
Please change: "Joung, Kyu Park et al: "Appliction of $Ba^{2+}$,$Mg^{2+}$ Co-doped $Sr_2SiO_4$; Eu Yellow Phosphor for white-Light-Emitting Diodes", Journal of the Electrochemical Society, vol. 152, No. 8, Jan. 1, 2005, p. H121, XP055126869, ISSN: 0013-4651, D01:10.1149/1.1939187, 3 pages." to
-- Joung, Kyu Park et al: "Application of $Ba^{2+}$.$Mg^{2+}$ Co-doped $Sr_2SiO_4$; Eu Yellow Phosphor for white-Light-Emitting Diodes", Journal of the Electrochemical Society, vol. 152, No. 8, Jan. 1, 2005, p. H121, XP055126869, ISSN: 0013-4651, D01:10.1149/1.1939187, 3 pages. --

In the Specification

Column 6, Line 5:
Please change: "above, and in which x is between 0.40 and 0.41, and v is" to -- above, and in which x is between 0.40 and 0.41, and y is --

Column 6, Line 23:
Please change: "above, and in which x is between 0.42 and 0.43, and v is" to -- above, and in which x is between 0.42 and 0.43, and y is --

Column 11, Line 18:
Please change: "v is between 0.44 and 0.45" to -- y is between 0.44 and 0.45 --

In the Claims

Column 64, Line 54:
Please change: "of solid state light emitters and in said first sting;" to -- of solid state light emitters and in said first string; --